United States Patent
Inoue et al.

(10) Patent No.: US 9,514,946 B2
(45) Date of Patent: Dec. 6, 2016

(54) SEMICONDUCTOR MEMORY INCORPORATING INSULATING LAYERS OF PROGRESSIVELY DECREASING BAND GAPS AND METHOD OF MANUFACTURING THE SAME

(71) Applicant: Renesas Electronics Corporation, Kawasaki-shi, Kanagawa (JP)

(72) Inventors: Masao Inoue, Kanagawa (JP); Yoshiki Maruyama, Kanagawa (JP); Tomoya Saito, Kanagawa (JP); Atsushi Yoshitomi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/712,903

(22) Filed: May 14, 2015

(65) Prior Publication Data
US 2015/0349143 A1    Dec. 3, 2015

(30) Foreign Application Priority Data
May 30, 2014    (JP) ................................ 2014-112887

(51) Int. Cl.
*H01L 21/02*    (2006.01)
*H01L 21/28*    (2006.01)
(Continued)

(52) U.S. Cl.
CPC ..... *H01L 21/28282* (2013.01); *H01L 21/0214* (2013.01); *H01L 21/0217* (2013.01);
(Continued)

(58) Field of Classification Search
CPC ............. H01L 21/0214; H01L 21/0217; H01L 21/02164; H01L 21/28282; H01L 29/513; H01L 29/518; H01L 29/4234; H01L 29/42364; H01L 29/66833; H01L 29/792
See application file for complete search history.

(56) References Cited

U.S. PATENT DOCUMENTS 6,858,906 B2    2/2005    Lee et al.
8,319,274 B2    11/2012    Hisamoto et al.
(Continued)

FOREIGN PATENT DOCUMENTS

JP    2003-068897 A    3/2003
JP    2008-078387 A    4/2008

OTHER PUBLICATIONS

Extended European Search Report issued Oct. 9, 2015, in European Patent Application No. EP15169419.7.

*Primary Examiner* — Nicholas Tobergte
(74) *Attorney, Agent, or Firm* — Shapiro, Gabor and Rosenberger, PLLC

(57) ABSTRACT

An improvement is achieved in the performance of a semiconductor device including a memory element. Over a semiconductor substrate, a gate electrode for the memory element is formed via an insulating film as a gate insulating film for the memory element. The insulating film includes first, second, third, fourth, and fifth insulating films in order of being apart from the substrate. The second insulating film has a charge storing function. The band gap of each of the first and third insulating films is larger than a band gap of the second insulating film. The band gap of the fourth insulating film is smaller than the band gap of the third insulating film. The band gap of the fifth insulating film is smaller than the band gap of the fourth insulating film.

22 Claims, 33 Drawing Sheets

(51) Int. Cl.
*H01L 29/51* (2006.01)
*H01L 29/423* (2006.01)
*H01L 29/66* (2006.01)
*H01L 29/792* (2006.01)

(52) U.S. Cl.
CPC .... *H01L 21/02164* (2013.01); *H01L 29/4234* (2013.01); *H01L 29/42364* (2013.01); *H01L 29/513* (2013.01); *H01L 29/518* (2013.01); *H01L 29/66833* (2013.01); *H01L 29/792* (2013.01)

(56) References Cited

U.S. PATENT DOCUMENTS

| | | | |
|---|---|---|---|
| 2006/0246740 A1* | 11/2006 | Cartier | H01L 21/28079 438/778 |
| 2006/0261401 A1* | 11/2006 | Bhattacharyya | B82Y 10/00 257/316 |
| 2006/0284236 A1* | 12/2006 | Bhattacharyya | B82Y 10/00 257/314 |
| 2007/0012988 A1* | 1/2007 | Bhattacharyya | G11C 16/0483 257/314 |
| 2007/0045718 A1* | 3/2007 | Bhattacharyya | B82Y 10/00 257/324 |
| 2007/0051998 A1 | 3/2007 | Kil et al. | |
| 2008/0150003 A1* | 6/2008 | Chen | H01L 29/42324 257/324 |
| 2008/0150004 A1* | 6/2008 | Chen | H01L 29/42332 257/324 |
| 2009/0101965 A1* | 4/2009 | Chen | B82Y 10/00 257/324 |
| 2009/0212351 A1* | 8/2009 | Chen | B82Y 10/00 257/324 |
| 2009/0273021 A1* | 11/2009 | Sekine | H01L 29/7887 257/326 |
| 2013/0277743 A1* | 10/2013 | Jagannathan | H01L 29/4958 257/347 |

\* cited by examiner

| OPERATIONS | APPLIED VOLTAGES | Vd | Vcg | Vmg | Vs | Vb |
|---|---|---|---|---|---|---|
| WRITE | | 0.5V | 1V | 10V | 5V | 0 |
| ERASE | | 0 | 0 | 12V | 0 | 0 |
| READ | | 1.5V | 1.5V | 0 | 0 | 0 |

SEMICONDUCTOR MEMORY INCORPORATING INSULATING LAYERS OF PROGRESSIVELY DECREASING BAND GAPS AND METHOD OF MANUFACTURING THE SAME

CROSS-REFERENCE TO RELATED APPLICATIONS

The disclosure of Japanese Patent Application No. 2014-112887 filed on May 30, 2014 including the specification, drawings and abstract is incorporated herein by reference in its entirety.

BACKGROUND

The present invention relates to a semiconductor device and a method of manufacturing the same and can be used appropriately for a semiconductor device having, e.g., a memory element and a method of manufacturing the same.

As an electrically writable/erasable nonvolatile semiconductor storage device, an EEPROM (Electrically Erasable and Programmable Read Only Memory) has been widely used. Such a storage device represented by a flash memory currently used widely has, under the gate electrode of a MISFET, a conductive floating gate electrode or a trapping insulating film surrounded by an oxide film. A charge stored state in the floating gate or trapping insulating film is used as stored information, which is read out as the threshold of the transistor. The trapping insulating film indicates an insulating film capable of storing therein charges. Examples of the trapping insulating film that can be mentioned include a silicon nitride film. By the injection/release of charges into/from such a charge storage region, the threshold of the MISFET (Metal Insulator Semiconductor Field Effect Transistor) is shifted to cause the MISFET to operate as a storage element. When a trapping insulating film such as a silicon nitride film is used as a charge storage region, advantages are offered such that, due to discrete storage of charges therein, the data retention reliability thereof is higher than in the case of using a conductive floating gate film as the charge storage region, that the higher data retention reliability allows reductions in the thicknesses of oxide films over and under the silicon nitride film, and that a voltage for a write/erase operation can be reduced.

Each of Japanese Unexamined Patent Publications Nos. 2008-78387 (Patent Document 1) and 2003-68897 (Patent Document 2) describes a technique concerning a semiconductor device having a nonvolatile memory.

RELATED ART DOCUMENTS

Patent Documents

[Patent Document 1]
Japanese Unexamined Patent Publication No. 2008-78387
[Patent Document 2]
Japanese Unexamined Patent Publication No. 2003-68897

SUMMARY

In a semiconductor device having a memory element also, it is desired to maximally improve the performance thereof.

Other problems and novel features of the present invention will become apparent from a statement in the present specification and the accompanying drawings.

According to an embodiment, a gate insulating film for a memory element includes a first insulating film, a second insulating film over the first insulating film, a third insulating film over the second insulating film, a fourth insulating film over the third insulating film, and a fifth insulating film over the fourth insulating film. The second insulating film has a charge storing function. A band gap of each of the first and third insulating films is larger than a band gap of the second insulating film. A band gap of the fourth insulating film is smaller than the band gap of the third insulating film. A band gap of the fifth insulating film is smaller than the band gap of the fourth insulating film.

According to the embodiment, a gate insulating film for a memory element includes a first insulating film, a second insulating film over the first insulating film, a third insulating film over the second insulating film, a fourth insulating film over the third insulating film, and a fifth insulating film over the fourth insulating film. The second insulating film has a charge storing function. The first insulating film is made of a silicon dioxide film or a silicon oxynitride film. The second insulating film is made of a silicon nitride film. Each of the third, fourth, and fifth insulating films is made of a film containing at least one of oxygen and nitrogen, and silicon as constituent elements. A nitrogen concentration of the fourth insulating film is higher than a nitrogen concentration of the third insulating film. A nitrogen concentration of the fifth insulating film is higher than the nitrogen concentration of the fourth insulating film.

According to the embodiment, a method of manufacturing a semiconductor device including a memory element includes the step of forming a laminated film for a gate insulating film of the memory element which includes a first insulating film, a second insulating film over the first insulating film, a third insulating film over the second insulating film, a fourth insulating film over the third insulating film, and a fifth insulating film over the fourth insulating film. The second insulating film has a charge storing function. The first insulating film is made of a silicon dioxide film or a silicon oxynitride film. The second insulating film is made of a silicon nitride film. Each of the third, fourth, and fifth insulating films is made of a film containing at least one of oxygen and nitrogen, and silicon as constituent elements. A nitrogen concentration of the fourth insulating film is higher than a nitrogen concentration of the third insulating film. A nitrogen concentration of the fifth insulating film is higher than the nitrogen concentration of the fourth insulating film.

According to the embodiment, the performance of the semiconductor device can be improved.

DETAILED DESCRIPTION

Figure 1:
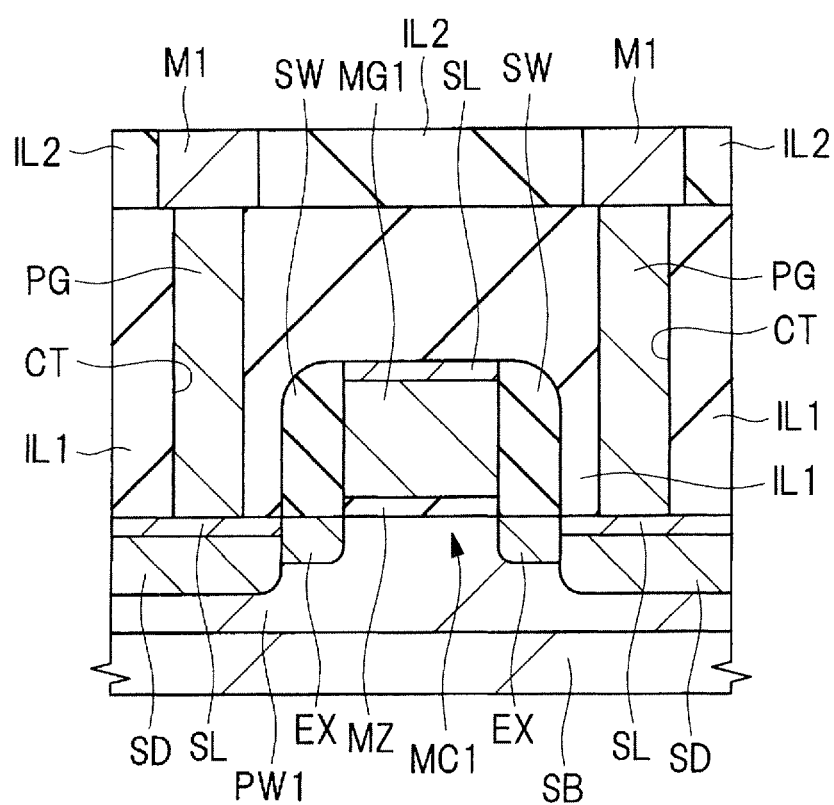
FIG. 1 is a main-portion cross-sectional view of a semiconductor device in an embodiment.

In the following embodiments, if necessary for the sake of convenience, each of the embodiments will be described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

The embodiments will be described below in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

Single-Gate Memory Element

Figure 2:
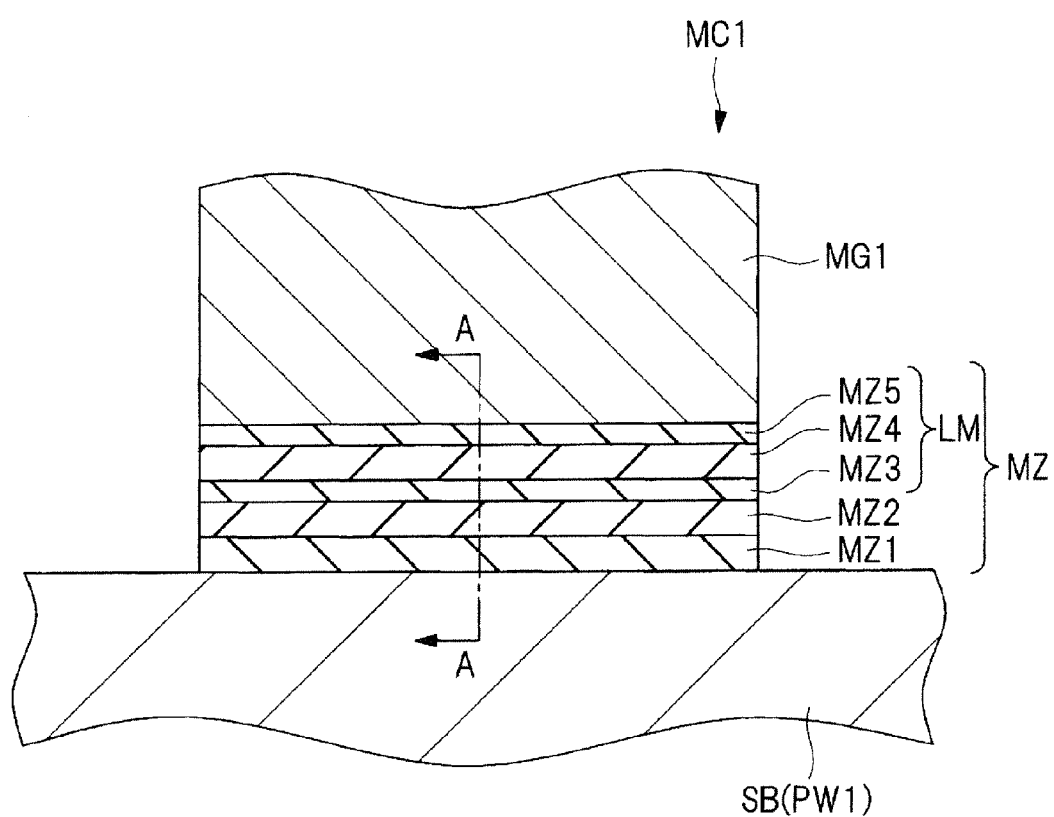
FIG. 2 is a partially enlarged cross-sectional view of the semiconductor device in FIG. 1.

Referring to the drawings, a semiconductor device in the present embodiment will be described. FIG. 1 is a main-portion cross-sectional view of the semiconductor device in the present embodiment. FIG. 2 is a partially enlarged cross-sectional view showing a part of the semiconductor device in FIG. 1 in enlarged relation.

The semiconductor device in the present embodiment includes a nonvolatile memory (nonvolatile storage element, flash memory, or nonvolatile semiconductor storage device). FIG. 1 shows a main-portion cross-sectional view of a memory element formation region as a region where a memory element MC1 included in the nonvolatile memory is formed. Note that the cross section shown in FIG. 1 is perpendicular to the extending direction (direction perpendicular to the surface of the paper sheet with FIG. 1) of a gate electrode MG1 included in the memory element MC1. In FIG. 2, a semiconductor substrate SB, the gate electrode MG1, and an insulating film MZ therebetween, which are shown in FIG. 1, are shown in enlarged relation.

The memory element (storage element or memory cell) MC1 shown in FIG. 1 is a single-gate memory element. The memory element MC1 uses a trapping insulating film (insulating film capable of storing charges therein) as a charge storage portion. The memory element MC1 is described as an n-channel transistor (i.e., n-channel MISFET), but may also be described as a p-channel transistor (i.e., p-channel MISFET) having an opposite conductivity type.

As shown in FIG. 1, in the semiconductor substrate (semiconductor wafer) SB made of p-type monocrystalline silicon having a specific resistance of, e.g., about 1 to 10 Ωcm or the like, an isolation region (not shown) for isolating elements is formed. In the active region isolated (defined) by the isolation region, a p-type well PW1 is formed. The p-type well PW1 is a p-type semiconductor region into which a p-type impurity has been introduced. The p-type well PW1 is formed mainly in the semiconductor substrate SB located in the memory element formation region. In the p-type well PW1 in the memory element formation region, the memory element MC1 shown in FIG. 1 is formed.

A configuration of the memory element MC1 formed in the memory element formation region will be described specifically.

As shown in FIG. 1, the memory element MC1 has the insulating film MZ formed over the semiconductor substrate SB (i.e., over the p-type well PW1), a gate electrode (memory gate electrode) MG1 formed over the insulating film MZ, sidewall spacers SW formed over the side walls of the gate electrode MG1, and source/drain n-type semiconductor regions (EX and SD) formed in the p-type well PW1 of the semiconductor substrate SB. That is, over the top surface of the p-type well PW1, the gate electrode MG1 is formed via the insulating film MZ functioning as a gate insulating film having the charge storage portion.

The insulating film MZ is interposed between the semiconductor substrate SB (p-type well PW1) and the gate electrode MG1 to function as the gate insulating film. The insulating film MZ has the internal charge storage portion. The insulating film MZ is a laminated insulating film in which a plurality of insulating films are laminated. Specifically, the insulating film MZ is formed of a laminated film including an insulating film MZ1, an insulating film MZ2 formed over the insulating film MZ1, an insulating film MZ3 formed over the insulating film MZ2, an insulating film MZ4 formed over the insulating film MZ3, and an insulating film MZ5 formed over the insulating film MZ4. Here, the insulating film MZ1 is made of a silicon dioxide film (oxide film) or a silicon oxynitride film (oxynitride film). The insulating film MZ2 is made of a silicon nitride film (nitride film). The insulating film MZ3 is made of a silicon dioxide film (oxide film). The insulating film MZ4 is made of a silicon oxynitride film (oxynitride film). The insulating film MZ5 is made of a silicon nitride film (nitride film).

Note that, for improved clarity of the drawings, FIG. 1 shows the insulating film MZ made of the laminated film including the insulating films MZ1, MZ2, MZ3, MZ4, and MZ5 as the single-layer insulating MZ. However, in an actual situation, as shown in the enlarged view of FIG. 2, the insulating film MZ is made of the laminated film including the insulating films MZ1, MZ2, MZ3, MZ4, and MZ5.

In the insulating film MZ, the insulating film MZ2 has a charge storing function. That is, in the insulating film MZ, the insulating film MZ2 is for storing charges and functions as a charge storage layer (charge storage portion). That is, the insulating film MZ2 is a trapping insulating film formed in the insulating film MZ. Here, the trapping insulating film indicates an insulating film capable of storing charges therein. Thus, as the insulating film (charge storage layer) having a trap level, the insulating film MZ2 is used. Therefore, the insulating film MZ can be regarded as an insulating film having the internal charge storage portion (which is the insulating film MZ2 herein).

In the insulating film MZ, the insulating films MZ3 and MZ1 located over and under the insulating film MZ2 serving as the trapping insulating film can function as charge block layers or charge confinement layers for confining charges to the trapping insulating film. By using a structure in which the insulating film MZ2 serving as the trapping insulating film is interposed between the insulating films MZ1 and MZ3 each serving as the charge block layer (or charge confinement layer), charges can be stored in the insulating film MZ2.

The insulating film MZ formed in the memory element formation region functions as the gate insulating film of the memory element MC1 and has a charge retaining (charge storing) function. Consequently, the insulating film MZ has a laminated structure including at least three layers so as to be able to function as the gate insulating film of the memory transistor having the charge retaining function. The potential barrier height of the inner layer (which is the insulating film MZ2 herein) functioning as the charge storage portion is lower than the potential barrier height of each of the outer layers (which are the insulating films MZ1 and MZ3 herein) each functioning as the charge block layer. This can be achieved by forming the insulating film MZ1 of a silicon dioxide film, forming the insulating film MZ2 of a silicon nitride film, and forming the insulating film MZ3 of a silicon dioxide film.

The insulating film MZ has a laminated structure in which the charge storage layer (which is the insulating film MZ2 herein) is interposed between a top insulating film and a bottom insulating film. Here, as the top insulating film, a laminated film LM including the insulating films MZ3, MZ4, and MZ5 is used and, as the bottom insulating film, the insulating film MZ1 is used.

In the insulating film MZ, the band gap of each of the insulating film MZ3 over the insulating film MZ2 and the insulating film MZ1 under the insulating film MZ2 needs to be larger than the band gap of the charge storage layer (which is the insulating film MZ2) between the insulating films MZ3 and MZ1. That is, the band gap of each of the insulating films MZ1 and MZ3 is larger than the band gap of the insulating film MZ2 serving as the trapping insulating film. This allows each of the insulating films MZ3 and MZ1 between which the insulating film MZ2 serving as the charge storage layer is interposed to function as the charge block layer (or charge confinement layer). Since a silicon dioxide film has a band gap larger than the band gap of a silicon nitride film, it is possible to use the silicon nitride film as the insulating film MZ2 and use the silicon dioxide film as each of the insulating films MZ1 and MZ3. As the insulating film MZ1, a silicon oxynitride film may also be used.

In the present embodiment, the insulating film MZ includes not only the insulating films MZ1, MZ2, and MZ3, but also the insulating film MZ4 over the insulating film MZ3, and the insulating film MZ5 over the insulating film MZ4. The insulating film MZ4 is interposed between the insulating films MZ3 and MZ5. The insulating film MZ5 is interposed between the insulating film MZ4 and the gate electrode MG1. The insulating film MZ4 has a band gap smaller than the band gap of the insulating film MZ3. That is, the band gap of the insulating film MZ4 is smaller than the band gap of the insulating film MZ3. The insulating film MZ5 has a band gap smaller than the band gap of the insulating film MZ4. That is, the band gap of the insulating film MZ5 is smaller than the band gap of the insulating film MZ4. As a result, when the respective band gaps of the insulating films MZ3, MZ4, and MZ5 are compared to each other, the band gap of the insulating film MZ3 is the largest and the band gap of the insulating film MZ5 is the smallest. The band gap of the insulating film MZ4 is smaller than the band gap of the insulating film MZ3 and larger than the band gap of the insulating film MZ5. The band gap of a silicon oxynitride film is smaller than the band gap of a silicon dioxide film and larger than the band gap of a silicon nitride film. Therefore, it is possible to use a silicon dioxide film as the insulating film, use a silicon oxynitride film as the insulating film MZ4, and use a silicon nitride film as the insulating film MZ5.

Note that, as the insulating film MZ3, a silicon dioxide film is preferred to a silicon oxynitride film, but the silicon oxynitride film can also be used. However, in the case of using a silicon oxynitride film as the insulating film MZ3, the nitrogen (N) concentration of the silicon oxynitride film forming the insulating film MZ3 is set lower than the nitrogen (N) concentration of the silicon oxynitride film forming the insulating film MZ4. As a result, even in the case of using a silicon oxynitride film as each of the insulating films MZ3 and MZ4, the band gap of the insulating film MZ3 can be set larger than the band gap of the insulating film MZ4 and larger than the band gap of the insulating film MZ2. This is because the band gap of a silicon oxynitride film decreases as the nitrogen concentration of the silicon oxynitride film increases.

As the insulating film MZ5, a silicon nitride film is preferred to a silicon oxynitride film, but the silicon oxynitride film can also be used. However, in the case of using a silicon oxynitride film as the insulating film MZ5, the nitrogen (N) concentration of the silicon oxynitride film forming the insulating film MZ5 is set higher than the nitrogen (N) concentration of the silicon oxynitride film forming the insulating film MZ4. As a result, even in the case of using a silicon oxynitride film as each of the insulating films MZ4 and MZ5, the band gap of the insulating film MZ5 can be set smaller than the band gap of the insulating film MZ4.

The gate electrode MG1 is made of a conductive film. Here, the gate electrode MG1 is formed of a silicon film, and the silicon film is preferably a polysilicon (polycrystalline silicon) film. The silicon film forming the gate electrode MG1 can be a doped polysilicon film into which an n-type impurity has been introduced. However, in another form, the silicon film forming the gate electrode MG1 can also be a doped polysilicon film into which a p-type impurity has been introduced or a non-doped polysilicon film into which no impurity has intentionally been introduced.

Over the side walls of the gate electrode MG1, the sidewall spacers SW (side-wall insulating films or sidewalls) SW are formed as side-wall insulating films. Each of the sidewall spacers SW is formed of an insulating film, e.g., a silicon dioxide film, a silicon nitride film, or a laminated film thereof.

In the p-type well PW1 in the memory element formation region, as source/drain regions (source or drain semiconductor regions) for the memory element MC1 each having an LDD (Lightly doped Drain) structure, $n^-$-type semiconductor regions (extension regions or LDD regions) EX and $n^+$-type semiconductor regions (source/drain regions) SD having impurity concentrations higher than those of the $n^-$-type semiconductor regions EX are formed. The $n^+$-type semiconductor regions SD have impurity concentrations higher than those of the $n^-$-type semiconductor regions EX and junctions depths deeper than those of the $n^-$-type semiconductor regions EX.

The $n^-$-type semiconductor regions EX are formed by self-alignment with the gate electrode MG1. The $n^+$-type semiconductor regions SD are formed by self-alignment with the sidewall spacers SW provided over the side walls of the gate electrode MG1. As a result, the lower-concentration $n^-$-type semiconductor regions EX are formed under the sidewall spacers SW over the side walls of the gate electrode MG1, while the higher-concentration $n^+$-type semiconductor regions SD are formed outside the lower-concentration $n^-$-type semiconductor regions EX. That is, the $n^-$-type semiconductor regions EX are located under the sidewall spacers SW formed over the side walls of the gate electrode MG1 to be interposed between a channel formation region and the $n^+$-type semiconductor regions SD.

The region of the semiconductor substrate SB (p-type well PW1) which is located under the gate electrode MG1 serves as a region to be formed with a channel, i.e., channel formation region. In the channel formation region under the insulating film MZ under the gate electrode MG1, a semiconductor region (p-type semiconductor region or n-type semiconductor region) for threshold voltage adjustment is formed as necessary.

In the regions of the semiconductor substrate SB (p-type well PW1) located in the memory element formation region which are spaced apart from each other with the channel formation region being interposed therebetween, the n⁻-type semiconductor regions EX are formed and, outside the n⁻-type semiconductor regions EX (on the side of the n⁻-type semiconductor regions EX away from the channel formation region), the n⁺-type semiconductor regions SD are formed. That is, the n⁻-type semiconductor regions EX are adjacent to the channel formation region, while the n⁺-type semiconductor regions SD are formed at positions away (away in a channel length direction) from the channel formation region by distances corresponding to the n⁻-type semiconductor regions EX to be in contact with the n⁻-type semiconductor regions EX.

Over the top surfaces (upper surfaces) of the n⁺-type semiconductor regions SD and the gate electrode MG1, metal silicide layers SL are more preferably formed using a salicide (Self Aligned Silicide) technique. The metal silicide layers SL can be cobalt silicide layers, nickel silicide layers, platinum-added nickel silicide layers, or the like. When the metal silicide layers SL are unneeded, the formation thereof may also be omitted.

Next, a description will be given of the structure of layers located above the memory element MC1.

Over the semiconductor substrate SUB, an insulating film IL1 is formed as an interlayer insulating film so as to cover the gate electrode MG1 and the sidewall spacers SW. The insulating film IL1 is made of a single-layer silicon dioxide film, a laminated film including a silicon nitride film, and a silicon dioxide film formed over the silicon nitride film to be thicker than the silicon nitride film, or the like. The upper surface of the insulating film IL1 is planarized.

In the insulating film IL1, contact holes (openings or through holes) CT are formed. In the contact holes CT, conductive plugs PG are embedded as conductor portions (coupling conductor portions).

Each of the plugs PG is formed of a thin barrier conductor film formed over the bottom portion and side wall (side surface) of the contact hole CT, and a main conductor film formed over the barrier conductor film so as to be embedded in the contact hole CT. However, for simpler illustration, the barrier conductor film and the main conductor film (tungsten film) each included in the plug PG are integrally shown in FIG. 1. Note that the barrier conductor film included in each of the plugs PG can be, e.g., a titanium film, a titanium nitride film, or a laminated film thereof. The main conductor film included in each of the plugs PG can be a tungsten film.

The contact holes CT and the plugs PG embedded therein are formed over the n⁺-type semiconductor regions SD, the gate electrode MG1, and the like. At the bottom portions of the contact holes CT, parts of the main surface of the semiconductor substrate SB, e.g., parts of the n⁺-type semiconductor regions SD (the metal silicide layers SL over the top surfaces thereof), a part of the gate electrode MG1 (the metal silicide layer SL over the top surface thereof), and the like are exposed. To the exposed portions, the plugs PG are coupled. Note that FIG. 1 shows a cross section in which parts of the n⁺-type semiconductor regions SD (the metal silicide layers SL over the top surfaces thereof) are exposed at the bottom portions of the contact holes CT and electrically coupled to the plugs PG embedded in the contact holes CT.

Over the insulating film IL1 in which the plugs PG are embedded, wires M1 are formed. The wires M1 are, e.g., damascene wires (embedded wires) and are embedded in wire trenches provided in an insulating film IL2 formed over the insulating film IL1. The wires M1 are electrically coupled to the n⁺-type semiconductor regions SD, the gate electrode MG1, and the like via the plugs PG. Note that, in FIG. 1, as an example of the wires M1, the wires M1 electrically coupled to the n⁺-type semiconductor regions SD via the plugs PG are shown. Wires and insulating films are also formed in layers located thereabove, but the illustration and description thereof is omitted herein. The wires M1 and the wires in the layers located thereabove are not limited to damascene wires (embedded wires) and can also be formed by patterning conductor films for wires. For example, the wires M1 and the wires in the layers located thereabove can also be tungsten wires, aluminum wires, or the like.

The memory element MC1 is a field effect transistor including a gate insulating film (which is the insulating film MZ herein) having an internal charge storage portion. The memory element MC1 can store information by storing or retaining charges in the insulating film MZ2 serving as a charge storage layer (charge storage portion) in the insulating film MZ.

For example, during a write operation to the memory element MC1, electrons are injected into the insulating film MZ2 in the insulating film MZ to bring the memory element MC1 into a written state. Here, by injecting electrons from the semiconductor substrate (p-type well PW1) into the insulating film MZ2 in the insulating film MZ, the memory element MC1 can be brought into the written state. During an erase operation to the memory element MC1, holes (positive holes) are injected into the insulating film MZ2 in the insulating film MZ to bring the memory element MC1 into an erased state. Here, by injecting holes (positive holes) from the gate electrode MG1 into the insulating film MZ2 in the insulating film MZ, the memory element MC1 can be brought into the erased state. The injection of charges (which are holes herein) from the gate electrode MG1 into the insulating film MZ2 in the insulating film MZ during the erase operation can be performed using FN (Fowler Nordheim) tunneling. During a read operation to the memory element MC1, it is possible to determine whether the memory element MC1 is in the written state or in the erased state using the threshold voltage of the memory element MC1 which have different values in the written state and in the erased state.

Next, a description will be given of a method of manufacturing the semiconductor device in the present embodiment.

Figure 3:
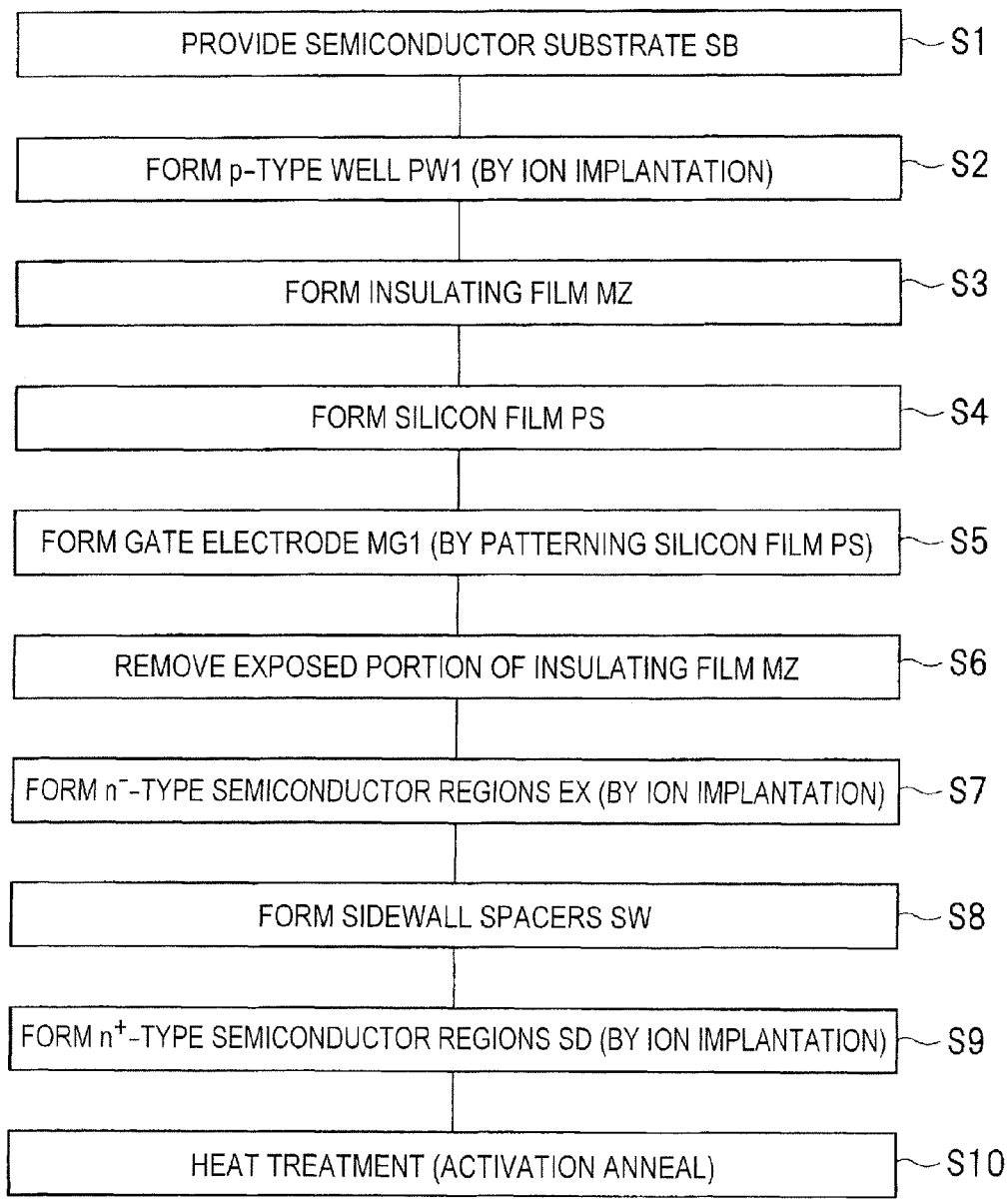
FIG. 3 is a process flow chart showing a part of the manufacturing process of the semiconductor device in the embodiment.

FIG. 3 is a process flow chart showing a part of the manufacturing process of the semiconductor device in the present embodiment. FIGS. 4 to 15 are main-portion cross-sectional views of the semiconductor device in the present embodiment during the manufacturing process thereof. Each of FIGS. 4 to 15 shows a cross-sectional view of the region corresponding to that in FIG. 1 described above.

Figure 4:
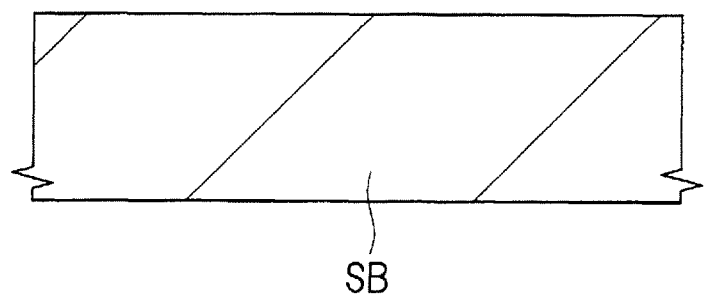
FIG. 4 is a main-portion cross-sectional view of the semiconductor device in the embodiment during the manufacturing process thereof.

To manufacture the semiconductor device, as shown in FIG. 4, a semiconductor substrate (semiconductor wafer) SB made of p-type monocrystalline silicon having a specific resistance of, e.g., about 1 to 10 Ωcm or the like is provided (prepared) (Step S1 in FIG. 3). Then, in the main surface of the semiconductor substrate SB, the isolation region (not shown) defining (demarcating) the active region is formed. The isolation region is formed of an insulating film made of silicon dioxide or the like and can be formed using, e.g., a STI (Shallow Trench Isolation) method or the like. For example, by forming an isolation trench in the main surface of the semiconductor substrate SB and then embedding an insulating film made of, e.g., silicon dioxide or the like in the isolation trench, the isolation region can be formed.

Figure 5:
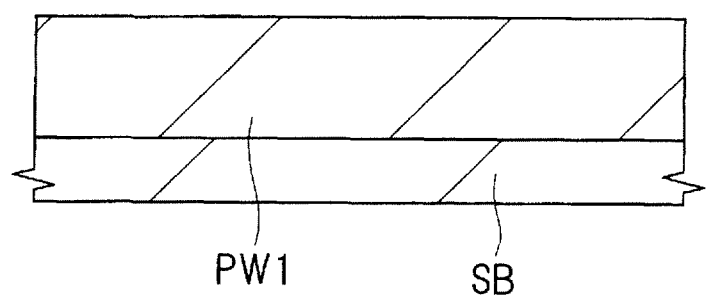
FIG. 5 is a main-portion cross-sectional view of the semiconductor device during the manufacturing process thereof, which is subsequent to FIG. 4.

Next, as shown in FIG. 5, the p-type well PW1 is formed in the semiconductor substrate SB located in the memory element formation region (Step S2 in FIG. 3).

The p-type well PW1 can be formed by the ion implantation of a p-type impurity such as, e.g., boron (B) into the semiconductor substrate SB or the like. The p-type well PW1 is formed over a predetermined depth from the main surface of the semiconductor substrate SB.

Next, by wet etching using, e.g., an aqueous hydrofluoric (HF) acid solution or the like, a natural oxide film over the top surface of the semiconductor substrate SB is removed to wash and clean the top surface of the semiconductor substrate SB. As a result, the top surface (silicon surface) of the semiconductor substrate SB (p-type well PW1) is exposed.

Figure 6:
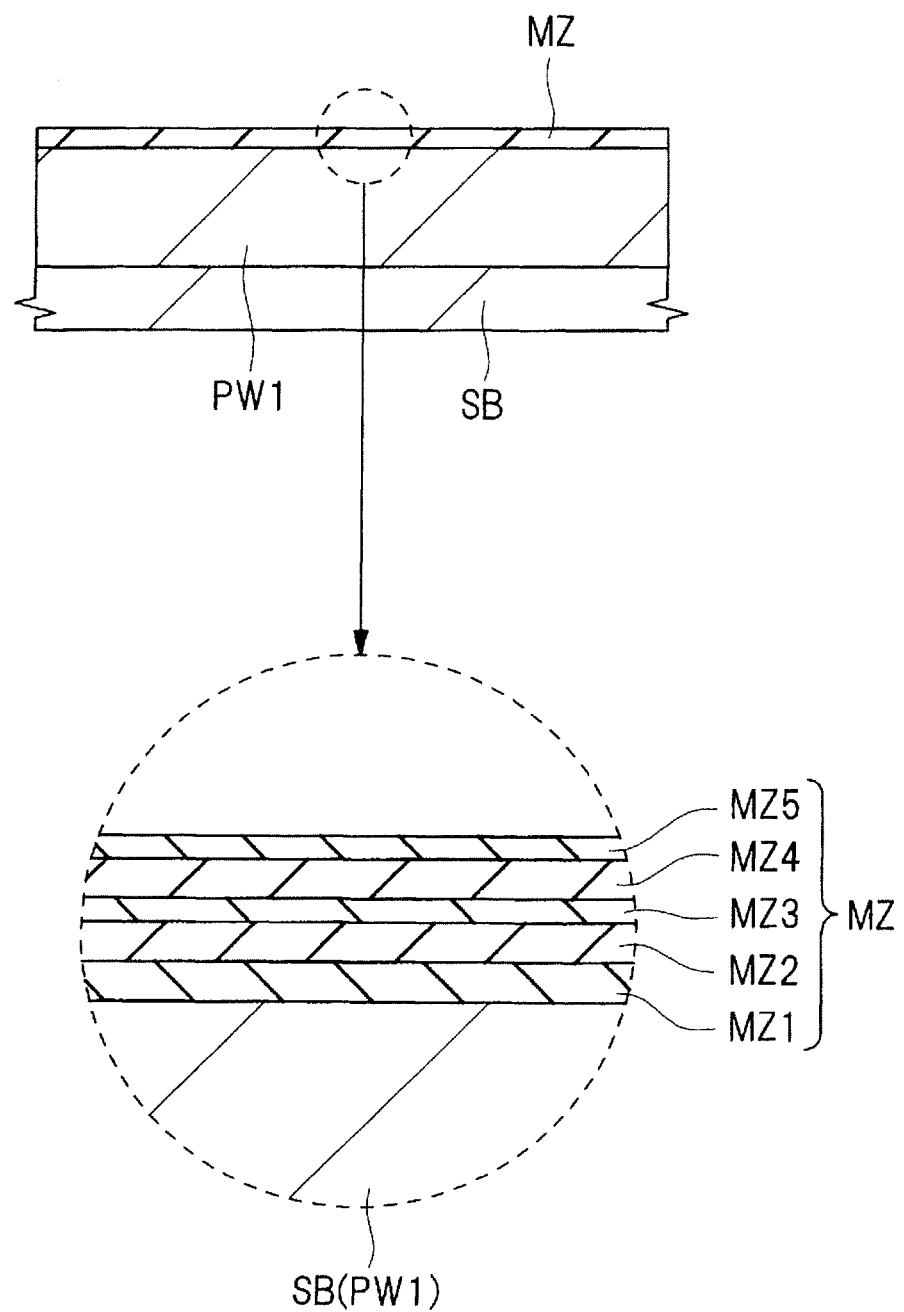
FIG. 6 is a main-portion cross-sectional view of the semiconductor device during the manufacturing process thereof, which is subsequent to FIG. 5.

Next, as shown in FIG. 6, over the top surface of the semiconductor substrate SB, i.e., over the top surface of the p-type well PW1, the insulating film MZ is formed (Step S3 in FIG. 3).

The insulating film MZ is for the gate insulating film of the memory element (MC1) and has the internal charge storage layer (charge storage portion). The insulating film MZ is formed of the laminated film (laminated insulating film) including the insulating film MZ1, the insulating film MZ2 formed over the insulating film MZ1, the insulating film MZ3 formed over the insulating film MZ2, the insulating film MZ4 formed over the insulating film MZ3, and the insulating film MZ5 formed over the insulating film MZ4.

Note that, for improved clarity of illustration, FIG. 6 shows the insulating film MZ including the insulating films MZ1, MZ2, MZ3, MZ4, and MZ5 as the single-layer insulating film MZ. However, in an actual situation, as shown in the enlarged view of the region enclosed in the dotted-line circle in FIG. 6, the insulating film MZ is made of the laminated film including the insulating films MZ1, MZ2, MZ3, MZ4, and MZ5.

Accordingly, the step of forming the insulating film MZ in Step S3 includes the step of forming the insulating film MZ1, the step of forming the insulating film MZ2, the step of forming the insulating film MZ3, the step of forming the insulating film MZ4, and the step of forming the insulating film MZ5. In Step S3, the step of forming the insulating film MZ1, the step of forming the insulating film MZ2, the step of forming the insulating film MZ3, the step of forming the insulating film MZ4, and the step of forming the insulating film MZ5 are successively performed in this order.

Here, each of the insulating films MZ1 and MZ3 can be formed of a silicon dioxide film (oxide film). Each of the insulating films MZ2 and MZ5 can be formed of a silicon nitride film (nitride film). The insulating film MZ4 can be formed of a silicon oxynitride film (oxynitride film).

A description will be given of a specific example of the step of forming the insulating film MZ in Step S3. The step of forming the insulating film MZ in Step S3 can be performed as follows.

That is, first, over the top surface of the semiconductor substrate SB, i.e., over the top surface of the p-type well PW1, the insulating film MZ1 is formed.

The insulating film MZ1 is made of a silicon dioxide film and can be formed by a thermal oxidation process. At this time, as the oxidation process (thermal oxidation process), ISSG (In Situ Steam Generation) oxidation is more preferably used. The thickness (formed film thickness) of the silicon dioxide film as the insulating film MZ1 can be set to, e.g., about 2 to 5 nm. In another form, it is also possible to form a silicon dioxide film (insulating film MZ1) by thermal oxidation and then perform a thermal nitridation process or a plasma nitridation process to thus nitride the silicon dioxide film (insulating film MZ1) and introduce nitrogen therein.

Then, over the insulating film MZ1, the insulating film MZ2 is formed. The insulating film MZ2 is made of a silicon nitride film and can be formed using an LPCVD (Low Pressure Chemical Vapor Deposition) method or the like. At this time, a film deposition temperature can be set to, e.g., about 600 to 800° C. The formed silicon nitride film (insulating film MZ2) has a large number of trap levels therein. The thickness (formed film thickness) of the silicon nitride film as the insulating film MZ2 can be set to, e.g., about 4 to 8 nm.

Then, over the insulating film MZ2, the insulating film MZ3 is formed. The insulating film MZ3 is made of a silicon dioxide film and can be formed using an LPCVD method or the like. At this time, a film deposition temperature can be set to, e.g., about 600 to 800° C. In another form, it is also possible to form a silicon nitride film (insulating film MZ2) using an LPCVD method or the like and then perform a thermal oxidation process to form a silicon dioxide film (insulating film MZ3) in the top surface of the silicon nitride film (insulating film MZ2). At this time, a thermal oxidation temperature can be set to, e.g., about 800 to 1000° C.

The thickness of the insulating film MZ3 is preferably set to a relatively small thickness, particularly preferably set to about 1 to 2 nm. When the insulating film MZ3 is excessively thin, a phenomenon in which the charges stored in the insulating film MZ2 move into the gate electrode MG1 is more likely to occur. This may degrade the charge retaining function of the insulating film MZ2. On the other hand, when the insulating film MZ3 is excessively thick, the injection of charges (which are holes herein) from the gate electrode MG1 into the insulating film MZ2 may be inhibited during an erase operation. This may undesirably reduce an erase speed. Accordingly, the thickness of the insulating film MZ3 is optimized, specifically to about 1 to 2 nm, to easily achieve each of an improvement in the charge retaining function of the insulating film MZ2 and an improvement in erase speed. The size (width) of the band gap of the insulating film MZ3 is larger than the size (width) of the band gap of the insulating film MZ2. Specifically, the band gap of the insulating film MZ3 made of a silicon dioxide film is 8 to 9 eV, which is larger than the band gap (about 5.5 eV) of a silicon nitride film (insulating film MZ2).

Then, over the insulating film MZ3, the insulating film MZ4 is formed. The insulating film MZ4 is made of a silicon oxynitride film and can be formed using an LPCVD method or the like. At this time, a film deposition temperature can be set to, e.g., about 600 to 800° C. As film deposition gases, e.g., dichlorosilane ($H_2SiCl_2$) can be used as a silicon source (silicon source gas), dinitrogen monoxide ($N_2O$) can be used as an oxygen source (oxygen source gas), and ammonia ($NH_3$) can be used as a nitrogen source (nitrogen source gas).

As will be described later in detail, the insulating film MZ4 is a film for increasing the total thickness of the insulating films MZ3, MZ4, and MZ5, while reducing the respective thicknesses of the insulating films MZ3 and MZ5. Accordingly, the thickness of the insulating film MZ4 has a range which is widely selectable depending on a target property or target performance. Preferably, the thickness of the insulating film MZ4 is larger than the thickness of each of the insulating films MZ3 and MZ5 and can be set to, e.g., about 4 to 6 nm. The nitrogen concentration of the silicon oxynitride film forming the insulating film MZ4 is higher than the nitrogen concentration of the insulating film MZ3 and lower than the nitrogen concentration of each of the insulating films MZ2 and MZ5 and can be set to, e.g., about 10 to 30 at %, which corresponds to a refractive index of about 1.5 to 1.7.

Then, over the insulating film MZ4, the insulating film MZ5 is formed. The insulating film MZ5 is made of a silicon nitride film and can be formed using an LPCVD method or the like. At this time, a film deposition temperature can be set to, e.g., about 600 to 800° C.

The thickness of the insulating film MZ5 is preferably set to a relatively small thickness, particularly preferably set to about 2 to 3 nm. When the insulating film MZ5 is excessively thin, an intended energy band structure is less likely to be formed. When the insulating film MZ5 is excessively thick, as will be described later, the reliability of the insulating film MZ may deteriorate. In the case of forming the insulating film MZ5 of a silicon nitride film, when the insulating film MZ5 is excessively thick, charges may be stored in the insulating film MZ5. Accordingly, it is desirable to optimize the thickness of the insulating film MZ5, specifically to about 2 to 3 nm.

By using, as the insulating film MZ5, the same film (which is a silicon nitride film herein) as the insulating film MZ2 serving as the charge storage layer, the size of the band gap of the insulating film MZ5 can be reduced. As a result, when the gate electrode MG1 is formed later, it is possible to reduce a valence-band energy barrier band formed between the gate electrode MG1 and the insulating film MZ5 to, e.g., about 1.8 eV.

Thus, Step S3 is performed to provide a state where, in the memory element formation region, over the semiconductor substrate SB (p-type well PW1), the insulating films MZ1, MZ2, MZ3, MZ4, and MZ5 are successively laminated in ascending order. That is, a state is provided in which, in the memory element formation region, over the semiconductor substrate SB (p-type well PW1), the insulating film MZ made of the laminated film including the insulating films MZ1, MZ2, MZ3, MZ4, and MZ5 is formed.

Figure 7:
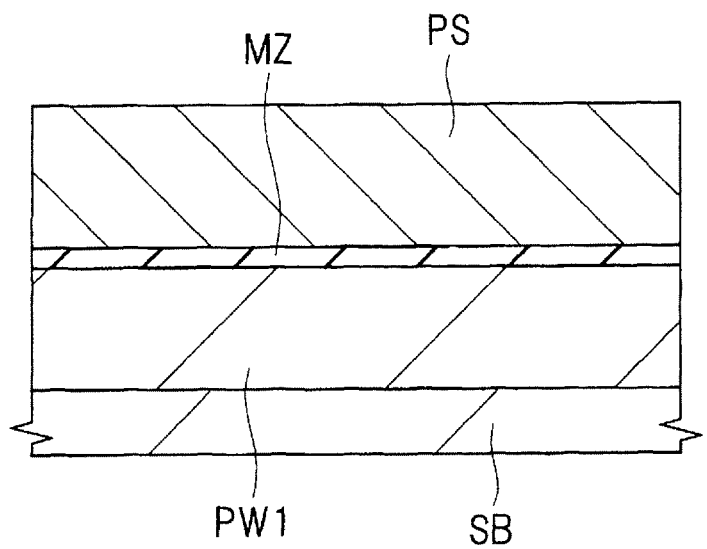
FIG. 7 is a main-portion cross-sectional view of the semiconductor device during the manufacturing process thereof, which is subsequent to FIG. 6.

Next, as shown in FIG. 7, over the main surface (entire main surface) of the semiconductor substrate SB, i.e., over the insulating film MZ, a silicon film PS is formed as a conductive film for forming the gate electrode MG1 (Step S4 in FIG. 3).

The silicon film PS is made of a polycrystalline silicon film and can be formed using an LPCVD method or the like. At this time, a film deposition temperature can be set to, e.g., about 600° C. As a film deposition gas (source gas), e.g., a silane (SiH$_4$) gas can be used. The thickness of the silicon film PS can preferably be set to 30 to 200 nm, e.g., about 100 nm. The silicon film PS can also be formed by depositing an amorphous film and then changing the deposited amorphous silicon film to a polycrystalline silicon film by subsequent heat treatment. The silicon film PS can be a doped polysilicon film into which an n-type impurity has been introduced. However, in another form, the silicon film PS can also be a doped polysilicon film into which a p-type impurity has been introduced or a non-doped polysilicon film into which no impurity has intentionally been introduced. In the case of introducing an n-type or p-type impurity into the silicon film PS, the n-type or p-type impurity can be introduced into the silicon film PS during or after the deposition thereof. In the case of introducing an n-type or p-type impurity into the silicon film PS during the deposition thereof, by causing a film deposition gas for the silicon film PS to include a doping gas (gas for adding an n-type or p-type impurity), the silicon film PS into which the n-type or p-type impurity has been introduced can be deposited. In the case of introducing an n-type or p-type impurity into the silicon film PS after the deposition thereof, after the silicon film PS is deposited, the n-type or p-type impurity is introduced into the silicon film PS by ion implantation. At this time, it is possible to perform ion implantation on the entire silicon film PS or form a photoresist layer as an ion implantation inhibition mask over the silicon film PS and then perform ion implantation on the silicon film PS located in the memory element formation region.

Figure 8:
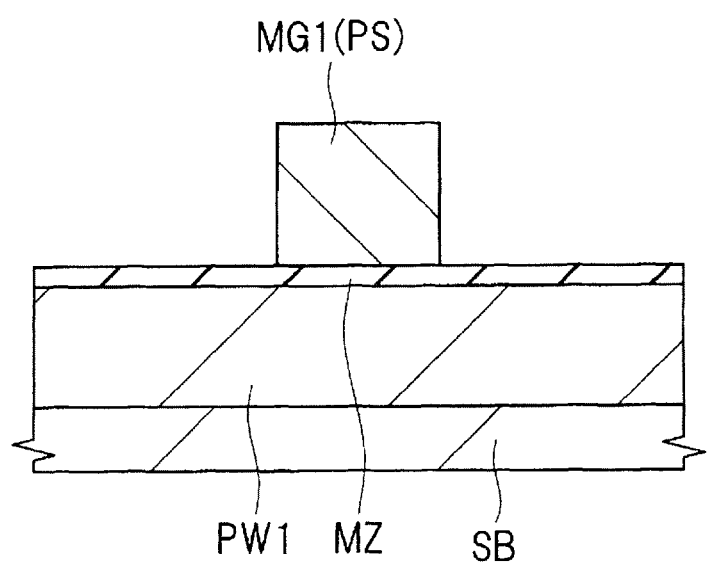
FIG. 8 is a main-portion cross-sectional view of the semiconductor device during the manufacturing process thereof, which is subsequent to FIG. 7.

Then, as shown in FIG. 8, the silicon film PS is patterned using a photolithographic technique or an etching technique to form the gate electrode MG1 (Step S5 in FIG. 3). For example, the patterning step in Step S5 can be performed as follows.

That is, first, a photoresist pattern (not shown) is formed over the silicon film PS using a photolithographic method. The photoresist pattern is formed in the area of the memory element formation region where the gate electrode MG1 is to be formed. Then, using the photoresist pattern as an etching mask, the silicon film PS is etched (preferably dry-etched) to be patterned. Thereafter, the photoresist pattern is removed, resulting in the state shown in FIG. 8.

Thus, in Step S5, the silicon film PS is patterned and, as shown in FIG. 8, the gate electrode MG1 made of the patterned silicon film PS is formed. That is, in the memory element formation region, the silicon film PS is etched to be removed except for the portion thereof serving as the gate electrode MG1, thus forming the gate electrode MG1. The gate electrode MG1 is formed over the insulating film MZ. That is, the gate electrode MG1 made of the patterned silicon film PS is formed over the top surface of the p-type well PW1 via the insulating film MZ.

Figure 9:
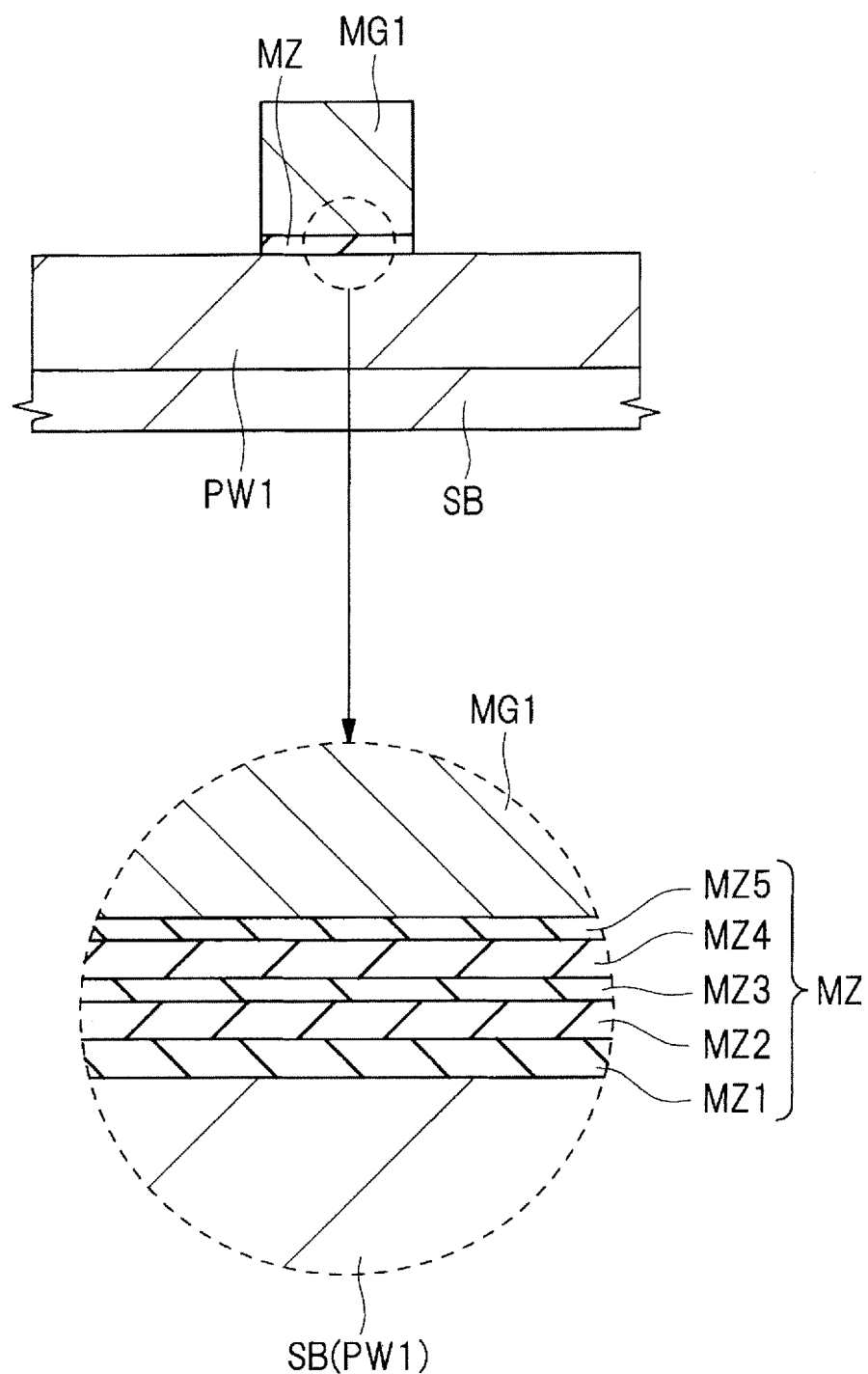
FIG. 9 is a main-portion cross-sectional view of the semiconductor device during the manufacturing process thereof, which is subsequent to FIG. 8.

Next, as shown in FIG. 9, of the insulating film MZ, the exposed portion uncovered with the gate electrode MG1 is removed by etching (Step 6 in FIG. 3). In Step S6, wet etching can preferably be used. As an etchant, e.g., a hydrofluoric acid solution or the like can be used.

In Step S6, the insulating film MZ located under the gate electrode MG1 remains without being removed to serve as the gate insulating film of the memory element MC1. That is, the insulating film MZ remaining under the gate electrode MG1 serves as the gate insulating film (gate insulating film having the charge storage portion) of the memory element MC1. That is, in Step S6, the insulating film MZ remaining under the gate electrode MG1 to be interposed between the gate electrode MG1 and the semiconductor substrate SB (p-type well PW1) serves as the gate insulating film (gate insulating film having the charge storage portion) of the memory element MC1.

There may also be a case where the portion of the insulating film MZ uncovered with the gate electrode MG1 is partially etched by dry etching in patterning the silicon film PS in Step S5. That is, there may also be a case where the portion of the insulating film MZ uncovered with the gate electrode MG1 is removed by dry etching in patterning the silicon film PS in Step S5 and by etching (preferably wet etching) in Step S6.

Note that, for improved clarity of illustration, FIG. 9 also shows the insulating film MZ including the insulating films MZ1, MZ2, MZ3, MZ4, and MZ5 as the single-layer insulating MZ. However, in an actual situation, as shown in the enlarged view of the region enclosed in the dotted-line circle in FIG. 9, the insulating film MZ is made of the laminated film including the insulating films MZ1, MZ2, MZ3, MZ4, and MZ5.

Figure 10:
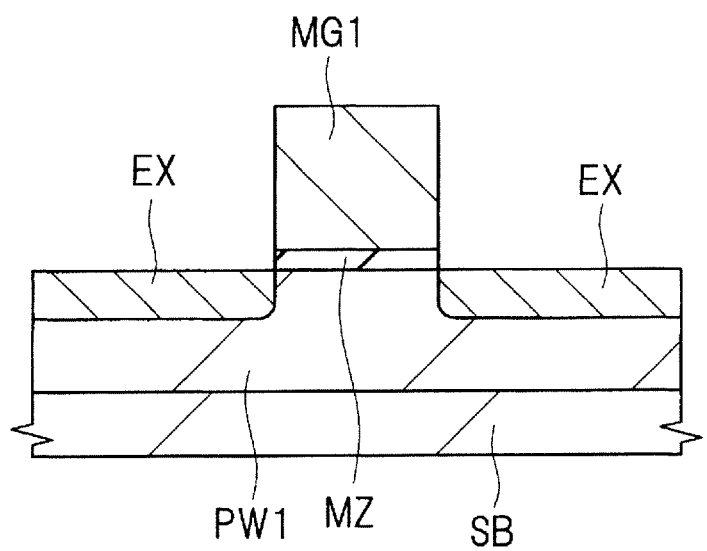
FIG. 10 is a main-portion cross-sectional view of the semiconductor device during the manufacturing process thereof, which is subsequent to FIG. 9.

Next, as shown in FIG. 10, by an ion implantation method or the like, the n$^-$-type semiconductor regions EX are formed in the semiconductor substrate SB (p-type well PW1) in the memory element formation region (Step S7 in FIG. 3).

That is, in Step S7, into the areas of the p-type well PW1 in the memory element formation region which are located on both sides of the gate electrode MG1, an n-type impurity such as phosphorus (P) or arsenic (As) is ion-implanted to form the n$^-$-type semiconductor regions EX. In the ion implantation for forming the n$^-$-type semiconductor regions EX, the gate electrode MG1 can function as a mask (ion implantation inhibition mask). Accordingly, the n$^-$-type semiconductor regions EX are formed by self-alignment with the side walls of the gate electrode MG1. Consequently, in the semiconductor substrate SB (p-type well PW1) in the memory element formation region, the n$^-$-type semiconductor regions EX are formed on both sides (on both sides in a gate length direction) of the gate electrode MG1.

Figure 11:
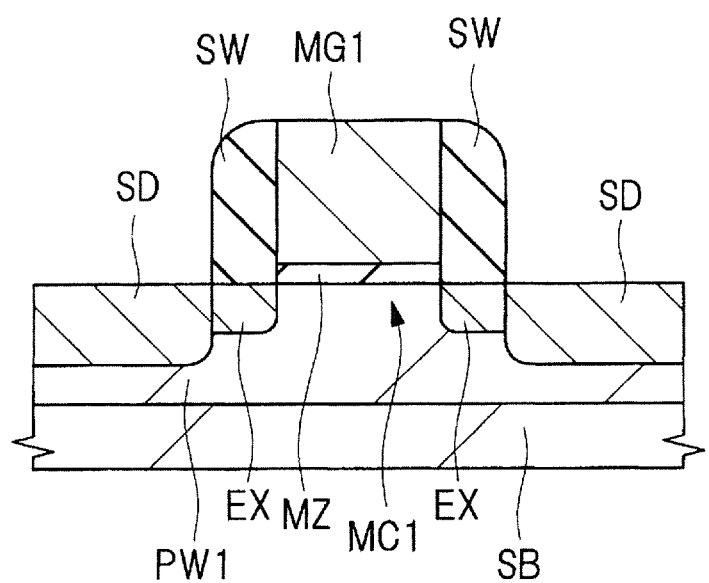
FIG. 11 is a main-portion cross-sectional view of the semiconductor device during the manufacturing process thereof, which is subsequent to FIG. 10.

Next, as shown in FIG. 11, over the side walls of the gate electrode MG1, as side-wall insulating films, the sidewall spacers SW each made of an insulating film are formed (Step S8 in FIG. 3).

For example, the step of forming the sidewall spacers SW in Step S8 can be performed as follows. That is, over the entire main surface of the semiconductor substrate SB, the insulating film for forming the sidewall spacers SW is formed so as to cover the gate electrode MG1. The insulating film for forming the sidewall spacers SW is made of, e.g., a silicon dioxide film, a silicon nitride film, or a laminated film thereof and can be formed using a CVD method or the like. Then, the insulating film for forming the sidewall spacers SW is etched back (by etching, dry etching, or anisotropic etching) using an anisotropic etching technique. Thus, as shown in FIG. 11, the insulating film for forming the sidewall spacers SW is selectively left over the side walls of the gate electrode MG1 to form the sidewall spacers SW.

Next, by an ion implantation method or the like, the n$^+$-type semiconductor regions SD are formed in the semiconductor substrate SB (p-type well PW1) in the memory element formation region (Step S9 in FIG. 3).

That is, in Step S9, into the areas of the p-type well PW1 in the memory element formation region which are located on both sides of the gate electrode MG1 and the sidewall spacers SW, an n-type impurity such as phosphorus (P) or arsenic (As) is ion-implanted to form the n$^+$-type semiconductor regions SD. In the ion implantation for forming the n$^+$-type semiconductor regions SD, the gate electrode MG1 and the sidewall spacers SW over the side walls thereof can function as a mask (ion implantation inhibition mask). Accordingly, the n$^+$-type semiconductor regions SD are formed by self-alignment with the side surfaces of the sidewall spacers SW over the side walls of the gate electrode MG1. Consequently, in the semiconductor substrate SB (p-type well PW1) located in the memory element formation region, on both sides (both sides in the gate length direction) of a structure including the gate electrode MG1 and the sidewall spacers SW over the side walls thereof, the n$^+$-type semiconductor regions SD are formed. The n$^+$-type semiconductor regions SD have impurity concentrations higher than those of the n$^-$-type semiconductor regions EX and junction depths deeper than those of the n$^-$-type semiconductor regions EX.

Thus, the n$^-$-type semiconductor regions EX and the n$^+$-type semiconductor regions SD having the impurity concentrations higher than those of the n$^-$-type semiconductor regions EX form, in the semiconductor substrate SB of the memory element formation region p-type well PW1), n-type semiconductor regions each functioning as a semiconductor region (source/drain region) for the source or drain of the memory element MC1.

Into the silicon film forming the gate electrode MG1, an n-type impurity may be introduced in the ion implantation step for forming the n$^-$-type semiconductor regions EX or in the ion implantation step for forming the n$^+$-type semiconductor regions SD.

Next, activation anneal as heat treatment for activating the impurities introduced in the source/drain semiconductor regions (the n$^-$-type semiconductor regions EX and the n$^+$-type semiconductor regions SD) or the like is performed (Step S10 in FIG. 3). The heat treatment in Step S10 can be performed at a heat treatment temperature of, e.g., 900° C. to 1100° C. in an inert gas atmosphere, more preferably in a nitrogen atmosphere.

In this manner, the memory element MC1 is formed. The gate electrode MG1 functions as the gate electrode of the memory element MC1. The insulating film MZ under the gate electrode MG1 functions as the gate insulating film of the memory element MC1. In addition, the n-type semiconductor regions (impurity diffusion layers) each functioning as the source or drain of the memory element MC1 are formed of the n$^+$-type semiconductor regions SD and the n$^-$-type semiconductor regions EX.

Next, by a salicide (Self Aligned Silicide) process, the metal silicide layers SL are formed. The metal silicide layers SL can be formed as follows.

Figure 12:
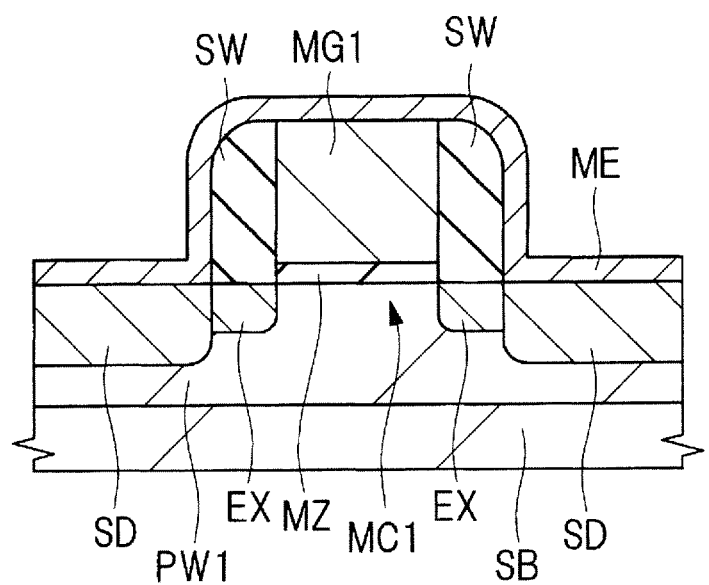
FIG. 12 is a main-portion cross-sectional view of the semiconductor device during the manufacturing process thereof, which is subsequent to FIG. 11.

First, etching (e.g., wet etching using a diluted hydrofluoric acid or the like) is performed as necessary. Thus, the upper surfaces (top surfaces) of the n$^+$-type semiconductor regions SD and the upper surface of the gate electrode MG1 are cleaned (exposed). The etching performed at this time can be such light etching as to remove a natural oxide film. Then, as shown in FIG. 12, over the entire main surface of the semiconductor substrate SB including the respective upper surfaces (top surfaces) of the n$^+$-type semiconductor regions SD and the gate electrode MG1, a metal film ME is formed (deposited) so as to cover the gate electrode MG1 and the sidewall spacers SW. The metal film ME can be, e.g., a single-element metal film (pure metal film) or an alloy film and is made of, e.g., a cobalt (Co) film, a nickel (Ni) film, a nickel-platinum alloy film, or the like. The metal film ME can be formed using a sputtering method or the like.

Figure 13:
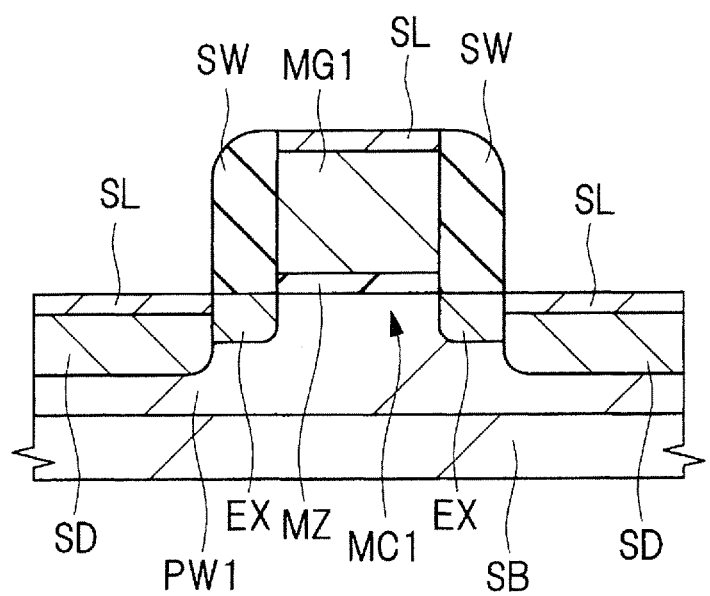
FIG. 13 is a main-portion cross-sectional view of the semiconductor device during the manufacturing process thereof, which is subsequent to FIG. 12.

Then, heat treatment is performed on the semiconductor substrate SB to cause the respective upper-layer portions (surface-layer portions) of the n$^+$-type semiconductor regions SD and the gate electrode MG1 to react with the metal film ME. Thus, as shown in FIG. 13, in the respective upper portions (upper surfaces, top surfaces, or upper-layer portions) of the n$^+$-type semiconductor regions SD and the gate electrode MG1, the metal silicide layers SL as silicon-metal reaction layers are formed. The metal silicide layers SL can be, e.g., cobalt silicide layers (when the metal film ME is a cobalt film), nickel silicide layers (when the metal film ME is a nickel film), or platinum-added nickel silicide layers (when the metal film ME is a nickel-platinum alloy film). Here, a platinum-added nickel silicide corresponds to a nickel silicide containing platinum, i.e., a nickel-platinum silicide. Thereafter, the unreacted metal film ME is removed. FIG. 13 shows a cross-sectional view at this stage. After the unreacted metal film ME is removed, heat treatment can also be further performed.

By thus performing a so-called salicide process, the metal silicide layers SL can be formed. By forming the metal silicide layers SL in the respective upper portions of the n'-type semiconductor regions SD and the gate electrode MG1, the resistances of the source/drain and the gate electrodes (such as diffusion resistances and contact resistances) can be reduced. When the metal silicide layers SL are unneeded, the formation thereof can also be omitted.

Figure 14:
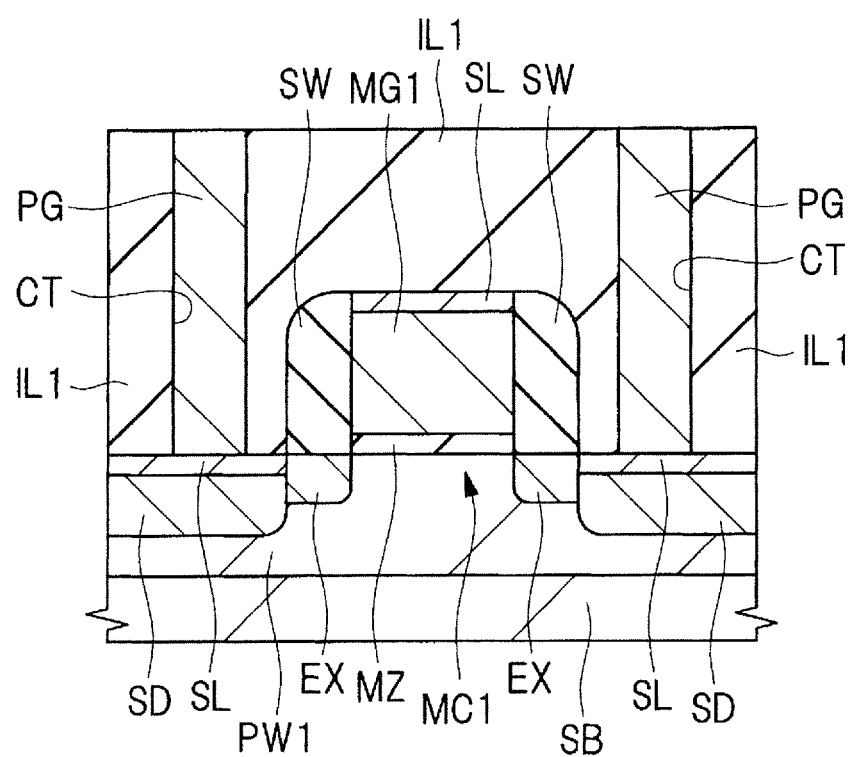
FIG. 14 is a main-portion cross-sectional view of the semiconductor device during the manufacturing process thereof, which is subsequent to FIG. 13.

Next, as shown in FIG. 14, over the entire main surface of the semiconductor substrate SB, the insulating film (interlayer insulating film) IL1 is formed (deposited) as an interlayer insulating film so as to cover the gate electrode MG1 and the sidewall spacers SW.

The insulating film IL1 is made of a single-layer silicon dioxide film, a laminated film including a silicon nitride film and a silicon dioxide film formed over the silicon nitride film to be thicker than the silicon nitride film, or the like. The insulating film IL1 can be formed using, e.g., a CVD method or the like. After the formation of the insulating film IL1, the upper surface of the insulating film IL1 is planarized as necessary using a CMP (Chemical Mechanical Polishing) method or the like.

Next, using a photoresist pattern (not shown) formed over the insulating film IL1 using a photolithographic method as an etching mask, the insulating film IL1 is dry-etched to be formed with the contact holes (openings or through holes) CT. The contact holes CT are formed so as to extend through the insulating film IL1.

Next, in the contact holes CT, as coupling conductor portions, the conductive plugs PG each made of tungsten (W) or the like are formed.

To form the plugs PG, e.g., over the insulating film IL1 including the inside (bottom portion and side walls) of each of the contact holes CT, the barrier conductor film is formed. The barrier conductor film is made of, e.g., a titanium film, a titanium nitride film, or a laminated film thereof. Then, over the barrier conductor film, the main conductor film made of a tungsten film or the like is formed so as to be embedded in each of the contact holes CT. Then, the unneeded main conductor film and the unneeded barrier conductor film over the insulating film IL1 are removed by a CMP method, an etch-back method, or the like to allow the plugs PG to be formed. Note that, for simpler illustration, the barrier conductor film and the main conductor film (tungsten film) which are included in each of the plugs PG are integrally shown in FIG. 14.

The contact holes CT and the plugs PG embedded therein are formed over the $n^+$-type semiconductor regions SD, the gate electrode MG1, and the like. At the bottom portion of each of the contact holes CT, a part of the main surface of the semiconductor substrate SB is exposed. For example, parts of the $n^+$-type semiconductor regions SD (the metal silicide layers SL over the top surfaces thereof), a part of the gate electrode MG1 (the metal silicide layer SL over the top surface thereof), and the like are exposed. Note that FIG. 14 shows a cross section in which parts of the $n^+$-type semiconductor regions SD (the metal silicide layers SL over the top surfaces thereof) are exposed at the bottom portions of the contact holes CT and electrically coupled to the plugs PG embedded in the contact holes CT.

Next, over the insulating film IL1 in which the plugs PG are embedded, the wires (wiring layer) M1 as first-layer wires are formed. A description will be given of the case where the wires M1 are formed using a damascene technique (which is a single damascene technique herein).

Figure 15:
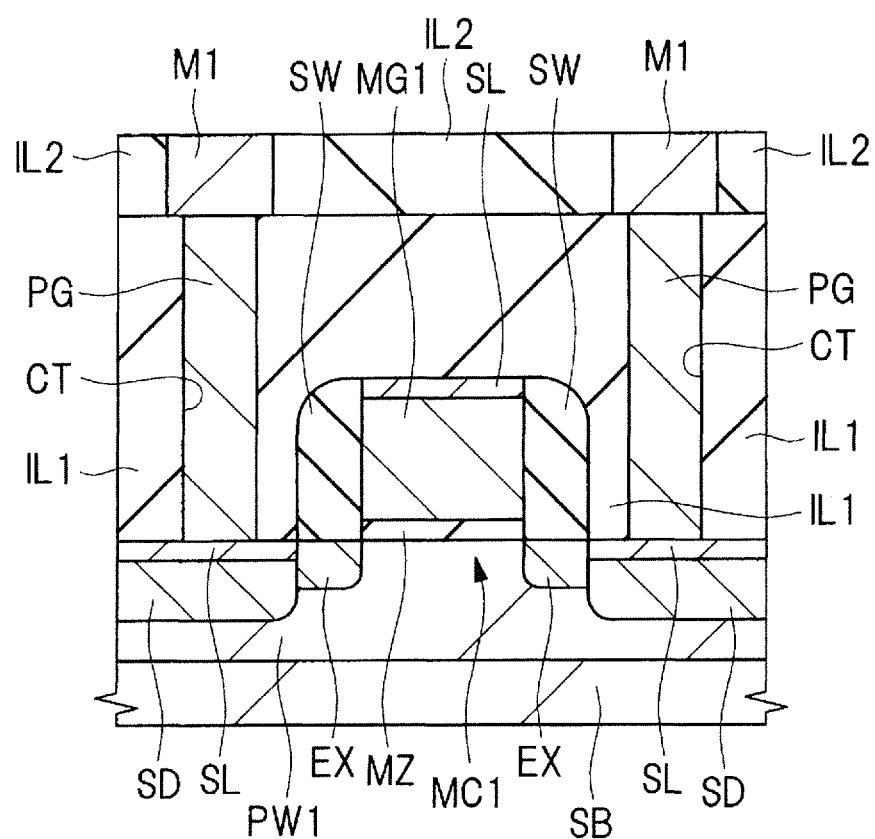
FIG. 15 is a main-portion cross-sectional view of the semiconductor device during the manufacturing process thereof, which is subsequent to FIG. 14.

First, as shown in FIG. 15, over the insulating film IL1 in which the plugs PG are embedded, the insulating film IL2 is formed. The insulating film IL2 can also be formed of a laminated film including a plurality of insulating films. Then, by dry etching using a photoresist pattern (not shown) as an etching mask, wire trenches (trenches for wires) are formed in the predetermined regions of the insulating film IL2. Subsequently, over the insulating film IL2 including the bottom portions and side walls of the wire trenches, a barrier conductor film is formed. The barrier conductor film is made of, e.g., a titanium nitride film, a tantalum film, a tantalum nitride film, or the like. Then, over the barrier conductor film, a copper seed layer is formed by a CVD method, a sputtering method, or the like. Over the seed layer, a copper plating film is further formed using an electrolytic plating method or the like to be embedded in each of the wire trenches. Then, the main conductor film (the copper plating film and the seed layer) is removed from the region other than the wire trenches by a CMP method to form the first-layer wires M1 each made of copper embedded in the wire trenches as a main conductive material. In FIG. 15, for simpler illustration, the barrier conductor film, the seed layer, and the copper plating film are integrally shown as each of the wires M1.

The wires M1 are electrically coupled to the source/drain regions (the $n^+$-type semiconductor regions SD) of the memory element MC1, the gate electrode MG1 of the memory element MC1, and the like via the plugs PG.

Subsequently, wires in second and subsequent layers are formed by a dual damascene method or the like, but the illustration and description thereof is omitted herein. The wires M1 and the wires in the layers located thereabove are not limited to damascene wires and can also be formed by patterning conductor films for wires. For example, the wires M1 and the wires in the layers located thereabove can also be, e.g., tungsten wires, aluminum wires, or the like.

In this manner, the semiconductor device in the present embodiment is manufactured.

<Split-Gate Memory Element>

In the "Single-Gate Memory Element" section shown above, the description has been given of the case where the present embodiment is applied to the single-gate memory element. Here, a description will be given of the case where the present embodiment is applied to a split-gate memory element.

Figure 16:
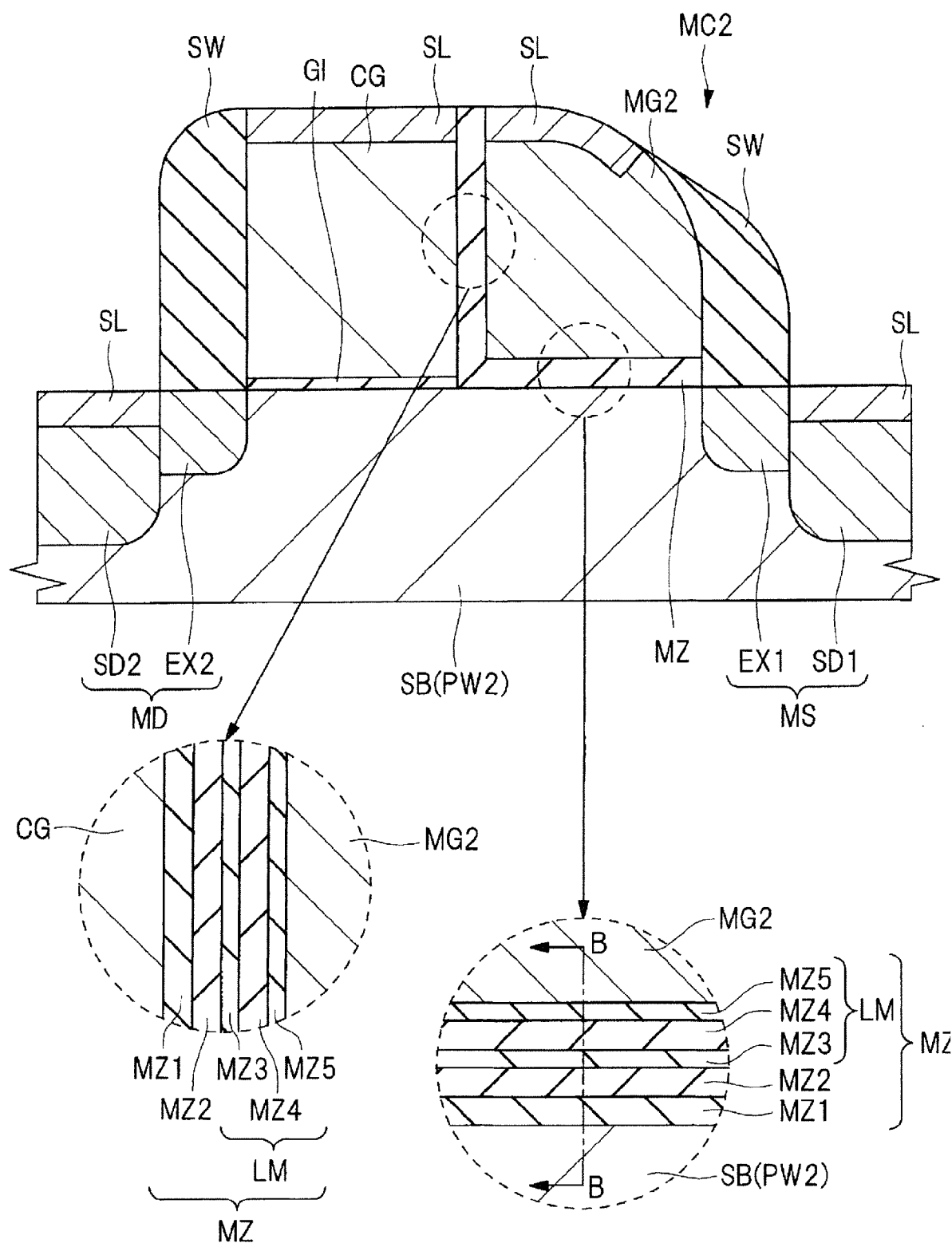
FIG. 16 is a main-portion cross-sectional view of the semiconductor device in the embodiment.
Figures 17, 18:
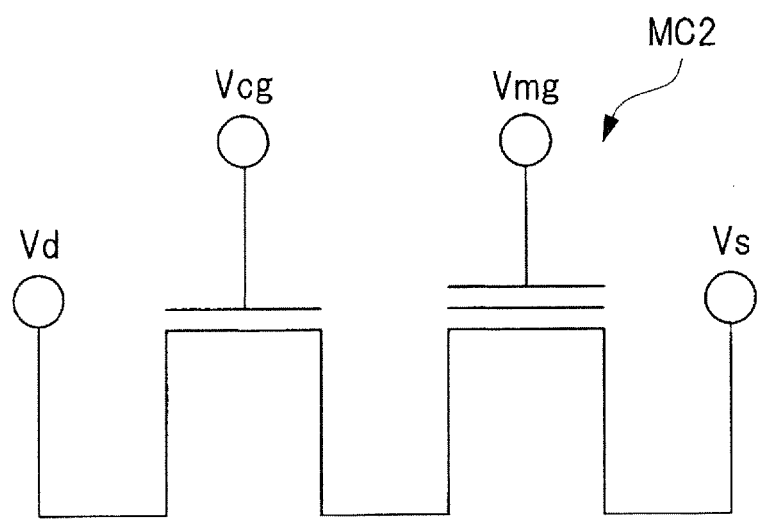
FIG. 17 is an equivalent circuit diagram of a memory cell.
FIG. 18 is a table showing an example of conditions for the application of voltages to the individual portions of a selected memory cell during "write", "erase", and "read" operations.

FIG. 16 is a main-portion cross-sectional view of the semiconductor device in the present embodiment and shows a main-portion cross-sectional view of a memory cell region in a nonvolatile memory. FIG. 17 is an equivalent circuit diagram of a memory element MC2. Note that, in FIG. 16, the illustration of the insulating films IL1 and IL2, the contact holes CT, the plugs PG and the wires M1 is omitted.

As shown in FIG. 16, in the semiconductor substrate SB, the memory element (storage element or memory cell) MC2 of the nonvolatile memory including a memory transistor, and a control transistor is formed. In an actual situation, in the semiconductor substrate SB, the plurality of memory elements MC2 are formed in an array configuration.

As shown in FIGS. 16 and 17, the memory element (memory cell) MC2 of the nonvolatile memory is a split-gate memory element (memory cell). The memory element MC2 is obtained by coupling two MISFETS to each other, which are the control transistor having the control gate electrode CG and the memory transistor having the memory gate electrode MG2.

Here, the MISFET including a gate insulating film including a charge storage portion (charge storage layer) and the memory gate electrode MG2 is referred to as the memory transistor, while the MISFET including a gate insulating film and the control gate electrode CG is referred to as the control transistor. Note that, since the control transistor is a memory cell selection transistor, the control transistor can also be regarded as a selection transistor. The memory transistor is a storage transistor.

A configuration of the memory element MC2 will be specifically described below.

As shown in FIG. 16, the memory element MC2 of the nonvolatile memory includes source/drain n-type semiconductor regions MS and MD formed in the p-type well PW2 of the semiconductor substrate SB, the control gate electrode CG formed over the semiconductor substrate SB (p-type well PW2), and the memory gate electrode MG2 formed over the semiconductor substrate SB (p-type well PW2) to be adjacent to the control gate electrode CG. The memory element MC2 of the nonvolatile memory further includes an insulating film (gate insulating film) GI formed between the control gate electrode CG and the semiconductor substrate SB (p-type well PW2), and the insulating film MZ formed between the memory gate electrode MG2 and the semiconductor substrate SB (p-type well PW2) and between the memory gate electrode MG2 and the control gate electrode CG.

The control gate electrode CG and the memory gate electrode MG2 extend along the main surface of the semiconductor substrate SB with the insulating film MZ being interposed between the respective facing side surfaces of the control gate electrode CG and the memory gate electrode MG2. The control gate electrode CG and the memory gate electrode MG2 are formed over the semiconductor substrate SB (p-type well PW2) located between the semiconductor regions MD and MS via the insulating film GI or the insulating film MZ. The memory gate electrode MG2 is located closer to the semiconductor region MS, while the control gate electrode CG is located closer to the semiconductor region MD. Note that the control gate electrode CG is formed over the semiconductor substrate SB via the insulating film GI, while the memory gate electrode MG2 is formed over the semiconductor substrate SB via the insulating film MZ. The control gate electrode CG and the memory gate electrode MG2 are adjacent to each other with the insulating film MZ being interposed therebetween.

The insulating film GI formed between the control gate electrode CG and the semiconductor substrate SB (p-type well PW2), i.e., the insulating film GI under the control gate electrode CG functions as the gate insulating film of the control transistor. The insulating film GI can be formed of, e.g., a silicon dioxide film, a silicon oxynitride film, or the like.

In the memory element MC1 in FIGS. 1 and 2 described above, the insulating film MZ is formed between the gate electrode MG1 and the semiconductor substrate SB (p-type well PW1). However, in the memory element MC2 in FIG. 16, the insulating film MZ is provided to extend over two regions including the region between the memory gate electrode MG2 and the semiconductor substrate SB (p-type well PW2), and the region between the memory gate electrode MG2 and the control gate electrode CG.

The configuration (laminated configuration) of the insulating film MZ in the memory element MC2 shown in FIG. 16 is the same as in the memory element MC1 in FIGS. 1 and 2 described above so that a repeated description thereof is omitted. Accordingly, in the same manner as in the memory element MC1 in FIGS. 1 and 2 described above, in the memory element MC2 shown in FIG. 16 also, the insulating film MZ is made of a laminated film including the insulating film MZ1, the insulating film MZ2 formed over the insulating film MZ1, the insulating film MZ3 formed over the insulating film MZ2, the insulating film MZ4 formed over the insulating film MZ3, and the insulating film MZ5 formed over the insulating film MZ4.

The insulating film MZ between the memory gate electrode MG2 and the semiconductor substrate SB (p-type well PW2), i.e., the insulating film MZ under the memory gate electrode MG2 functions as the gate insulating film (gate insulating film having an internal charge storage portion) of the memory transistor. The insulating film MZ can be regarded as an insulating film having an internal charge storage portion (which is the insulating film MZ2 herein). The insulating film MZ between the memory gate electrode MG2 and the semiconductor substrate SB (p-type well PW2) functions as the gate insulating film of the memory transistor. However, the insulating film MZ between the memory gate electrode MG2 and the control gate electrode CG functions as an insulating film for insulating (electrically insulating) the memory gate electrode MG2 and the control gate electrode CG from each other.

Note that, for improved clarity of illustration, the insulating film MZ made of the laminated film including the insulating films MZ1, MZ2, MZ3, MZ4, and MZ5 is shown as the single-layer insulating film MZ. However, in an actual situation, as shown in the enlarged view of the region enclosed in the dotted-line circle in FIG. 16, the insulating film MZ is made of the laminated film including the insulating films MZ1, MZ2, MZ3, MZ4, and MZ5.

The control gate electrode CG is made of a conductive film. For example, the control gate electrode CG is made of a silicon film such as an n-type polysilicon film (polycrystalline silicon film into which an n-type impurity has been introduced or doped polysilicon film). Specifically, the control gate electrode CG is made of a patterned silicon film.

The memory gate electrode MG2 is made of a conductive film. For example, the memory gate electrode MG2 is made of a silicon film such as an n-type polysilicon film (polycrystalline silicon film into which an n-type impurity has been introduced or doped polysilicon film). The silicon film forming the memory gate electrode MG2 can be a doped polysilicon film into which an n-type impurity has been introduced. However, in another form, the silicon film forming the memory gate electrode MG2 can be a doped polysilicon film into which a p-type impurity has been introduced or a non-doped polysilicon film into which no impurity has intentionally been introduced. The memory gate electrode MG2 is formed in a sidewall spacer shape over one of the side walls of the control gate electrode CG via the insulating film MZ.

The semiconductor regions MS and MD are source/drain semiconductor regions. That is, the semiconductor region MS functions as one of the source/drain regions, while the semiconductor region MD functions as the other of the source/drain regions. Here, the semiconductor region MS functions as the source region, while the semiconductor region MD functions as the drain region. Each of the semiconductor regions MS and MD is made of a semiconductor region into which an n-type impurity has been introduced and includes an LDD structure. That is, the source semiconductor region MS has an n$^-$-type semiconductor region EX1 (extension region), and an n$^+$-type semiconductor region SD1 (source region) having an impurity concentration higher than that of the n$^-$-type semiconductor region EX1. On the other hand, the drain semiconductor region MD has an n$^-$-type semiconductor region EX2 (extension region), and an n$^+$-type semiconductor regions SD2 (source region) having an impurity concentration higher than that of the n$^-$-type semiconductor region EX2.

The semiconductor region MS is a source/drain semiconductor region and formed at a position in the semiconductor substrate SB which is adjacent to the memory gate electrode MG2 in a gate length direction (gate length direction of the memory gate electrode MG2). On the other hand, the semiconductor region MD is a source/drain semiconductor region and formed at a position in the semiconductor substrate SB which is adjacent to the control gate electrode CG in a gate length direction (gate length direction of the control gate electrode CG).

Over the respective side walls of the memory gate electrode MG2 and the control gate electrode CG which are not adjacent to each other, the sidewall spacers SW each made of an insulator (insulating film) are formed.

In the source portion, the n$^-$-type semiconductor region EX1 is formed by self-alignment with the memory gate electrode MG2, and the n$^+$-type semiconductor region SD1 is formed by self-alignment with the sidewall spacer SW over the side wall of the memory gate electrode MG2. Consequently, in the manufactured semiconductor device, the lower-concentration n$^-$-type semiconductor region EX1 is formed under the sidewall spacer SW over the side wall of the memory gate electrode MG2, while the higher-concentration n$^+$-type semiconductor region SD1 is formed outside the lower-concentration n$^-$-type semiconductor region EX1. As a result, the lower-concentration n$^-$-type semiconductor region EX1 is formed to be adjacent to the channel region of the memory transistor, while the higher-concentration n$^+$-type semiconductor region SD1 is formed to be adjacent to the lower-concentration n$^-$-type semiconductor region EX1 and spaced apart from the channel region of the memory transistor by a distance corresponding to the lower-concentration n$^-$-type semiconductor region EX1.

In the drain portion, the n$^-$-type semiconductor region EX2 is formed by self-alignment with the control gate electrode CG, and the n$^+$-type semiconductor region SD2 is formed by self-alignment with the sidewall spacer SW over the side wall of the control gate electrode CG. Consequently, in the manufactured semiconductor device, the lower-concentration n$^-$-type semiconductor region EX2 is formed under the sidewall spacer SW over the side wall of the control gate electrode CG, while the higher-concentration n$^+$-type semiconductor region SD2 is formed outside the lower-concentration n$^-$-type semiconductor region EX2. As a result, the lower-concentration n$^-$-type semiconductor region EX2 is formed to be adjacent to the channel region of the control transistor, while the higher-concentration n$^+$-type semiconductor region SD2 is formed to be adjacent to the lower-concentration n$^-$-type semiconductor region EX2 and spaced apart from the channel region of the control transistor by a distance corresponding to the lower-concentration n$^-$-type semiconductor region EX2.

Under the insulating film MZ under the memory gate electrode MG2, the channel region of the memory transistor is formed. Under the insulating film GI under the control gate electrode CG, the channel region of the control transistor is formed.

In the respective upper portions of the n$^+$-type semiconductor regions SD1 and SD2, the memory gate electrode MG2, and the control gate electrode CG, the metal silicide layers LS have been formed using a salicide technique or the like. When the metal silicide layers SL are unneeded, the formation thereof can also be omitted. There may also be a case where, while the metal silicide layers SL are formed in the upper portions of the n$^+$-type semiconductor regions SD1 and SD2, the metal silicide layer SL is not formed in the upper portion of either one or each of the memory gate electrode MG2 and the control gate electrode CG.

Figure 31:
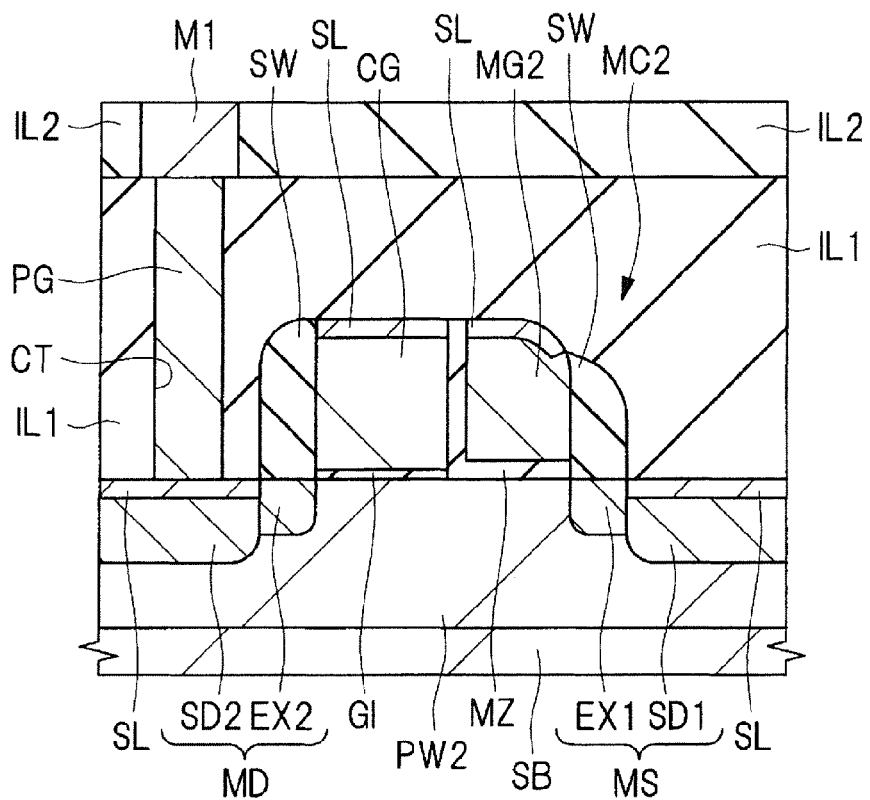
FIG. 31 is a main-portion cross-sectional view of the semiconductor device during the manufacturing process thereof, which is subsequent to FIG. 30.

As shown in FIG. 31 described later, over the semiconductor substrate SB, the insulating film IL1 is formed as an interlayer insulating film so as to cover the control gate electrode CG, the memory gate electrode MG2, and the sidewall spacers SW, though the illustration thereof is omitted in FIG. 16. In the insulating film IL1, the contact holes CT are formed and, in the contact holes CT, the plugs PG are embedded. Over the insulating film IL1 in which the plugs PG are embedded, the insulating film IL2 and the wires M1 are formed.

Next, a description will be given of an example of operations to the nonvolatile memory element MC2 with reference to FIG. 18.

FIG. 18 is a table showing conditions for the application of voltages to the individual portions of the selected memory cell during "Write", "Erase", and "Read" operations. In the table of FIG. 18, the voltages (Vd, Vcg, Vmg, Vs, and Vb) applied to the individual portions of a memory cell (selected memory cell) as shown in FIGS. 16 and 17 during each of the "Write", "Erase", and "Read" operations are shown. Here, the voltage Vmg is applied to the memory gate electrode MG2. The voltage Vs is applied to the semiconductor region MS (source region). The voltage Vcg is applied to the control gate electrode CG. The voltage Vd is applied to the semiconductor region MD (drain region). The base voltage Vb is applied to the p-type well PW2. Note that what is shown in FIG. 18 is a preferred example of the conditions for the application of the voltages, and the conditions for the application of the voltages are not limited thereto. The conditions for the application of the voltages can variously be changed as necessary. In the present embodiment, the injection of electrons into the charge storage portion (which is the insulating film MZ2 herein) in the insulating film MZ of the memory transistor is defined as the "Write" operation, and the injection of holes (positive holes) into the charge storage portion in the insulating film MZ of the memory transistor is defined as the "Erase" operation.

As a write method, a write method (hot electron injection write method) referred to as a so-called SSI (Source Side Injection) method which performs a write operation by injecting hot electrons using source-side injection can be used appropriately.

In a write operation in accordance with the SSI method, voltages such as, e.g., those shown in the "Write" row in FIG. 18 are applied to the individual portions of the selected memory cell to which a write operation is performed to inject electrons into the charge storage layer (which is the insulating film MZ2 herein) in the insulating film MZ of the selected memory cell and thus perform the write operation. At this time, hot electrons are generated in the channel region (between the source and drain) under the area between the two gate electrodes (memory gate electrode MG and control gate electrode CG) to be injected into the charge storage layer (which is the insulating film MZ2 herein) in the insulating film MZ under the memory gate electrode MG2. Consequently, in the SSI method, electrons are injected into the portion of the insulating film MZ which is adjacent to the control gate electrode CG. The injected hot electrons are trapped by a trap level in the charge storage layer (which is the insulating film MZ2 herein) in the insulating film MZ to consequently increase the threshold voltage of the memory transistor. That is, the memory transistor is brought into a written state.

As an erase method, an erase method (tunneling erase method) referred to as a so-called FN (Fowler Nordheim) method which performs an erase operation using FN tunneling can be used appropriately.

In an erase operation in accordance with the FN method, voltages such as, e.g., those shown in the "Erase" row in FIG. 18 (Vmg is a positive voltage, while each of Vd, Vcg, Vs, and Vb is 0 V) are applied to the individual portions of the selected memory cell to which the erase operation is performed to cause tunneling of holes (positive holes) from the memory gate electrode MG2 in the selected memory cell. By thus injecting the holes into the charge storage layer (which is the insulating film MZ2 herein) in the insulating film MZ, an erase operation is performed. At this time, the holes from the memory gate electrode MG2 tunnel through the insulating films MZ5, MZ4, and MZ3 by FN tunneling (FN tunnel effect) to be injected into the insulating film MZ and trapped by the trap level in the charge storage layer (which is the insulating film MZ2 herein) in the insulating film MZ. As a result, the threshold voltage of the memory transistor decreases (to provide an erased state).

During a read operation, voltages such as, e.g., those shown in the "Read" row in FIG. 18 are applied to the individual portions of the selected memory cell to which the read operation is performed. By setting the voltage Vmg applied to the memory gate electrode MG2 during the read operation to a value between the threshold voltage of the memory transistor in the written state and the threshold voltage of the memory transistor in the erased state, the written state and the erased state can be distinguished from each other.

As the erase method, there is also an erase method (hot-hole-injection erase method) referred to as a so-called BTBT (Band-To-Band Tunneling) method which performs an erase operation by injecting hot holes using a BTBT phenomenon. An erase operation in accordance with the BTBT method is performed by injecting holes (positive holes) generated by BTBT (Band-To-Band Tunneling) from the semiconductor substrate (SB) into the charge storage layer (which is the insulating film MZ2 herein) in the insulating film MZ.

However, in the present embodiment, the FN method (tunneling erase method), not the BTBT method (BTBT erase method), is used preferably as the erase method. The amount of current consumed (power consumed) during the erase operation is smaller in the FN method (tunneling erase method) than in the BTBT method (BTBT erase method). In the present embodiment, by using the FN method (tunneling erase method) as the erase method, i.e., by injecting holes from the memory gate electrode MG2 into the insulating film MZ2 of the insulating film MZ (by tunneling) to perform the erase operation to the selected memory cell, the amount of current consumed (power consumed) during the erase operation can be reduced.

Figure 19:
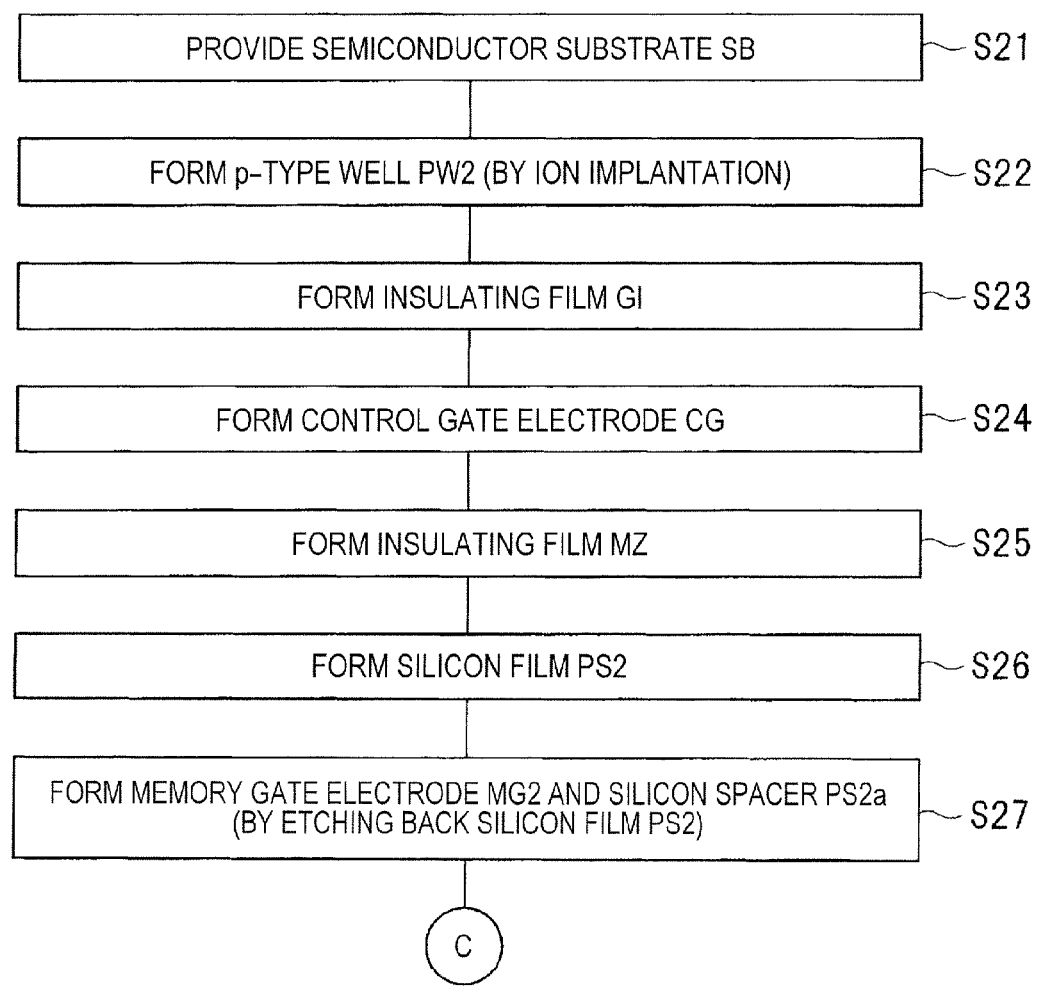
FIG. 19 is a process flow chart showing a part of the manufacturing process of the semiconductor device in the embodiment.
Figure 20:
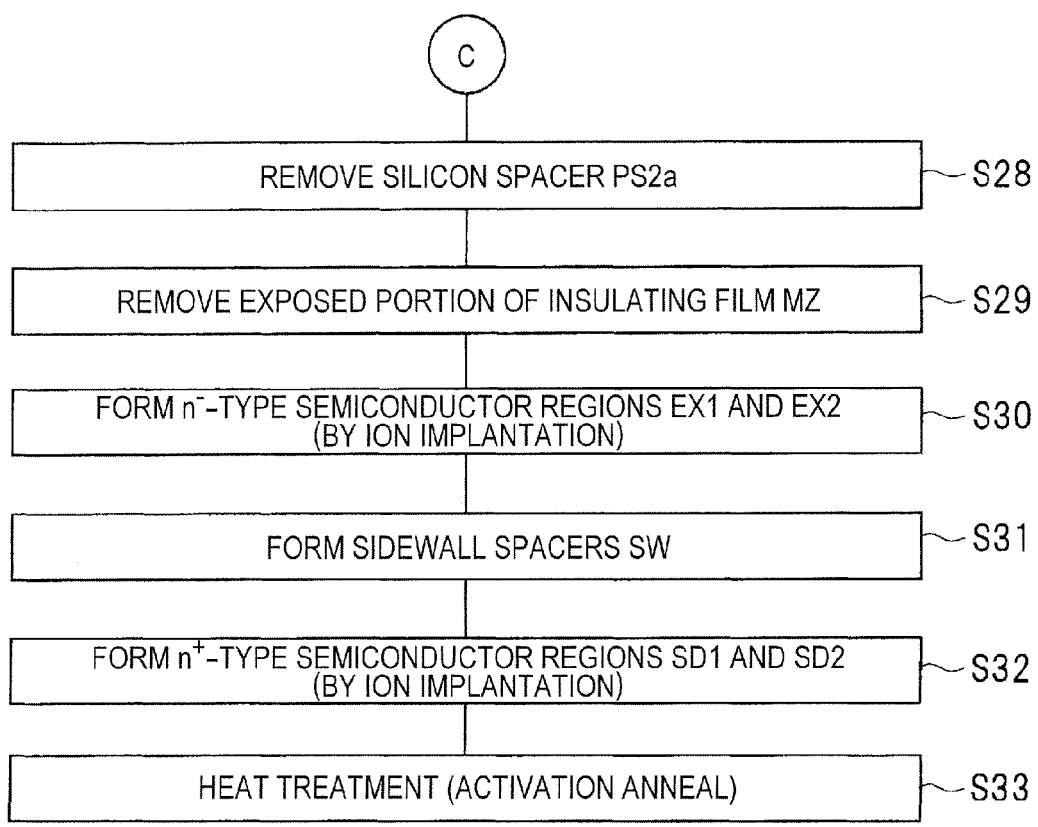
FIG. 20 is a process flow chart showing a part of the manufacturing process of the semiconductor device in the embodiment.

Next, a description will be given of a method of manufacturing the semiconductor device including the non-volatile memory element MC2 shown in FIGS. 16 and 17 with reference to FIGS. 19 to 31. FIGS. 19 and 20 are process flow charts each showing a part of the manufacturing process of the semiconductor device in the present embodiment. FIGS. 21 to 31 are main-portion cross-sectional views of the semiconductor device in the present embodiment during the manufacturing process thereof.

Figure 21:
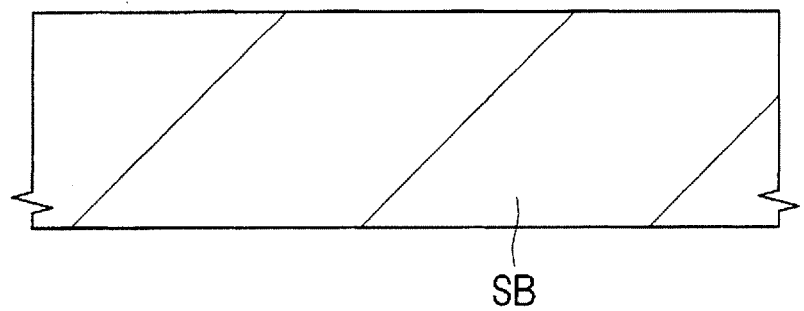
FIG. 21 is a main-portion cross-sectional view of the semiconductor device in the embodiment during the manufacturing process thereof.

As shown in FIG. 21, first, the same semiconductor substrate SB as provided in the case shown in FIG. 21 described above is provided (Step S21 in FIG. 19). Then, in the main surface of the semiconductor substrate SB, the isolation region (not shown) defining the active region is formed.

Figure 22:
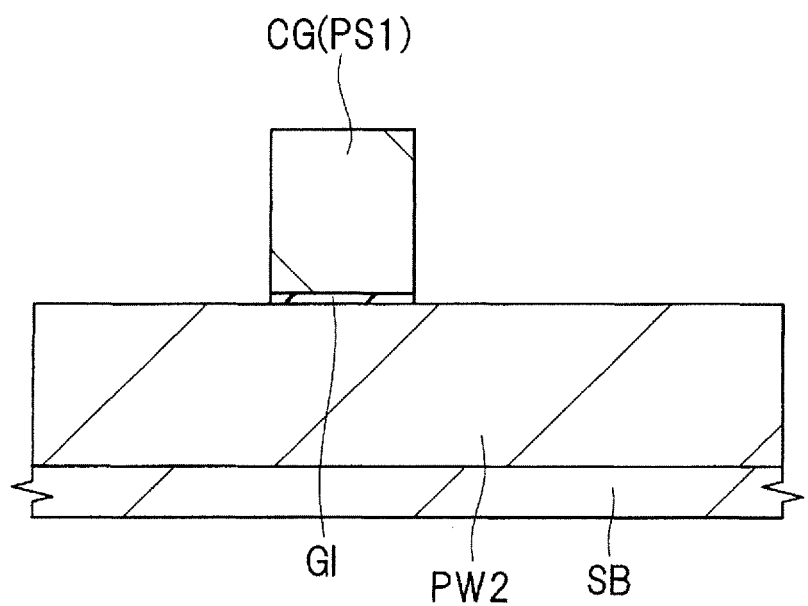
FIG. 22 is a main-portion cross-sectional view of the semiconductor device during the manufacturing process thereof, which is subsequent to FIG. 21.

Next, as shown in FIG. 22, the p-type well PW2 is formed in the semiconductor substrate SB located in a memory cell formation region (Step S22 in FIG. 19). The p-type well PW2 can be formed by an ion implantation method and is formed over a predetermined depth from the main surface of the semiconductor substrate SB.

Next, by diluted hydrofluoric acid cleaning or the like, the top surface of the semiconductor substrate SB (p-type well PW2) is cleaned. Then, over the main surface (top surface of the p-type well PW2) of the semiconductor substrate SB, an insulating film GI for the gate insulating film of a control transistor is formed (Step S23 in FIG. 19). Then, over the main surface (entire main surface) of the semiconductor substrate SB, i.e., over the insulating film GI, a silicon film PS1 is formed (deposited) as a conductor film for forming the control gate electrode CG and then patterned using a photolithographic method and a dry etching method to form the control gate electrode CG made of the patterned silicon film PS1 (Step S24 in FIG. 19).

The silicon film PS1 is made of a polycrystalline silicon film (polysilicon film) and can be formed using a CVD method or the like. However, the silicon film PS1 can also be formed by depositing an amorphous film and then changing the deposited amorphous silicon film to a polycrystalline silicon film by subsequent heat treatment. As a result of introducing an n-type impurity into the silicon film PS1, the silicon film PS1 has a low resistance. The silicon film PS1 can be formed by depositing a non-doped silicon film and then introducing an impurity into the deposited non-doped silicon film by ion implantation. Consequently, the control gate electrode CG is formed of an n-type doped polysilicon film.

In the region where the memory cell is formed, the insulating film GI except for the portion thereof covered with the control gate electrode CG (i.e., the insulating film GI except for the portion thereof serving as the gate insulating film) may be removed by dry etching performed in the step of patterning the silicon film PS1 or by wet etching performed after the dry etching.

Next, cleaning treatment is performed on the main surface of the semiconductor substrate SB. Then, as shown in FIG. 23, over the entire main surface of the semiconductor substrate SB, i.e., over the main surface (top surface) of the semiconductor substrate SB and over the top surface (upper surface and side surface) of the control gate electrode CG, the insulating film MZ for the gate insulating film of the memory transistor is formed (Step S25 in FIG. 19).

Figure 23:
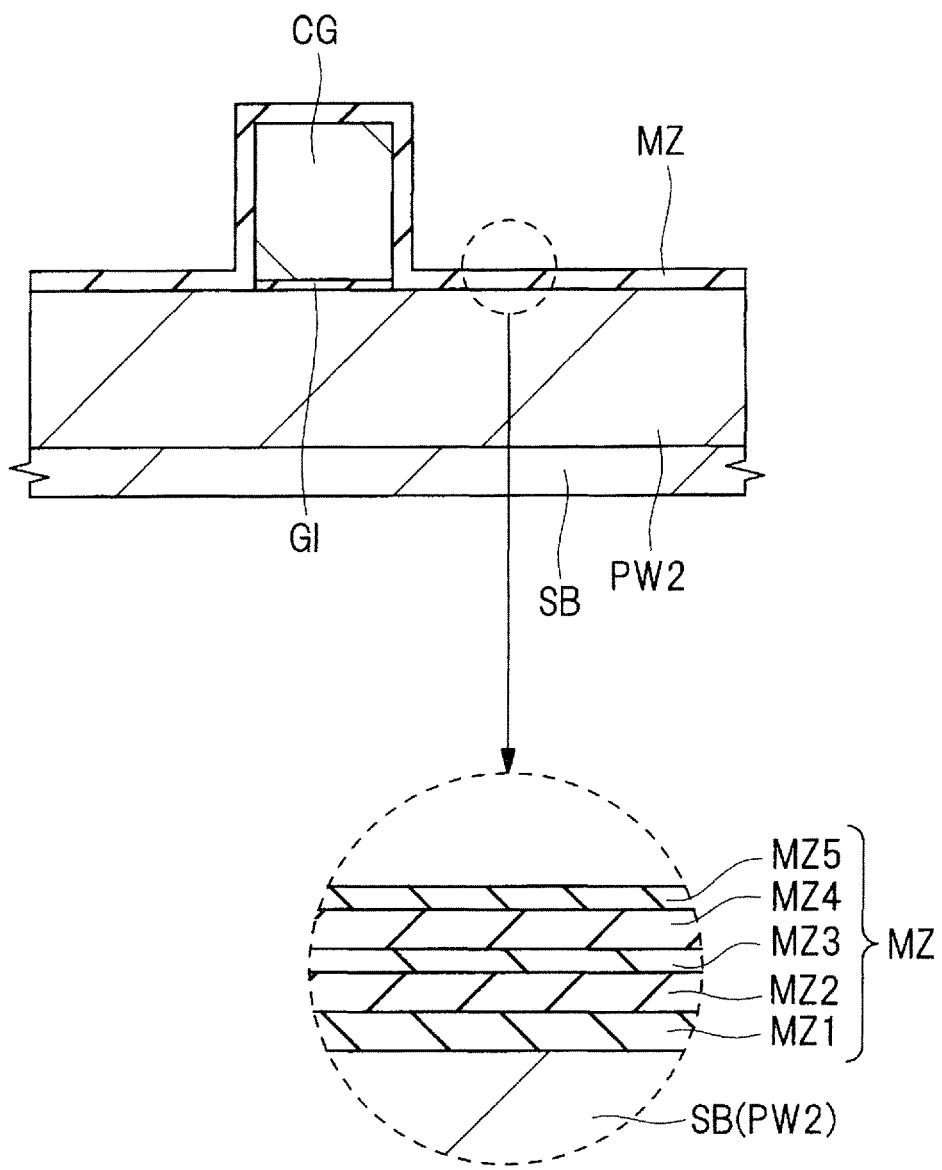
FIG. 23 is a main-portion cross-sectional view of the semiconductor device during the manufacturing process thereof, which is subsequent to FIG. 22.

Note that, for improved clarity of illustration of the drawing, in FIG. 23, the insulating film MZ made of the laminated film including the insulating films MZ1, MZ2, MZ3, MZ4, and MZ5 is shown as the single-layer insulating film MZ. However, in an actual situation, as shown in the enlarged view of the region enclosed in the dotted-line circle in FIG. 23, the insulating film MZ is made of the laminated film including the insulating films MZ1, MZ2, MZ3, MZ4, and MZ5.

The step of forming the insulating film MZ (Step S25) in FIG. 23 is basically the same as the step of forming the insulating film MZ (Step S3 described above) in FIG. 6 described above so that a repeated description thereof is omitted herein. However, the case shown in FIG. 23 (Step S25) is different from the case shown in FIG. 6 (step S3) described above in that the insulating film MZ is formed not only over the main surface (top surface) of the semiconductor substrate SB, but also over the top surface (upper surface and side surface) of the control gate electrode CG.

Figure 24:
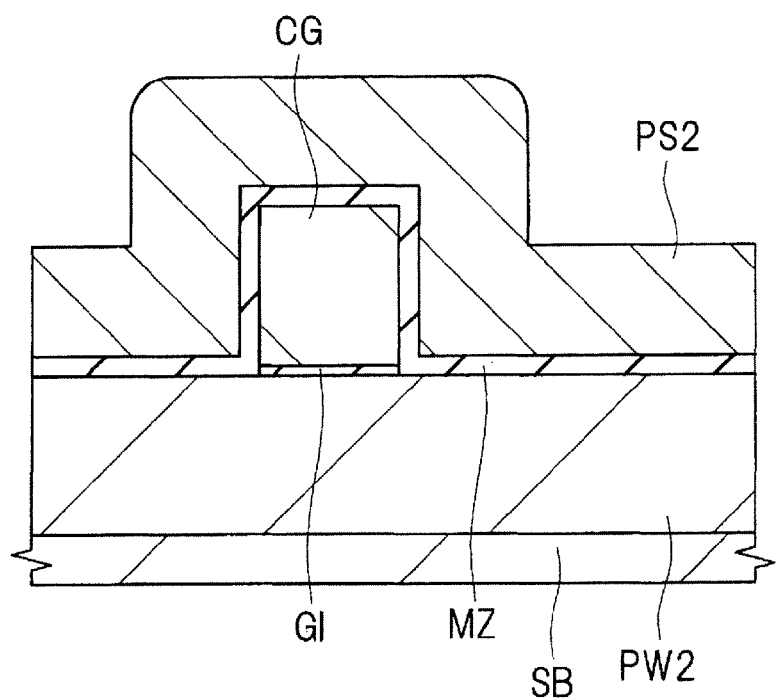
FIG. 24 is a main-portion cross-sectional view of the semiconductor device during the manufacturing process thereof, which is subsequent to FIG. 23.

Next, as shown in FIG. 24, over the main surface (entire main surface) of the semiconductor substrate SB, i.e., over the insulating film MZ, a silicon film PS2 is formed (deposited) as a conductor film for forming the memory gate electrode MG2 so as to cover the control gate electrode CG (Step S26 in FIG. 19).

The silicon film PS2 is made of a polycrystalline silicon film and can be formed using a CVD method or the like. The silicon film PS2 can also be formed by depositing an amorphous silicon film and then changing the deposited amorphous silicon film to a polycrystalline silicon film by subsequent heat treatment.

The memory gate electrode MG2 is made of a conductive film and formed of the silicon film PS2 such as, e.g., an n-type polysilicon film. The silicon film PS2 can be a doped polysilicon film into which an n-type impurity has been introduced. However, in another form, the silicon film PS2 can also be a doped polysilicon film into which a p-type impurity has been introduced or a non-doped polysilicon film into which no impurity has intentionally been introduced. In the case of introducing an n-type or p-type impurity into the silicon film PS2, the n-type or p-type impurity can be introduced into the silicon film PS2 by ion implantation after the deposition thereof. Alternatively, the n-type or p-type impurity can also be introduced into the silicon film PS2 during the deposition thereof.

Next, using an anisotropic etching technique, the silicon film PS2 is etched back (by etching, dry etching, or anisotropic etching) (Step S27 in FIG. 19).

Figure 25:
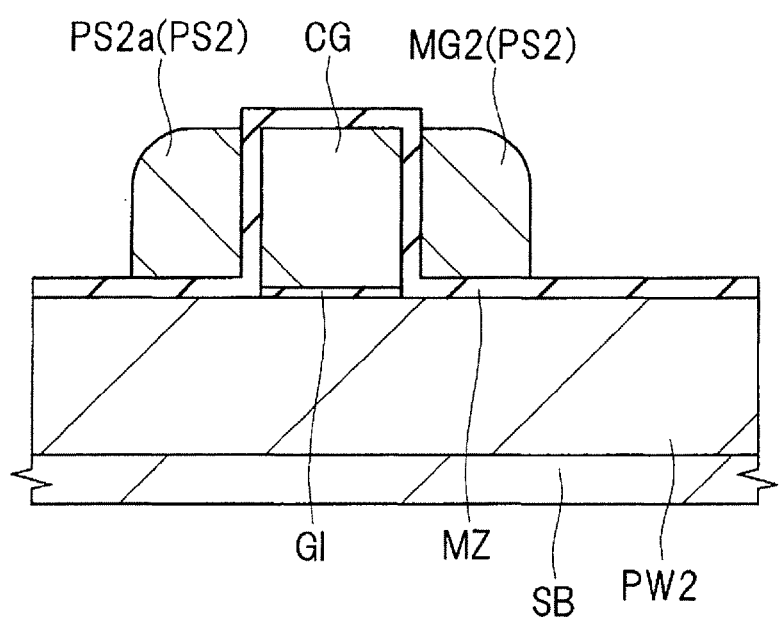
FIG. 25 is a main-portion cross-sectional view of the semiconductor device during the manufacturing process thereof, which is subsequent to FIG. 24.

In the etch-back step in Step S27, the silicon film PS2 is etched back by anisotropic etching by a thickness corresponding to the deposited film thickness thereof. Thus, the silicon film PS2 is left into sidewall spacer shapes over the both side walls of the control gate electrode CG (via the insulating film MZ), while the silicon film PS2 in the other region is removed therefrom. As a result, as shown in FIG. 25, the silicon film PS2 left in the sidewall spacer shape over one of the both side walls of the control gate electrode CG via the insulating film MZ forms the memory gate electrode MG2, while the silicon film PS2 left in the sidewall spacer shape over the other side wall of the control gate electrode CG via the insulating film MZ forms a silicon spacer PS2a. The memory gate electrode MG2 is formed over the insulating film MZ so as to be adjacent to the control gate electrode CG via the insulating film MZ. When the memory gate electrode MG2 and the silicon spacer PS2a are formed by performing the step of etching back the silicon film PS2, the insulating film MZ in the region uncovered with the memory gate electrode MG2 and the silicon spacer PS2a is exposed.

Figure 26:
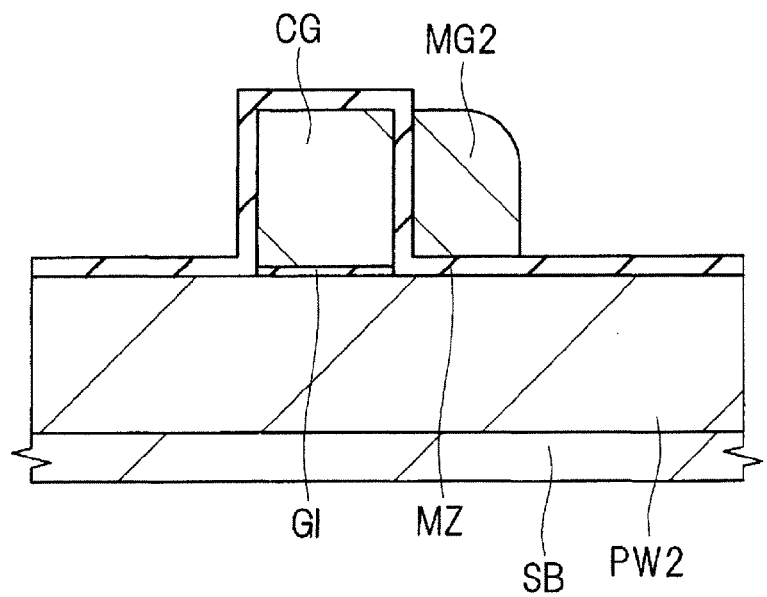
FIG. 26 is a main-portion cross-sectional view of the semiconductor device during the manufacturing process thereof, which is subsequent to FIG. 25.

Next, using a photolithographic technique, a photoresist pattern (not shown) which covers the memory gate electrode MG2 and exposes the silicon spacer PS2a is formed over the semiconductor substrate SB. Then, by dry etching using the photoresist pattern as an etching mask, the silicon spacer PS2a is removed (Step S28 in FIG. 20). Thereafter, the photoresist pattern is removed. FIG. 26 shows the resulting stage. By the etching step, as shown in FIG. 26, the silicon spacer PS2a is removed. However, the memory gate electrode MG2 covered with the photoresist pattern remains without being etched.

Figure 27:
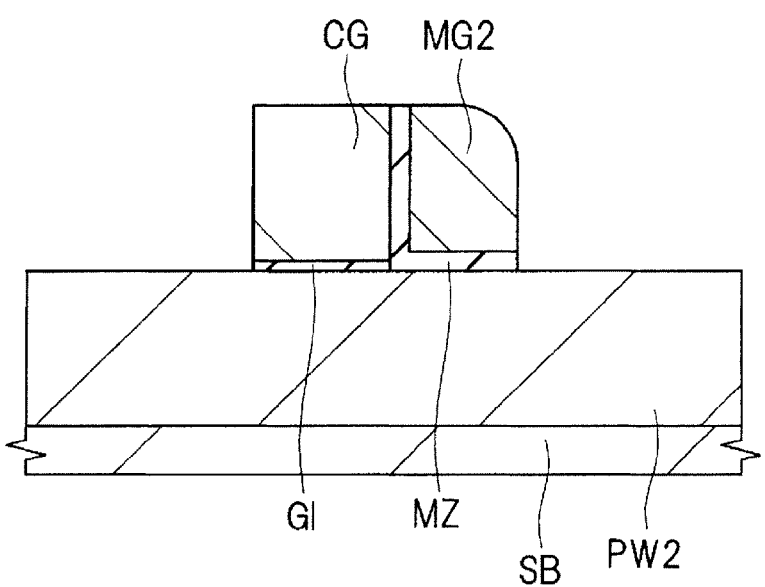
FIG. 27 is a main-portion cross-sectional view of the semiconductor device during the manufacturing process thereof, which is subsequent to FIG. 26.

Next, as shown in FIG. 27, the exposed portion of the insulating film MZ which is uncovered with the memory gate electrode MG2 is removed by etching (e.g., wet etching) (Step S29 in FIG. 20)). At this time, the insulating film MZ located under the memory gate electrode MG2 and between the memory gate electrode MG2 and the control gate electrode CG remains without being removed, while the insulating film MZ in the other region is removed therefrom. As can also be seen from FIG. 27, the insulating film MZ is provided to continuously extend over two regions including the region between the memory gate electrode MG2 and the semiconductor substrate SB (p-type well PW2) and the region between the memory gate electrode MG2 and the control gate electrode CG.

Figure 28:
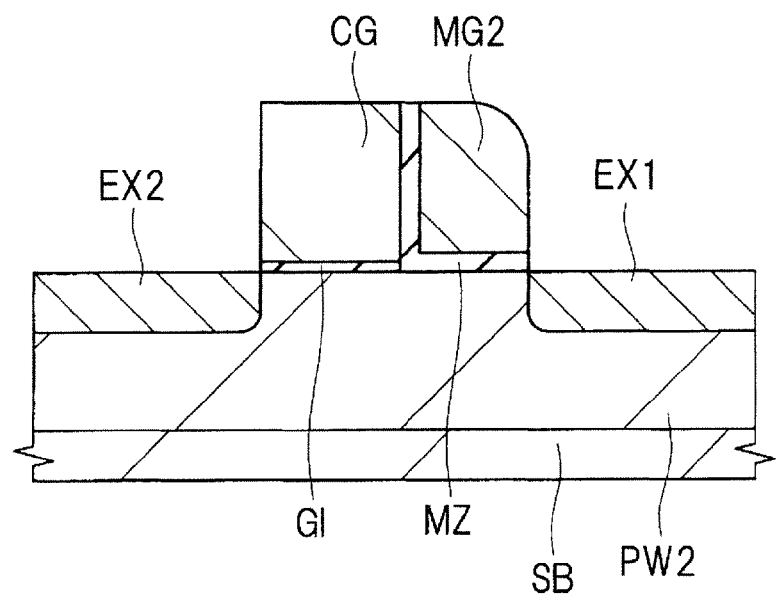
FIG. 28 is a main-portion cross-sectional view of the semiconductor device during the manufacturing process thereof, which is subsequent to FIG. 27.

Next, using an ion implantation method or the like, an n-type impurity is introduced into the semiconductor substrate SB (p-type well PW2) using the control gate electrode CG and the memory gate electrode MG2 as a mask (ion implantation inhibition mask) to form the $n^-$-type semiconductor regions (impurity diffusion layers) EX1 and EX2, as shown in FIG. 28 (Step S30 in FIG. 20).

At this time, the $n^-$-type semiconductor region EX1 is formed by self-alignment with the side wall (side wall opposite to that adjacent to the control gate electrode CG via the insulating film MZ) of the memory gate electrode MG2. On the other hand, the $n^-$-type semiconductor region EX2 is formed by self-alignment with the side wall (side wall opposite to that adjacent to the memory gate electrode MG2 via the insulating film MZ) of the control gate electrode CG. The $n^-$-type semiconductor regions EX1 and EX2 can be formed either by the same ion implantation step or by different ion implantation steps.

Figure 29:
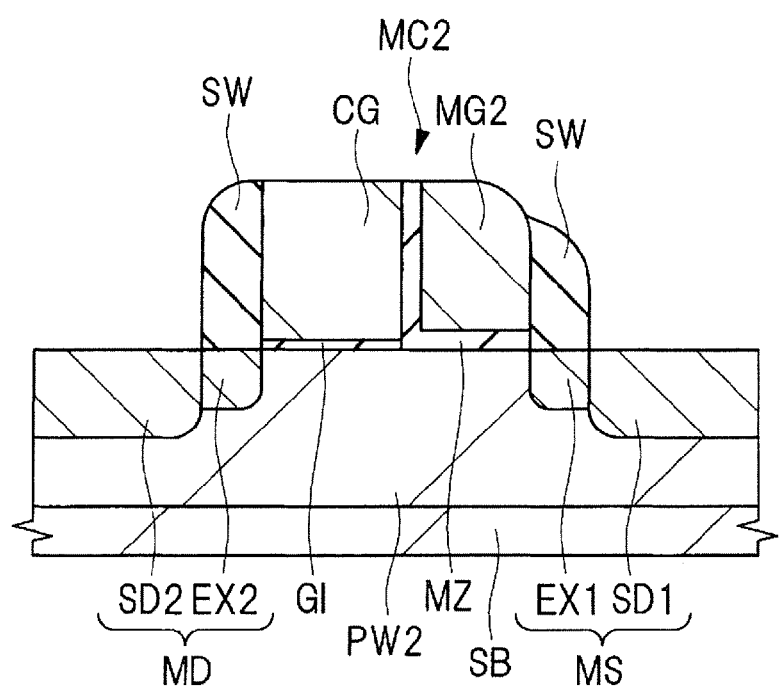
FIG. 29 is a main-portion cross-sectional view of the semiconductor device during the manufacturing process thereof, which is subsequent to FIG. 28.

Next, as shown in FIG. 29, over the respective side walls (side walls different from those adjacent to each other via the insulating film MZ) of the control gate electrode CG and the memory gate electrode MG2, the sidewall spacers SW each made of an insulating film are formed as side-wall insulating films (Step S31 in FIG. 20). The sidewall spacers SW can be formed by, e.g., forming an insulating film for forming the sidewall spacers SW over the entire main surface of the semiconductor substrate SB so as to cover the control gate electrode CG and the memory gate electrode MG2 and etching back the insulating film using an anisotropic etching technique. The sidewall spacers SW are formed over the side wall of the control gate electrode CG opposite to the side wall thereof adjacent to the memory gate electrode MG2 via the insulating film MZ and over the side wall of the memory gate electrode MG2 opposite to the side wall thereof adjacent to the control gate electrode CG via the insulating film MZ.

Next, using an ion implantation method or the like, an n-type impurity is introduced into the semiconductor substrate SB (p-type well PW2) using the control gate electrode CG, the memory gate electrode MG2, and the sidewall spacers SW over the side walls thereof as a mask (ion implantation inhibition mask) to form the $n^+$-type semiconductor regions SD1 and SD2 (Step S32 in FIG. 20).

At this time, the $n^+$-type semiconductor region SD1 is formed by self-alignment with the sidewall spacer SW over the side wall of the memory gate electrode MG2, while the $n^+$-type semiconductor region SD2 is formed by self-alignment with the sidewall spacer SW over the side wall of the control gate electrode CG. Thus, the LDD structures are formed. The $n^+$-type semiconductor regions SD1 and SD2 can be formed either by the same ion implantation step or by different ion implantation steps.

Thus, the n-type semiconductor region MS functioning as the source region of the memory transistor is formed of the $n^-$-type semiconductor region EX1 and the $n^+$-type semiconductor region SD1 having an impurity concentration higher than that of the $n^-$-type semiconductor region EX1, while the n-type semiconductor region MD functioning as the drain region of the control transistor is formed of the $n^-$-type semiconductor region EX2 and the $n^+$-type semiconductor region SD2 having an impurity concentration higher than that of the $n^-$-type semiconductor region EX2.

Next, activation anneal as heat treatment for activating the impurities introduced into the source and drain semiconductor regions (n⁻-type semiconductor regions EX1 and EX2 and n⁺-type semiconductor regions SD1 and SD2) or the like is performed (Step S33 in FIG. 20).

In this manner, the memory element MC2 of the nonvolatile memory is formed.

Figure 30:
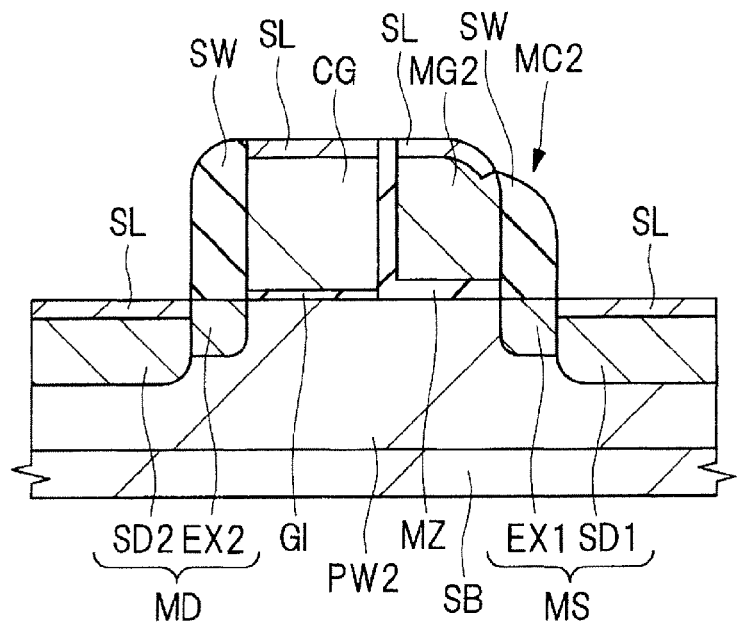
FIG. 30 is a main-portion cross-sectional view of the semiconductor device during the manufacturing process thereof, which is subsequent to FIG. 29.

Next, by performing a salicide process as described above with reference to FIGS. 12 and 13, the metal silicide layers SL are formed, as shown in FIG. 30. The metal silicide layers SL can be formed in the respective upper portions of the n⁺-type semiconductor regions SD1 and SD2, the control gate electrode CG, and the memory gate electrode MG2. This can reduce the respective resistances of the source/drain and the individual gate electrodes (CG and MG2).

In the case shown in FIG. 31 also, the subsequent process is basically the same as in the case shown in FIGS. 14 and 15 described above.

That is, as shown in FIG. 31, over the entire main surface of the semiconductor substrate SB, the insulating film IL1 is formed as the interlayer insulating film so as to cover the control gate electrode CG, the memory gate electrode MG2, and the sidewall spacers SW. After the formation of the insulating film IL1, the upper surface of the insulating film IL1 is planarized as necessary using a CMP method or the like. Then, using a photolithographic technique and a dry etching technique, the contact holes CT are formed in the insulating film IL1. Then, in the contact holes CT, the conductive plugs PG are formed. Subsequently, over the insulating film IL1 in which the plugs PG are embedded, the insulating film IL2 is formed. Then, after the wire trenches are formed in the insulating film IL2, the wires M1 are formed in the wire trenches.

Then, by a dual damascene method or the like, wires in second and subsequent layers are formed, but the illustration and description thereof is omitted herein. The wires M1 and the wires in the layers located thereabove are not limited to damascene wires and can also be formed by patterning conductor films for wires. For example, the wires M1 and the wires in the layers located thereabove can also be tungsten wires, aluminum wires, or the like.

<About Energy Band Structure>

Next, a description will be given of the energy band structure of each of the memory elements MC1 and MC2 with reference to the drawings.

Figure 32:
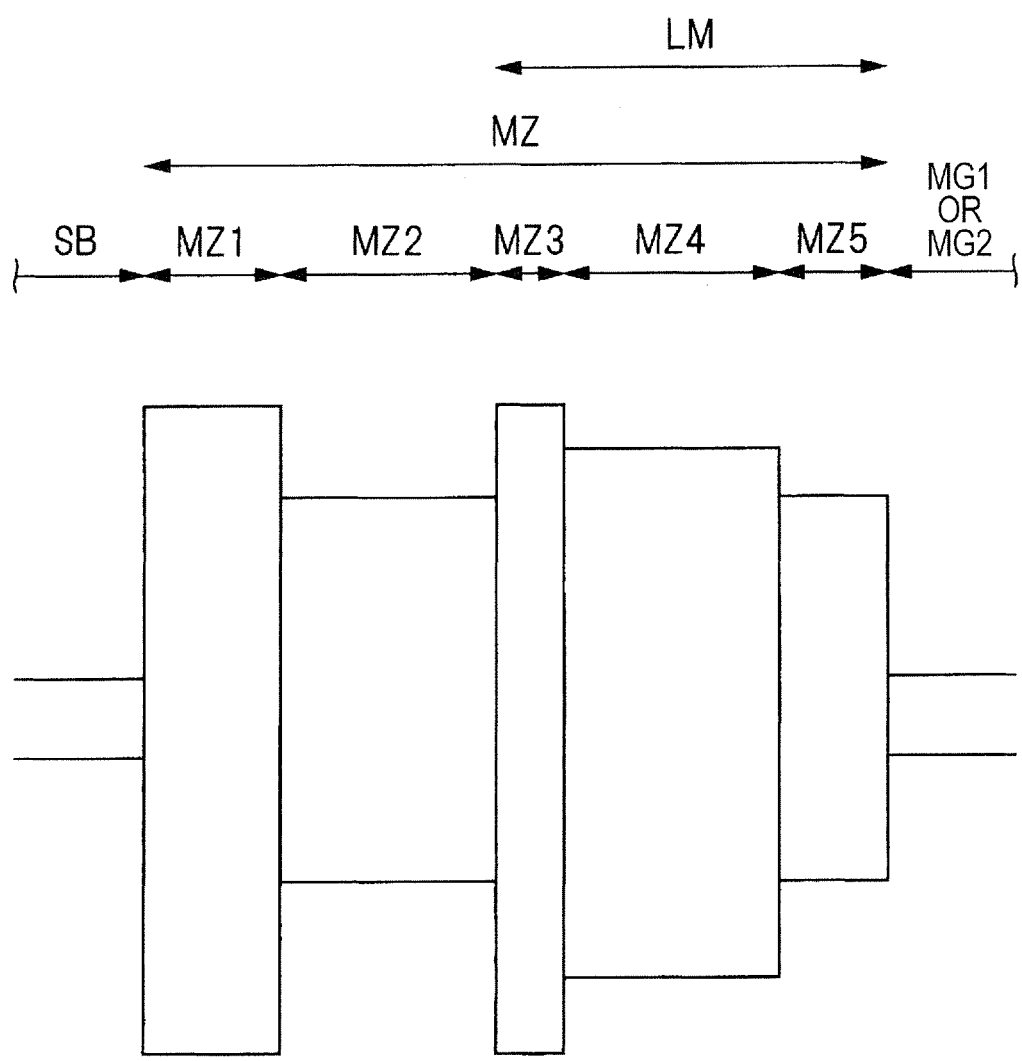
FIG. 32 is an illustrative view showing an energy band structure of a memory element in the semiconductor device in the embodiment.

FIG. 32 is an illustrative view showing the energy band structure of each of the memory elements MC1 and MC2. FIG. 32 shows the energy band structure at a position along the line A-A in FIG. 2 described above. The energy band structure at the position along the line B-B in FIG. 16 described above is also the same as in FIG. 32. That is, FIG. 32 is an energy band diagram at a position where the insulating film MZ interposed between the semiconductor substrate SB and the gate electrode (gate electrode MG1 or memory gate electrode MG2) is traversed in a thickness direction (thickness direction of the insulating film MZ) in the memory element MC1 in FIG. 2 described above or in the memory element MC2 in FIG. 16 described above. In FIG. 32, a position in the lateral direction thereof corresponds to a position in the thickness direction and a position in the longitudinal direction thereof corresponds to an energy.

In the memory element MC1 in FIGS. 1 and 2 described above, over the semiconductor substrate SB, the gate electrode MG1 is formed via the insulating film MZ for the gate insulating film. In the memory element MC2 in FIG. 16 described above, over the semiconductor substrate SB, the memory gate electrode MG2 is formed via the insulating film MZ for the gate insulating film. In either of the memory elements MC1 and MC2, the insulating film MZ is made of the laminated film including the insulating film MZ1, the insulating film MZ2 formed over the insulating film MZ1, the insulating film MZ3 formed over the insulating film MZ2, the insulating film MZ4 formed over the insulating film MZ3, and the insulating film MZ5 formed over the insulating film MZ4. Among the insulating films MZ1, MZ2, MZ3, MZ4, and MZ5 included in the insulating film MZ, the insulating film MZ2 has the charge storing function.

As can also be seen from the band structure in FIG. 32, the band gap of each of the insulating films MZ1 and MZ3 is larger than the band gap of the insulating film MZ2. In other words, the band gap of the insulating film MZ2 is smaller than the band gap of each of the insulating films MZ1 and MZ3. This allows the insulating film MZ2 as the charge storage layer to retain charges and allows each of the insulating films MZ3 and MZ1 between which the insulating film MZ2 is interposed to function as a charge block layer (or charge confinement layer).

The band gap of the insulating film MZ4 is smaller than the band gap of the insulating film MZ3. The band gap of the insulating film MZ5 is smaller than the band gap of the insulating film MZ4. In other words, the band gap of the insulating film MZ3 is larger than the band gap of the insulating film MZ4, and the band gap of the insulating film MZ4 is larger than the band gap of the insulating film MZ5.

When a silicon nitride film is used as the insulating film MZ2 and a silicon dioxide film is used as the insulating film MZ3, a valence-band energy barrier formed between the insulating films MZ2 and MZ3 is, e.g., about 2.5 to 2.9 eV. When a silicon nitride film is used as the insulating film MZ5 and a silicon film is used as the gate electrode (MG1 or MG2), the valence-band energy barrier formed between the insulating film MZ5 and the gate electrode (MG1 or MG2) is, e.g., about 1.8 eV.

Figure 33:
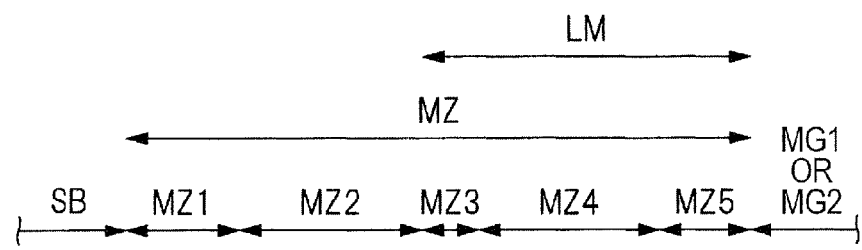
FIG. 33 is an illustrative view showing the energy band structure of the memory element during an erase operation.
Figure 33:
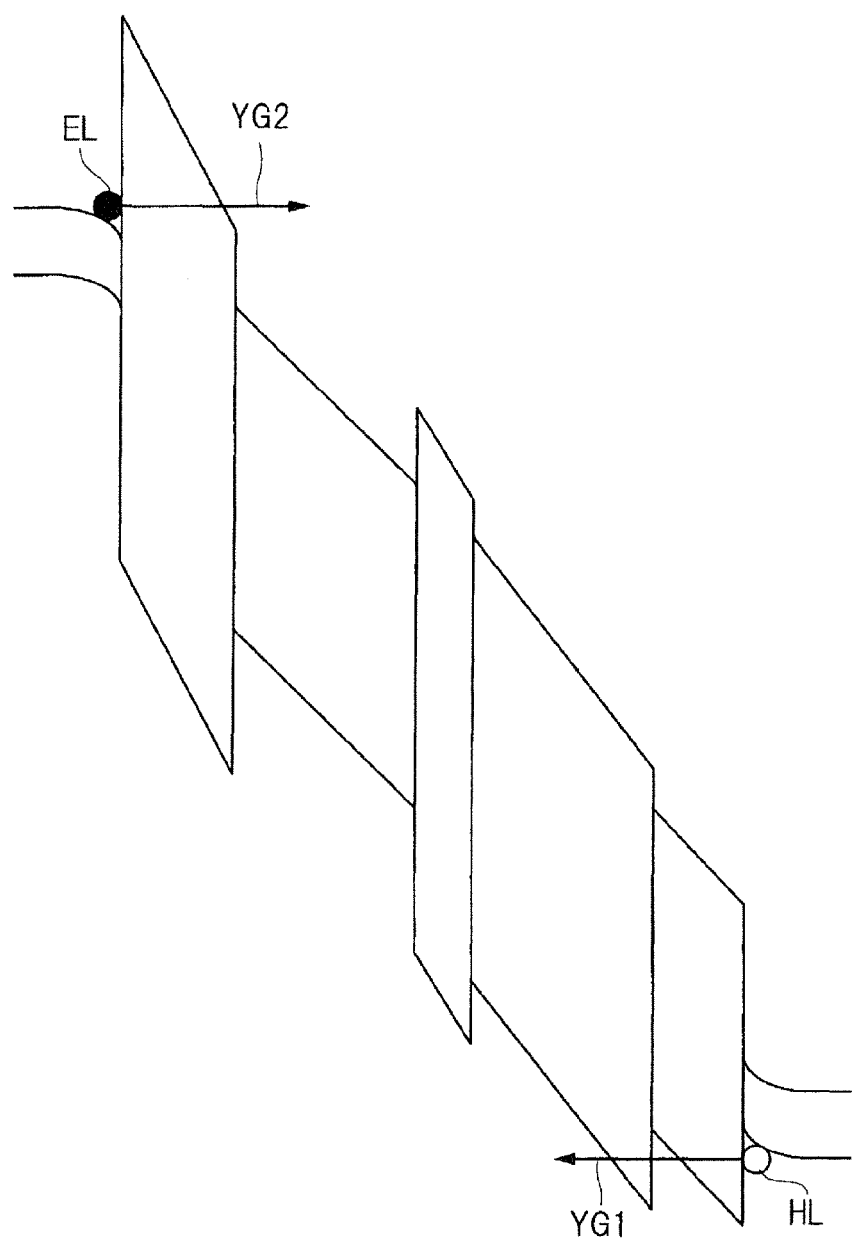

FIG. 33 is an illustrative view showing the energy band structure of each of the memory elements MC1 and MC2 during an erase operation. Similarly to FIG. 32, FIG. 33 also shows the energy band structure at the position along the line A-A in FIG. 2 described above or the line B-B in FIG. 16 described above.

During the erase operation, a positive potential (voltage) is applied as an erase voltage to the gate electrode (MG1 or MG2). As a result, the potential at the gate electrode (MG1 or MG2) becomes higher than the potential at the semiconductor substrate SB (p-type well PW1 or PW2) to thus form an energy band structure as shown in FIG. 33. In this case, by the FN tunneling, holes (positive holes) HL in the gate electrode (MG1 or MG2) tunnel through the insulating films MZ5, MZ4, and MZ3 to be injected into the insulating film MZ and trapped by a trap level in the insulating film MZ2 as the charge storage layer in the insulating film MZ. The direction of injection of the holes HL at this time is shown by the arrow YG1 in FIG. 33. Since the potential at the gate electrode (MG1 or MG2) is higher than the potential at the semiconductor substrate SB (p-type well PW1 or PW2) during the erase operation, not only the holes (positive holes) HL are injected from the gate electrode (MG1 or MG2) into the insulating film MZ, but also electrons EL may be injected from the semiconductor substrate SB into the insulating film MZ. The direction of injection of the electrons EL at this time is shown by the arrow YG2 in FIG. 33. However, during the erase operation, by controlling the number of the holes HL injected from the gate electrode (MG1 or MG2) into the insulating film MZ such that the number of injected holes HL is larger than the number of the electrons EL injected from the semiconductor substrate SB into the insulating film MZ, it is possible to cause the holes HL injected from the gate electrode (MG1 or MG2) into the insulating film MZ to be trapped by the trap level in the insulating film MZ2 and thus bring the memory element (MC1 or MC2) into an erased state. During the erase operation, the number of the holes HL injected from the gate electrode (MG1 or MG2) into the insulating film MZ can be controlled to be larger than the number of the electrons EL injected from the semiconductor substrate SB into the insulating film MZ by adjusting, e.g., the thickness of each of the insulating films MZ1 MZ2, MZ3, MZ4, and MZ5 included in the insulating film MZ and adjusting the value of the erase voltage.

Figure 34:
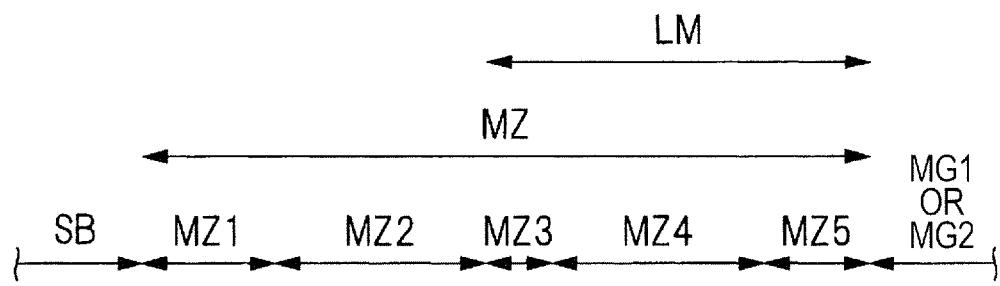
FIG. 34 is an illustrative view showing the energy band structure of the memory element in a written state.
Figure 34:
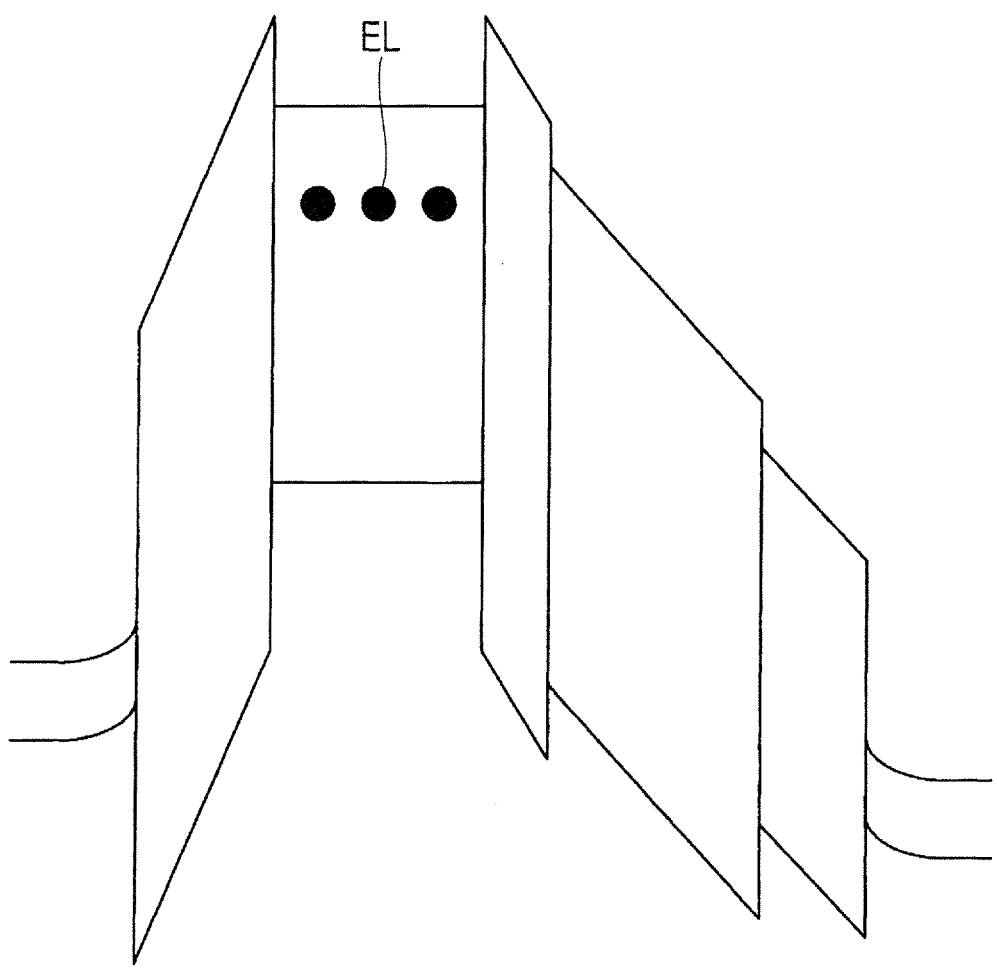

FIG. 34 is an illustrative view showing the energy band structure of each of the memory elements MC1 and MC2 in a written state (state where charges are retained after a write operation). Similarly to FIG. 32, FIG. 34 also shows the energy band structure at the position along the line A-A in FIG. 2 described above or the line B-B in FIG. 16 described above.

In the written state (state where charges are retained after the write operation), the electrons EL have been trapped by the trap level in the insulating film MZ2 serving as the charge storage layer in the insulating film MZ so that an energy band structure as shown in FIG. 34 is formed. To maintain the written state until an erase operation is performed, it is desirable to prevent the electrons EL trapped by the insulating film MZ2 from moving into the gate electrode (MG1 or MG2) or into the semiconductor substrate SB (p-type well PW1 or PW2). Accordingly, the band gap of each of the insulating films MZ1 and MZ3 is set larger than the band gap of the insulating film MZ2 to thus form an energy barrier between the insulating films MZ3 and MZ2 and form an energy barrier between the insulating films MZ1 and MZ2.

<About Studied Example>

Figure 35:
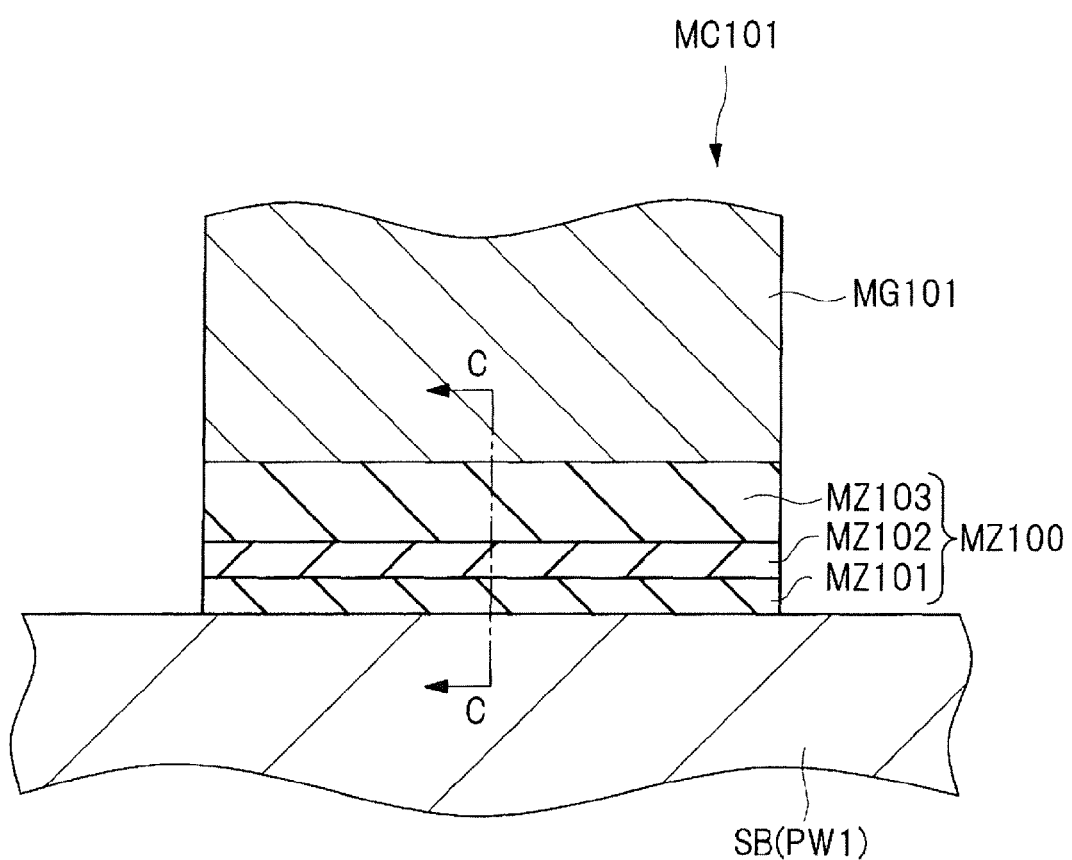
FIG. 35 is a partially enlarged cross-sectional view showing a memory element in a first studied example.
Figure 36:
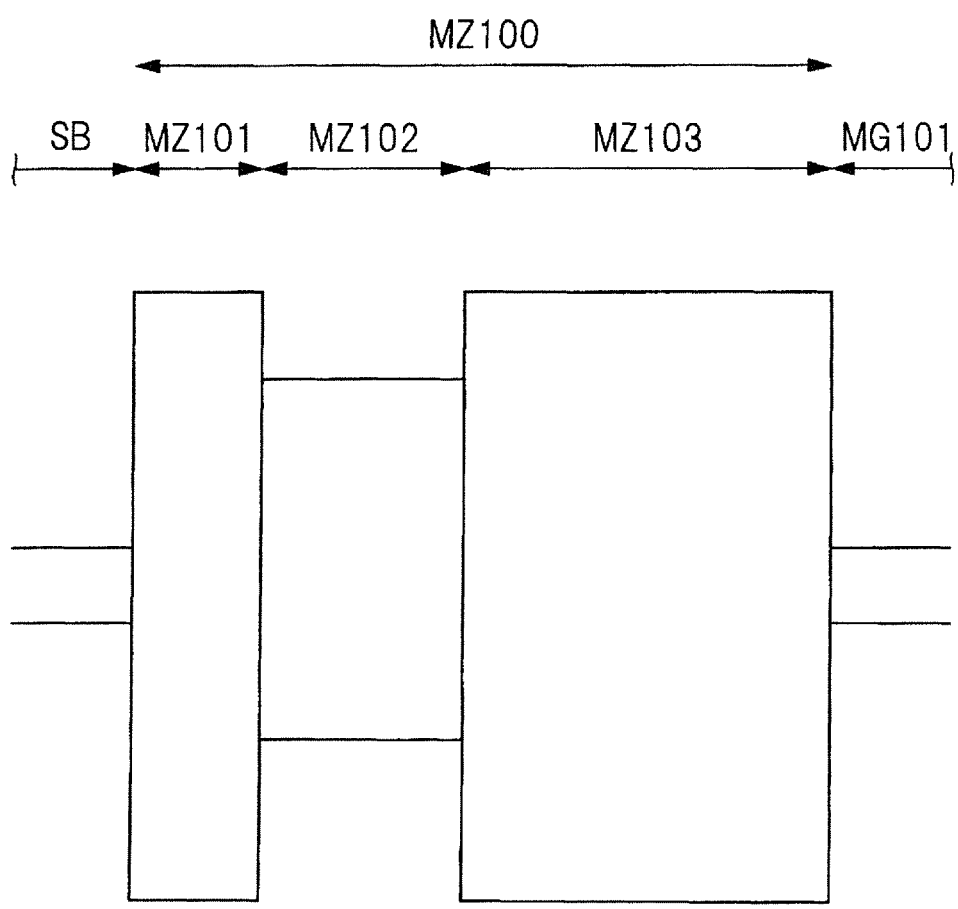
FIG. 36 is an illustrative view showing an energy band structure of the memory element in the first studied example.

FIG. 35 is a partially enlarged cross-sectional view showing a memory element MC101 in a first studied example studied by the present inventors. FIG. 35 shows a region corresponding to that shown in FIG. 2 described above. FIG. 36 is an energy band structure diagram at the position along the line C-C shown in FIG. 35, which corresponds to FIG. 32 described above.

As shown in FIG. 35 described above, in the memory element MC101 in the first studied example, over the semiconductor substrate SB, a gate electrode MG101 equivalent to the foregoing gate electrode MG1 is formed via an insulating film MZ100 equivalent to the foregoing insulating film MZ.

The memory element MC101 in the first studied example shown in FIG. 35 is different from the foregoing memory element MC1 in the present embodiment in the laminated structure of the gate insulating film (insulating film MZ or MZ100). That is, the laminated structure of the insulating film MZ100 serving as the gate insulating film for the memory element in the first studied example is different from the laminated structure of the insulating film MZ serving as the gate insulating film for the memory element in the present embodiment.

That is, in the first studied example shown in FIGS. 35 and 36, the insulating film MZ100 serving as the gate insulating film for the memory element is made of a laminated film including an insulating film MZ101, an insulating film MZ102 over the insulating film MZ101, and an insulating film MZ103 over the insulating film MZ102. The insulating film MZ102 is an insulating film (trapping insulating film) functioning as a charge storage layer. That is, in the first studied example, the insulating film MZ100 serving as the gate insulating film for the memory element has a three-layer structure in which the insulating film MZ102 functioning as the charge storage layer is interposed between the insulating films MZ101 and MZ103. The band gap of each of the insulating films MZ101 and MZ103 is larger than the band gap of the insulating film MZ102. This allows the insulating film MZ102 to function as the charge storage layer and allows each of the insulating films MZ103 and MZ101 between which the insulating film MZ102 is interposed to function as a charge block layer (or charge confinement layer). To provide such band gap relationships, a silicon dioxide film is used as the insulating film MZ101, a silicon nitride film is used as the insulating film MZ102, and a silicon dioxide film is used as the insulating film MZ103.

The present inventors have studied an approach of injecting charges (which are holes herein) from the gate electrode (MG1, MG2, or MG101) for the memory element into the charge storage layer (MZ2 or MZ102) in the gate insulating film (MZ or MZ100) during an erase operation to the memory element (MC1, MC2, or MC101) and thus bringing the memory element (MC1, MC2, or MC101) into the erased state. Here, each of the gate electrode MG1, memory gate element MG2, and gate electrode MG101 described above and a gate electrode MG201 described later corresponds to the gate electrode for the memory element.

That is, the present inventors have studied the approach of injecting charges (which are holes herein) from the gate electrode (MG1, MG2, or MG101) into the charge storage layer (MZ2 or MZ102) in the gate insulating film (MZ or MZ100) by FN tunneling and thus performing an erase operation to the memory element (MC1, MC2, or MC101). However, in the case of using this erase method, when an energy barrier in the gate-electrode-side charge block layer is high, it is hard to inject charges (which are holes herein) from the gate electrode (MG1, MG2, or MG101) into the charge storage layer through the gate-electrode-side charge block layer during the erase operation. This is because, when the energy barrier in the gate-electrode-side charge block layer is high, the probability of tunneling of the charges (which are holes herein) through the charge block layer decreases to reduce the number of charges (which are holes herein) which tunnel through the charge block layer. Here, the gate-electrode-side charge block layer is that one of the charge block layers between which the charge storage layer is interposed in the gate insulating film having the charge storing function which is located closer to the gate electrode. In the memory element MC101 in the first studied example shown in FIG. 35, the insulating film MZ103 corresponds to the gate-electrode-side charge block layer.

Therefore, in terms of injecting charges from the gate electrode into the charge storage layer during the erase operation, it is desirable that the energy barrier in the gate-electrode-side block layer is low. Accordingly, it is desirable that the band gap of the gate-electrode-side charge block layer is small.

However, in terms of improving the charge retaining property (retention property) of the memory element, it is desirable that the energy barrier in the gate-electrode-side charge block layer is high. Accordingly, it is desirable that the band gap of the gate-electrode-side charge block layer is large. This is because, when the energy barrier in the gate-electrode-side charge block layer is low, a phenomenon in which the charges retained in the charge storage layer move into the gate electrode is likely to occur, and consequently the charge retaining property (retention property) deteriorates.

Thus, in the memory element MC101 in the first studied example shown in FIG. 35, it is difficult to simultaneously improve the erase property of the memory element and the retention property thereof. That is, when the band gap of the insulating film MZ103 serving as the gate-electrode-side charge block layer is increased by the formation of the insulating film MZ103 of a silicon dioxide film or the like, the retention property of the memory element MC101 is improved. However, it is hard to inject charges (which are holes herein) from the gate electrode MG101 into the insulating film MZ102 serving as the charge storage layer and consequently the erase property deteriorates. On the other hand, when the band gap of the insulating film MZ103 serving as the gate-electrode-side charge block layer is reduced by forming the insulating film MZ103 of a silicon oxynitride film or the like, charges (which are holes herein) are easily injected from the gate electrode MG101 into the insulating film MZ102 serving as the charge storage layer, and consequently the erase property is improved, but the retention property of the memory element MC101 deteriorates. Accordingly, it is considered to use a memory element MC201 in a second studied example shown in FIGS. 37 and 38.

Figure 37:
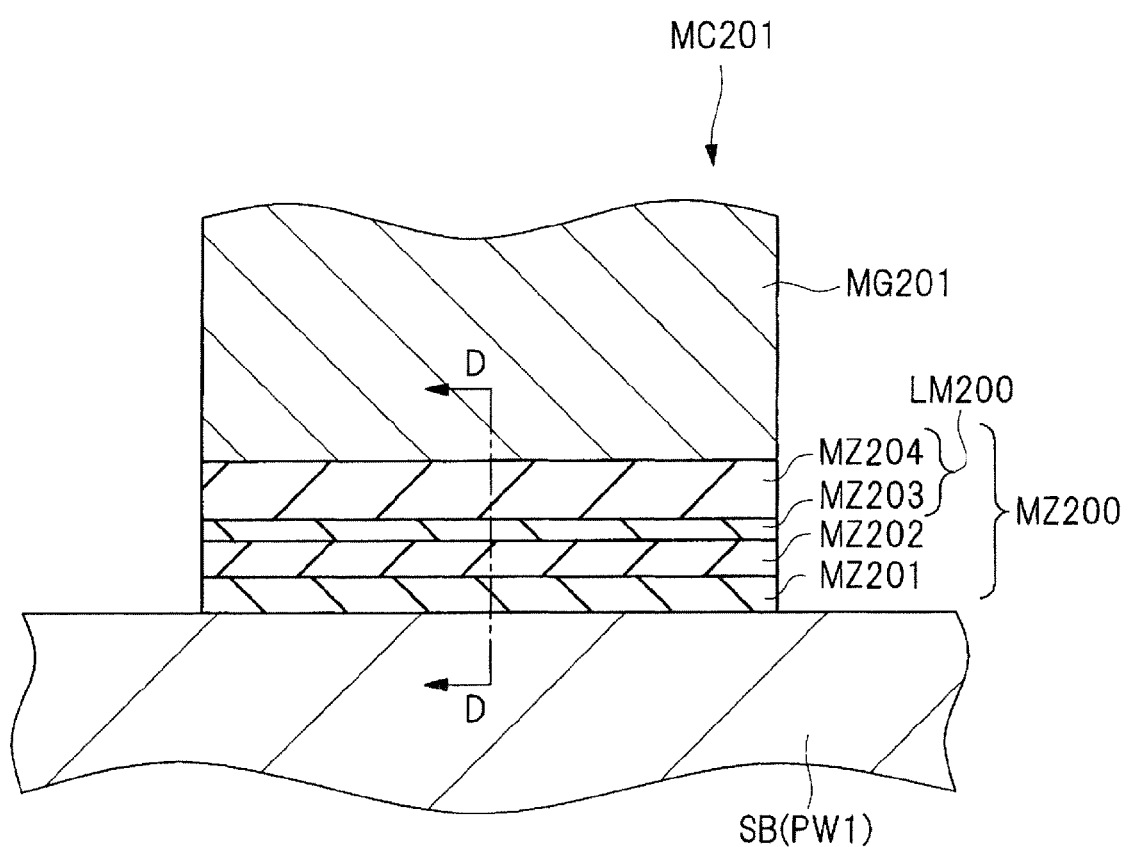
FIG. 37 is a partially enlarged cross-sectional view showing a memory element in a second studied example.
Figure 38:
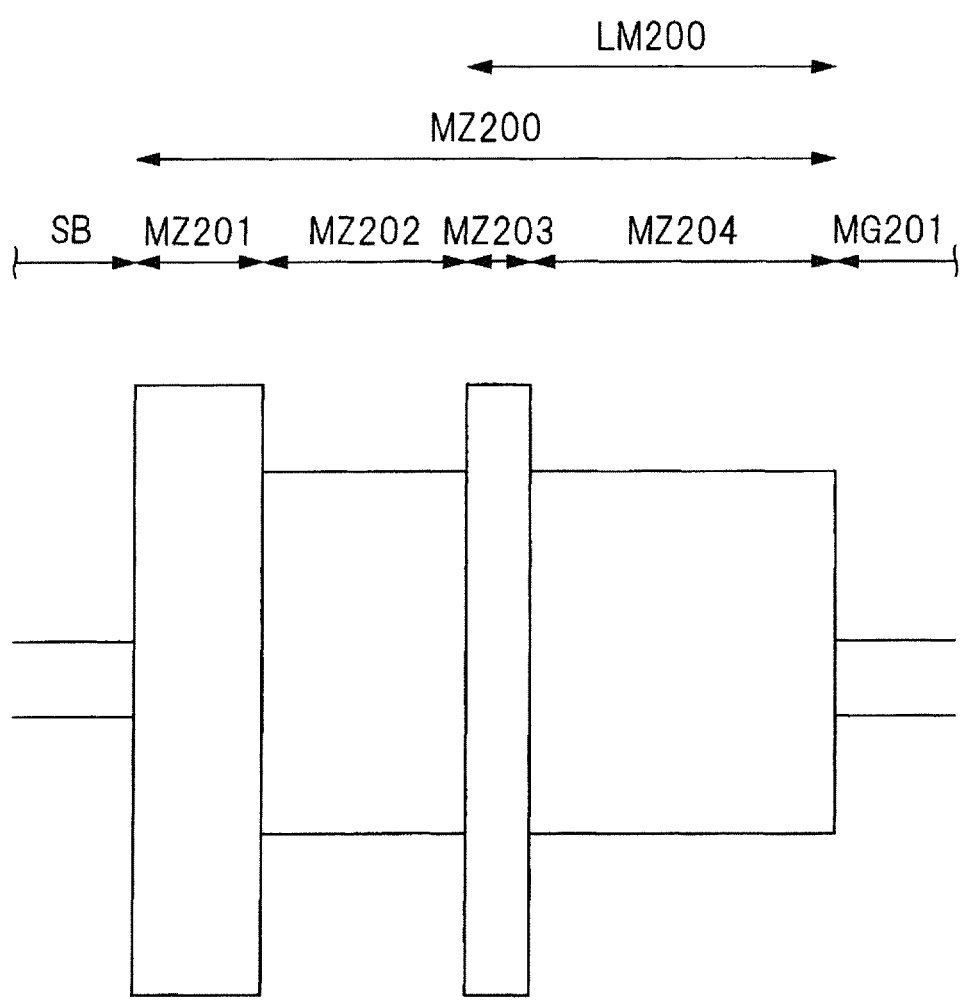
FIG. 38 is an illustrative view showing an energy band structure of the memory element in the second studied example.

FIG. 37 is a partially enlarged cross-sectional view showing the memory element MC201 in the second studied example studied by the present inventors. FIG. 37 shows the region corresponding to that shown in FIG. 2 described above. FIG. 38 is an energy band structure diagram at the position along the line D-D shown in FIG. 37, which corresponds to FIG. 32 described above.

As shown in FIG. 37, in the memory element MC201 in the second studied example, over the semiconductor substrate SB, a gate electrode MG201 equivalent to the foregoing gate electrode MG1 is formed via an insulating film MZ200 equivalent to the foregoing insulating film MZ.

The memory element MC201 in the second studied example shown in FIG. 37 is different from the foregoing memory element MC1 in the present embodiment in the laminated structure of the gate insulating film (insulating film MZ or MZ200). That is, the laminated structure of the insulating film MZ200 serving as the gate insulating film for the memory element in the second studied example is different from the laminated structure of the insulating film MZ serving as the gate insulating film for the memory element in the present embodiment.

That is, in the second studied example shown in FIGS. 37 and 38, the insulating film MZ200 serving as the gate insulating film for the memory element is made of a laminated film including an insulating film MZ201, an insulating film MZ202 over the insulating film MZ201, an insulating film MZ203 over the insulating film MZ202, and an insulating film MZ204 over the insulating film MZ203. The insulating film MZ202 is an insulating film (trapping insulating film) functioning as a charge storage layer. That is, in the second studied example, the insulating film MZ200 serving as the gate insulating film for the memory element has a four-layer structure in which the insulating film MZ202 functioning as the charge storage layer is interposed between the insulating film MZ201 and the insulating films MZ203 and MZ204. The band gap of each of the insulating films MZ201 and MZ203 is larger than the band gap of the insulating film MZ202. This allows the insulating film MZ202 to function as the charge storage layer and allows each of the insulating films MZ203 and MZ201 between which the insulating film MZ202 is interposed to function as a charge block layer (or charge confinement layer). The band gap of the insulating film MZ204 is smaller than the band gap of the insulating film MZ203. To provide such band gap relationships, a silicon dioxide film is used as the insulating film MZ201, a silicon nitride film is used as the insulating film MZ202, a silicon dioxide film is used as the insulating film MZ203, and a silicon nitride film is used as the insulating film MZ204.

In the second studied example shown in FIGS. 37 and 38, between the insulating film MZ202 functioning as the charge storage layer and the gate electrode MG201, a laminated film LM200 including the insulating films MZ203 and MZ204 is interposed, and the band gap of the insulating film MZ203 located closer to the charge storage layer (MZ202) is larger than the band gap of the insulating film MZ204 located closer to the gate electrode MG201. In other words, the band gap of the insulating film MZ204 located closer to the gate electrode MG201 is smaller than the band gap of the insulating film MZ203 located closer to the charge storage layer (MZ202).

Therefore, in the second studied example shown in FIGS. 37 and 38, the band gap of the insulating film MZ203 adjacent to the insulating film MZ202 functioning as the charge storage layer can be increased to allow an improvement in the retention property of the memory element. In addition, the band gap of the insulating film MZ204 adjacent to the gate electrode MG201 can be reduced to allow an improvement in the erase property thereof. That is, when a comparison is made between the first and second studied examples, as long as the sizes of the band gaps of the insulating films MZ103 and MZ203 are the same, the retention properties in the first and second studied examples are substantially equal. However, since the band gap of the insulating film MZ204 can be set smaller than the band gap of the insulating film MZ103, the erase property in the second studied example is superior to the erase property in the first studied example.

However, as a result of study, the present inventors have found that, in the second studied example shown in FIGS. 37 and 38, the reduced band gap of the insulating film MZ204 may possibly degrade the reliability of the semiconductor device.

In the second studied example shown in FIGS. 37 and 38, between the insulating film MZ202 functioning as the charge storage layer and the gate electrode MG201, the laminated film LM200 including the insulating films MZ203 and MZ204 is interposed. The laminated film LM200 needs to have a sufficient thickness for the following reason.

To perform an erase operation by injecting charges (which are holes herein) from the gate electrode MG201 into the charge storage layer (MZ202), it is necessary to apply an erase voltage between the gate electrode MG201 and the semiconductor substrate SB. The erase voltage may possibly cause not only the injection of charges (which are holes herein) from the gate electrode MG201 into the charge storage layer (MZ202), but also the injection of charges (which are electrons herein) from the semiconductor substrate SB into the charge storage layer (MZ202). Note that the polarity of each of the charges (which are holes herein) which may be injected from the gate electrode MG201 into the charge storage layer (MZ202) by the application of the erase voltage is opposite to the polarity of each of the charges (which are electrons herein) which may be injected from the semiconductor substrate SB into the charge storage layer (MZ202) by the application of the erase voltage. Accordingly, to properly perform the erase operation, during the erase operation, it is necessary to promote the injection of charges (which are holes herein) from the gate electrode MG201 into the charge storage layer (MZ202) during the erase operation, while suppressing the injection of charges (which are electrons herein) from the semiconductor substrate SB into the charge storage layer (MZ202). To promote the injection of charges (which are holes herein) from the gate electrode MG201 into the charge storage layer (MZ202) during the erase operation, it is required to increase the potential difference applied to the laminated film LM200 interposed between the charge storage layer (MZ202) and the gate electrode MG201 during the erase operation. On the other hand, to suppress the injection of charges (which are electrons herein) from the semiconductor substrate SB into the charge storage layer (MZ202) during the erase operation, it is required to reduce the potential difference applied to the insulating film MZ201 interposed between the gate electrode MG201 and the semiconductor substrate SB during the erase operation. Thus, during the erase operation, it is required to increase the potential difference applied to the laminated film LM200 to a degree and reduce the potential difference applied to the insulating film MZ201 to a degree. To satisfy the requirement, the laminated film LM200 needs to have a sufficient thickness.

That is, when a predetermined voltage is applied between the gate electrode MG201 and the semiconductor substrate SB during the erase operation, the potential difference applied to the insulating film MZ201 between the charge storage layer (MZ202) and the semiconductor substrate SB and the potential difference applied to the laminated film LM200 between the charge storage layer (MZ202) and the gate electrode MG201 have values depending on the respective thicknesses thereof. For example, the case is assumed where the erase voltage applied between the gate electrode MG201 and the semiconductor substrate SB during the erase operation is constant and the thickness of each of the insulating films MZ201 and MZ202 is also uniform, but the thickness of the laminated film LM200 is varied. In this case, when a comparison is made between the case where the laminated film LM200 is thin and the case where the laminated film LM200 is thick, the potential difference applied to the insulating film MZ201 is smaller and the potential difference applied to the laminated film LM200 is larger in the case where the laminated film LM200 is thick than in the case where the laminated film LM200 is thin. In other words, when a comparison is made between the case where the laminated film LM200 is thin and the case where the laminated film LM200 is thick, the potential difference applied to the insulating film MZ201 is larger and the potential difference applied to the laminated film LM200 is smaller in the case where the laminated film LM200 is thin than in the case where the laminated film LM200 is thick.

That is, a reduction in the thickness of the laminated film LM200 leads to an increase in the potential difference applied to the insulating film MZ201 during the erase operation and to a reduction in the potential difference applied to the laminated film LM200 during the erase operation. However, this disadvantageously affects the erase operation, as described above. Accordingly, the laminated film LM200 needs to have a sufficient thickness, which allows a reduction in the potential difference applied to the insulating film MZ201 during the erase operation and allows an increase in the potential difference applied to the laminated film LM200 during the erase operation. Thus, it is possible to promote the injection of charges (which are holes herein) from the gate electrode MG201 into the charge storage layer (MZ202) during the erase operation, while suppressing the injection of charges (which are electrons herein) from the semiconductor substrate SB into the charge storage layer (MZ202) during the erase operation.

However, in the second studied example shown in FIGS. 37 and 38, to increase the thickness of the laminated film LM200, it is necessary to increase the thickness of the insulating film MZ203 or the thickness of the insulating film MZ204. However, an increase in the thickness of the insulating film MZ203 adjacent to the charge storage layer (MZ202) and having a large band gap acts to reduce the probability of tunneling through the insulating film MZ203 having a large band gap during the erase operation. This may inhibit the injection of charges (which are holes herein) from the gate electrode MG201 into the charge storage layer (MZ202) and degrade the erase property. For example, a lower erase speed is incurred. However, an increase in the thickness of the insulating film MZ204 may incur the degradation of the reliability of the insulating film MZ200 as the gate insulating film.

That is, when charges (which are electrons herein) are injected from the semiconductor substrate SB into the insulating film MZ200 during the erase operation, some of the electrons are trapped by the charge storage layer (MZ202), while a considerable number of other electrons pass through the charge storage layer (MZ202) to move toward the gate electrode MG201. Each of the electrons that have been injected from the semiconductor substrate SB into the insulating film MZ200 during the erase operation and move therein gains an energy from the potential difference applied between the gate electrode MG201 and the semiconductor substrate SB. Accordingly, as the electron moves in the insulating film MZ200 and approaches the gate electrode MG201, the energy of the electron increases. When the energy of each of the electrons that have been injected from the semiconductor substrate SB into the insulating film MZ200 during the erase operation and move therein toward the gate electrode MG201 increases to be larger than the band gap of the insulating film in which the electron is present, a phenomenon occurs in which an electron-hole pair is formed in the insulating film and the resultant positive hole (hole) cuts a lattice (atomic bond) in the insulating film to cause the destruction or degradation of the insulating film. Accordingly, to allow the laminated film LM200 to have a sufficient thickness, the thickness of the insulating film MZ204 having a small band gap is increased. However, when the thickness of the insulating film MZ204 is increased, each of the electrons that have been injected from the semiconductor substrate SB into the insulating film MZ200 during the erase operation and moves therein toward the gate electrode MG201 is likely to form an electron-hole pair in the thick insulating film MZ204 to possibly cut a lattice in the insulating film MZ204 and degrade the reliability of the insulating film MZ200. An increase in the band gap of the insulating film MZ204 can reduce the possibility, but the increased band gap of the insulating film MZ204 leads to an increase in the energy barrier (valence-band energy barrier) formed between the gate electrode MG201 and the insulating film MZ204. The high energy barrier (valence-band energy barrier) formed between the gate electrode MG201 and the insulating film MZ204 acts to reduce the ease of the injection of charges (which are holes herein) from the gate electrode MG201 into the charge storage layer (MZ202) during the erase operation and consequently degrade the erase property.

<About Main Characteristic Features and Effects>

The semiconductor device in the present embodiment includes the semiconductor substrate SB, the insulating film MZ serving as the gate insulating film for the memory element (MC1 or MC2) formed over the semiconductor substrate SB, and the gate electrode (MG1 or MG2) for the memory element (MC1 or MC2) formed over the insulating film MZ. The insulating film MZ includes the insulating film MZ1 (first insulating film), the insulating film MZ2 (second insulating film) over the insulating film MZ1, the insulating film MZ3 (third insulating film) over the insulating film MZ2, the insulating film MZ4 (fourth insulating film) over the insulating film MZ3, and the insulating film MZ5 (fifth insulating film) over the insulating film MZ4. The insulating film MZ2 has the charge storing function. The band gap of each of the insulating films MZ1 and MZ3 is larger than the band gap of the insulating film MZ2. The band gap of the insulating film MZ4 is smaller than the band gap of the insulating film MZ3. The band gap of the insulating film MZ5 is smaller than the band gap of the insulating film MZ4. This is common to each of the memory element MC1 in FIGS. 1 and 2 described above and the memory element MC2 in FIG. 16 described above. That is, in the memory element MC1 in FIGS. 1 and 2 described above, over the semiconductor substrate SB, the gate electrode MG1 for the memory element MC1 is formed via the insulating film MZ serving as the gate insulating film for the memory element MC1. In the memory element MC2 shown in FIG. 16 described above, over the semiconductor substrate SB, the memory gate electrode MG2 for the memory element MC2 is formed via the insulating film MZ serving as the gate insulating film for the memory element MC2.

The semiconductor device in the present embodiment has the nonvolatile memory element. That is, the semiconductor device in the present embodiment has the memory element, and the gate insulating film (which is the insulating film MZ herein) of the memory element includes the insulating film (which is the insulating film MZ2 herein) having the charge storing function. By allowing the insulating film having the charge storing function to store or retain charges, information can be stored. By interposing the insulating film MZ2 having the charge storing function between the insulating films MZ1 and MZ3 each having the band gap larger than the band gap of the insulating film MZ2, the insulating film MZ2 is allowed to function as the charge storage layer and each of the insulating films MZ3 and MZ1 between which the insulating film MZ2 is interposed is allowed to function as the charge block layer (or charge confinement layer).

One of the main characteristic features of the present embodiment is that, between the insulating film MZ2 having the charge storing function and the gate electrode (MG1 or MG2), the laminated film LM including the insulating film MZ3, the insulating film MZ4 over the gate insulating film MZ3, and the insulating film MZ5 over the insulating film MZ4 is interposed, the band gap of the insulating film MZ4 is smaller than the band gap of the insulating film MZ3, and the band gap of the insulating film MZ5 is smaller than the band gap of the insulating film MZ4. That is, the insulating films MZ3, MZ4, and MZ5 are laminated in this order in a direction away from the insulating film MZ2 toward the gate electrode (MG1 or MG2), and the sizes of the band gaps thereof are progressively smaller in this order.

Accordingly, the band gap of the insulating film MZ3 is larger than the band gap of each of the insulating films MZ4 and MZ5, and the band gap of the insulating film MZ5 is smaller than the band gap of each of the insulating films MZ3 and MZ5. Therefore, by increasing the band gap of the insulating film MZ3 adjacent to the insulating film MZ2 functioning as the charge storage layer, it is possible to improve the charge retaining property (retention property) of the memory element (MC1 or MC2). In addition, by reducing the band gap of the insulating film MZ5 adjacent to the gate electrode (MG1 or MG2), it is possible to improve the erase property.

That is, between the insulating film MZ2 having the charge storing function and the gate electrode (MG1 or MG2), the laminated film LM including the insulating films MZ3, MZ4, and MZ5 is interposed. Since the greatest contributor to the charge retention property is the insulating film MZ3 adjacent to the insulating film MZ2 serving as the charge storage layer, the band gap of the insulating film MZ3 is set larger than the band gap of each of the insulating films MZ4 and MZ5 to improve the charge retention property. That is, to improve the charge retention property, it is particularly effective to increase the energy barrier formed at the interface between the insulating film MZ2 having the charge storing function and the laminated film LM. This can be achieved by increasing the band gap of the insulating film MZ3 adjacent to the insulating film MZ2. In addition, to allow easy injection of charges (which are holes herein) from the gate electrode (MG1 or MG2) into the insulating film MZ during the erase operation, it is most effective to reduce the band gap of the insulating film MZ5 adjacent to the gate electrode (MG1 or MG2). Therefore, the band gap of the insulating film MZ5 is set smaller than the band gap of each of the insulating films MZ3 and MZ4 to improve the erase property. That is, to allow easy injection of charges (holes) from the gate electrode (MG1 or MG2) into the insulating film MZ during the erase operation, it is particularly effective to reduce the energy barrier (valence-band energy barrier) formed at the interface between the gate electrode (MG1 or MG2) and the insulating film MZ. This can be achieved by reducing the band gap of the insulating film MZ5 adjacent to the gate electrode (MG1 or MG2). Thus, it is possible to simultaneously improve the charge retaining property (retention property) and the erase property.

That is, when the insulating film (MZ3, MZ102, or MZ203) interposed between the charge storage layer (MZ2, MZ102, or MZ202) and the gate electrode (MG1, MG2, MG101, or MG201) and adjacent to the charge storage layer has a small band gap, a phenomenon in which the charges retained in the charge storage layer moves toward the gate electrode is likely to occur, resulting in the degradation of the charge retaining property. On the other hand, when the insulating film (MZ5, MZ103, or MZ204) interposed between the charge storage layer (MZ2, MZ102, or MZ202) and the gate electrode (MG1, MG2, MG101, or MG201) and adjacent to the gate electrode has a large band gap, it is hard to inject charges (which are holes herein) from the gate electrode into the gate insulating film (MZ, MZ100, or MZ200) during the erase operation. Accordingly, in the present embodiment, the band gap of the insulating film MZ3 which is among the insulating films MZ3, MZ4, and MZ5 interposed between the insulating film MZ2 having the charge storing function and the gate electrode (MG1 or MG2) and adjacent to the insulating film MZ2 is set largest to improve the charge retaining property. On the other hand, the band gap of the insulating film MZ5 which is among the insulating films MZ3, MZ4, and MZ5 and adjacent to the gate electrode (MG1 or MG2) is set smallest to improve the erase property.

Also, in the present embodiment, between the insulating film MZ3 adjacent to the insulating film MZ2 having the charge storing function and the insulating film MZ5 adjacent to the gate electrode (MG1 or MG2), the insulating film MZ4 is interposed. In addition, the band gap of the insulating film MZ4 is set smaller than the band gap of the insulating film MZ3 and larger than the band gap of the insulating film MZ5. This can improve the reliability of the insulating film MZ serving as the gate insulating film for the following reason.

That is, between the insulating film MZ2 having the charge storing function and the gate electrode (MG1 or MG2), the laminated film LM including the insulating films MZ3, MZ4, and MZ5 is interposed. The laminated film LM needs to have a sufficient thickness. The reason for this is the same as the reason why the laminated film LM200 needs to have a sufficient thickness, which has been described above in the second studied example shown in FIGS. 37 and 38. That is, as has been described above in the second studied example shown FIGS. 37 and 38, a reduction in the thickness of the laminated film LM leads to an increase in the potential difference applied to the insulating film MZ1 during the erase operation and to a reduction in the potential difference applied to the laminated film LM. This acts to suppress the injection of charges (which are holes herein) from the gate electrode (MG1 or MG2) into the insulating film MZ during the erase operation and promote the injection of charges (which are electrons herein) from the semiconductor substrate SB into the insulating film MZ, disadvantageously for the erase operation. Note that the polarity of each of the charges (which are holes herein) which may be injected from the gate electrode (MG1 or MG2) into the insulating film MZ2 serving as the charge storage layer is opposite to the polarity of each of the charges (which are electrons herein) which may be injected from the semiconductor substrate SB into the insulating film MZ2 serving as the charge storage layer.

Accordingly, the laminated film LM needs to have a sufficient thickness. This can reduce the potential difference applied to the insulating film MZ1 and increase the potential difference applied to the laminated film LM during the erase operation.

However, an approach of increasing the thickness of the insulating film MZ3 adjacent to the charge storage layer (MZ2) and having a large band gap without providing the insulating film MZ4, unlike in the present embodiment, to thus allow the laminated film LM to have a sufficient thickness may inhibit the injection of charges (which are holes herein) from the gate electrode (MG1 or MG2) into the charge storage layer (MZ2) and degrade the erase property. On the other hand, an approach of increasing the thickness of the insulating film MZ5 adjacent to the gate electrode (MG1 or MG2) and having a small band gap without providing the insulating film MZ4, unlike in the present embodiment, to thus allow the laminated film LM to have a sufficient thickness may degrade the reliability of the insulating film MZ serving as the gate insulating film. Here, the case where the insulating film MZ4 is not provided, unlike in the present embodiment, corresponds to the second studied example shown in FIGS. 37 and 38 described above.

That is, the case where the thickness of the insulating film MZ3 adjacent to the charge storage layer (MZ2) and having a large band gap is increased without providing the insulating film MZ4, unlike in the present embodiment, to thus allow the laminated film LM to have a sufficient thickness corresponds to the case where the thickness of the insulating film MZ203 is increased to thus allow the laminated film LM200 to have a sufficient thickness in the second studied example shown in FIGS. 37 and 38 described above. In this case, as has been described also in the second studied example shown in FIGS. 37 and 38 described above, the probability of tunneling through the insulating film (MZ203 or MZ3) adjacent to the charge storage layer (MZ202 or MZ2) and having a large band gap decreases. This may possibly reduce the ease of injection of charges (which are holes herein) from the gate electrode (MG201, MG1, or MG2) into the charge storage layer (MZ202 or MZ2) and degrade the erase property. For example, a lower erase speed may be incurred.

On the other hand, the case where the thickness of the insulating film MZ5 adjacent to the gate electrode (MG1 or MG2) and having a small band gap is increased without providing the insulating film MZ4, unlike in the present embodiment, to thus allow the laminated film LM to have a sufficient thickness corresponds to the case where the thickness of the insulating film MZ204 is increased to thus allow the laminated film LM200 to have a sufficient thickness in the second studied example shown in FIGS. 37 and 38 described above. In this case, as has been described also in the second studied example shown in FIGS. 37 and 38 described above, each of the electrons that have been injected from the semiconductor substrate SB into the gate insulating film (MZ200 or MZ) during the erase operation and move therein toward the gate electrode (MG201, MG1, or MG2) has an energy larger than the band gap of the insulating film in which the electron is present. Consequently, an electron-hole pair is likely to be formed in the insulating film. The hole generated at this time may cut a lattice (atomic bond) in the insulating film and degrade the reliability of the gate insulating film (MZ200 or MZ).

By contrast, in the present embodiment, the insulating film MZ4 is interposed between the insulating films MZ3 and MZ5. The band gap of the insulating film MZ4 is smaller than the band gap of the insulating film MZ 3 and larger than the band gap of the insulating film MZ5. That is, between the insulating film MZ3 adjacent to the charge storage layer (MZ2) and having the large band gap and the insulating film MZ5 adjacent to the gate electrode (MG1 or MG2) and having the small band gap, the insulating film MZ4 having the band gap smaller than the band gap of the insulating film MZ3 and larger than the band gap of the insulating film MZ5 is placed.

Compared to the case where the insulating film MZ4 is not provided between the insulating films MZ3 and MZ5, in the case where the insulating film MZ4 is provided between the insulating films MZ3 and MZ5, the thickness of the laminated film LM interposed between the charge storage layer (MZ2) and the gate electrode (MG1 or MG2) can be increased by a dimension corresponding to the thickness of the insulating film MZ4. Thus, by providing the insulating film MZ4 between the insulating films MZ3 and MZ5, the thickness of the laminated film LM can accordingly be increased without increasing the thickness of each of the insulating films MZ3 and MZ5. Since the provision of the insulating film MZ4 accordingly allows an increase in the thickness of the laminated film LM, it is possible to reduce the potential difference applied to the insulating film MZ1 and increase the potential difference applied to the laminated film LM during the erase operation. Therefore, it is possible to promote the injection of charges (which are holes herein) from the gate electrode (MG1 or MG2) into the insulating film MZ2 (charge storage layer) during the erase operation, while suppressing the injection of charges (which are electrons herein) from the semiconductor substrate SB into the insulating film MZ2 (charge storage layer). As a result, it is possible to improve the erase property of the memory element (MC1 or MC2).

In the present embodiment, by providing the insulating film MZ4, the thickness of the laminated film LM can accordingly be increased. This allows a reduction in the thickness of each of the insulating films MZ3 and MZ5, while allowing the laminated film LM to have a sufficient thickness. Since the band gap of the insulating film MZ4 is set smaller than the band gap of the insulating film MZ3, it is possible to allow easy injection (which are holes herein) from the gate electrode (MG1 or MG2) into the insulating film MZ2 (charge storage layer) during the erase operation. As a result, it is possible to improve, e.g., the erase speed. In addition, since the band gap of the insulating film MZ4 is set larger than the band gap of the insulating film MZ5, each of the electrons that have been injected from the semiconductor substrate SB into the gate insulating film (insulating film MZ) and move therein toward the gate electrode (MG1 or MG2) during the erase operation is less likely to form an electron-hole pair. Therefore, it is possible to suppress or prevent a phenomenon in which, due to the formation of an electron-hole pair, a lattice (atomic bond) in the gate insulating film is cut.

That is, by providing the insulating film MZ4 between the insulating films MZ3 and MZ5 and setting the band gap of the insulating film MZ4 larger than the band gap of the insulating film MZ5, the formation of an electron-hole pair in the insulating film MZ is suppressed. In addition, by setting the band gap of the insulating film MZ4 smaller than the band gap of the insulating film MZ3, the probability of tunneling of charges (which are holes herein) from the gate electrode (MG1 or MG2) into the insulating film MZ2 during the erase operation is enhanced. This can increase the reliability of the gate insulating film and also improve the erase property. Therefore, it is possible to improve the reliability of the semiconductor device having the memory element (MC1 or MC2) using the insulating film MZ. Moreover, it is possible to improve the performance of the semiconductor device having the memory element (MC1 or MC2) using the insulating film MZ.

Thus, in the present embodiment, between the insulating film MZ2 having the charge storing function and the gate electrode (MG1 or MG2), the laminated film LM including the insulating films MZ3, MZ4, and MZ5 is interposed, the band gap of the insulating film MZ4 is set smaller than the band gap of the insulating film MZ3, and the band gap of the insulating film MZ5 is set smaller than the band gap of the insulating film MZ4. By placing the insulating film MZ3 having the large band gap at a position adjacent to the insulating film MZ2 having the charge storing function, the charge retaining property (retention property) can be improved. In addition, by placing the insulating film MZ5 having the small band gap at a position adjacent to the gate electrode (MG1 or MG2), charges (which are holes herein) are easily injected from the gate electrode (MG1 or MG2) into the insulating film MZ during the erase operation to allow an improvement in the erase property. Moreover, by setting the band gap of the insulating film MZ4 in the middle layer of the laminated film LM smaller than the band gap of the insulating film MZ3 and larger than the band gap of the insulating film MZ5, it is possible to suppress or prevent the formation of an electron-hole pair in the insulating film MZ and prevent the degradation of the insulating film MZ, while preventing a reduction in the probability of tunneling of charges injected from the gate electrode (MG1 or MG2) into the insulating film MZ2 during the erase operation. Thus, it is possible to improve the performance of the semiconductor device having the memory element (MC1 or MC2) using the insulating film MZ. It is also possible to improve the reliability of the semiconductor device having the memory element (MC1 or MC2) using the insulating film MZ.

Thus, in the present embodiment, the band structure of the laminated structure of the insulating film MZ functioning as the gate insulating film of the memory element (MC1 or MC2) is inventively modified to thus improve the performance and reliability of the semiconductor device having the memory element (MC1 or MC2).

Also, in the present embodiment, to provide the band gap relationships described above, the following materials are used for the insulating films MZ1, MZ2, MZ3, MZ4, and MZ5.

That is, the insulating film MZ1 is made of a silicon dioxide film or a silicon oxynitride film. The insulating film MZ2 is made of a silicon nitride film. Each of the insulating films MZ3, MZ4, and MZ5 is made of a film containing at least one of oxygen (O) and nitrogen (N), and silicon (Si) as constituent elements. The nitrogen (N) concentration of the insulating film MZ4 is higher than the nitrogen (N) concentration of the insulating film MZ3. The nitrogen (N) concentration of the insulating film MZ5 is higher than the nitrogen (N) concentration of the insulating film MZ4.

Here, the band gap of a silicon nitride film is smaller than the band gap of a silicon oxynitride film. The band gap of a silicon oxynitride film is smaller than the band gap of a silicon dioxide film. The band gap of a silicon oxynitride film is smaller as the nitrogen (N) concentration of the silicon oxynitride film is higher. Therefore, the band gap of a silicon oxynitride film having a high nitrogen concentration is smaller than the band gap of a silicon oxynitride film having a low nitrogen concentration. Note that, when the nitrogen (N) concentration of a certain film is mentioned, an atomic percentage representation of the nitrogen (N) concentration (content) in the film corresponds to the nitrogen (N) concentration of the film. For example, a silicon oxynitride film having a 30 at % nitrogen (N) concentration has a higher (larger) nitrogen (N) concentration than a silicon oxynitride film having a 20 at % nitrogen (N) concentration.

Also, the nitrogen concentration of the insulating film MZ4 is higher than the nitrogen concentration of the insulating film MZ3, and the nitrogen concentration of the insulating film MZ5 is higher than the nitrogen concentration of the insulating film MZ4. In other words, the composition ratio of nitrogen (N) in the insulating film MZ4 is higher than the composition ratio of nitrogen (N) in the insulating film MZ3, and the composition ratio of nitrogen (N) in the insulating film MZ5 is higher than the composition ratio of nitrogen (N) in the insulating film MZ4. In still other words, the nitrogen (N) content of the insulating film MZ4 is higher than the nitrogen (N) content of the insulating film MZ3, and the nitrogen (N) content of the insulating film MZ5 is higher than the nitrogen (N) content of the insulating film MZ4.

In the present embodiment, each of the insulating films MZ3, MZ4, and MZ5 is formed as a film containing at least one of oxygen (O) and nitrogen (N), and silicon (Si) as constituent elements, while the nitrogen (N) concentration of the insulating film MZ4 is set higher than the nitrogen (N) concentration of the insulating film MZ3 and the nitrogen (N) concentration of the insulating film MZ5 is set higher than the nitrogen (N) concentration of the insulating film MZ4. This allows the band gap of the insulating film MZ4 to be set smaller than the band gap of the insulating film MZ3 and allows the band gap of the insulating film MZ5 to be set smaller than the band gap of the insulating film MZ4. In addition, by forming the insulating film MZ1 of a silicon dioxide film or a silicon oxynitride film, forming the insulating film MZ2 of a silicon nitride film, and forming the insulating film MZ3 as a film containing at least one of oxygen (O) and nitrogen (N), and silicon (Si) as constituent elements, the band gap of each of the insulating films MZ1 and MZ3 can be set larger than the band gap of the insulating film MZ2. By providing such band gap relationships, effects as described above can be obtained.

Also, in the present embodiments, each of the insulating films MZ3, MZ4, and MZ5 is formed as a film containing at least one of oxygen (O) and nitrogen (N), and silicon (Si) as constituent elements, the nitrogen (N) concentration of the insulating film MZ4 is set higher than the nitrogen (N) concentration of the insulating film MZ3, and the nitrogen (N) concentration of the insulating film MZ5 is set higher than the nitrogen (N) concentration of the insulating film MZ4. Each of a silicon dioxide film, a silicon oxynitride film, and a silicon nitride film corresponds to a "film containing at least one of oxygen (O) and nitrogen (N), and silicon (Si) as constituent elements". This allows the case where each of the insulating films MZ3 and MZ4 is formed of a silicon oxynitride film and the nitrogen (N) concentration of the insulating film MZ4 is set higher than the nitrogen (N) concentration of the insulating film MZ3. Thus, the band gap of the insulating film MZ4 can be set smaller than the band gap of the insulating film MZ3. This also allows the case where each of the insulating films MZ4 and MZ5 is formed of a silicon oxynitride film and the nitrogen (N) concentration of the insulating film MZ5 is set higher than the nitrogen (N) concentration of the insulating film MZ4. Thus, the band gap of the insulating film MZ5 can be set smaller than the band gap of the insulating film MZ4.

However, in terms of maximally improving the charge retaining property, it is desirable to maximize the band gap of the insulating film MZ3 adjacent to the insulating film MZ2 having the charge storing function. In terms of allowing easy injection of charges from the gate electrode (MG1 or MG2) into the insulating film MZ during the erase operation, it is desirable to minimize the band gap of the insulating film MZ5 adjacent to the gate electrode. Accordingly, it is more preferable that the insulating film MZ3 is made of a silicon dioxide film, the insulating film MZ4 is made of a silicon oxynitride film, and the insulating film MZ5 is made of a silicon nitride film. This is because the insulating film MZ3 can have a larger band gap when made of a silicon dioxide film than when made of a silicon oxynitride film and the insulating film MZ5 can have a smaller band gap when made of a silicon nitride film than when made of a silicon oxynitride film.

Figure 39:
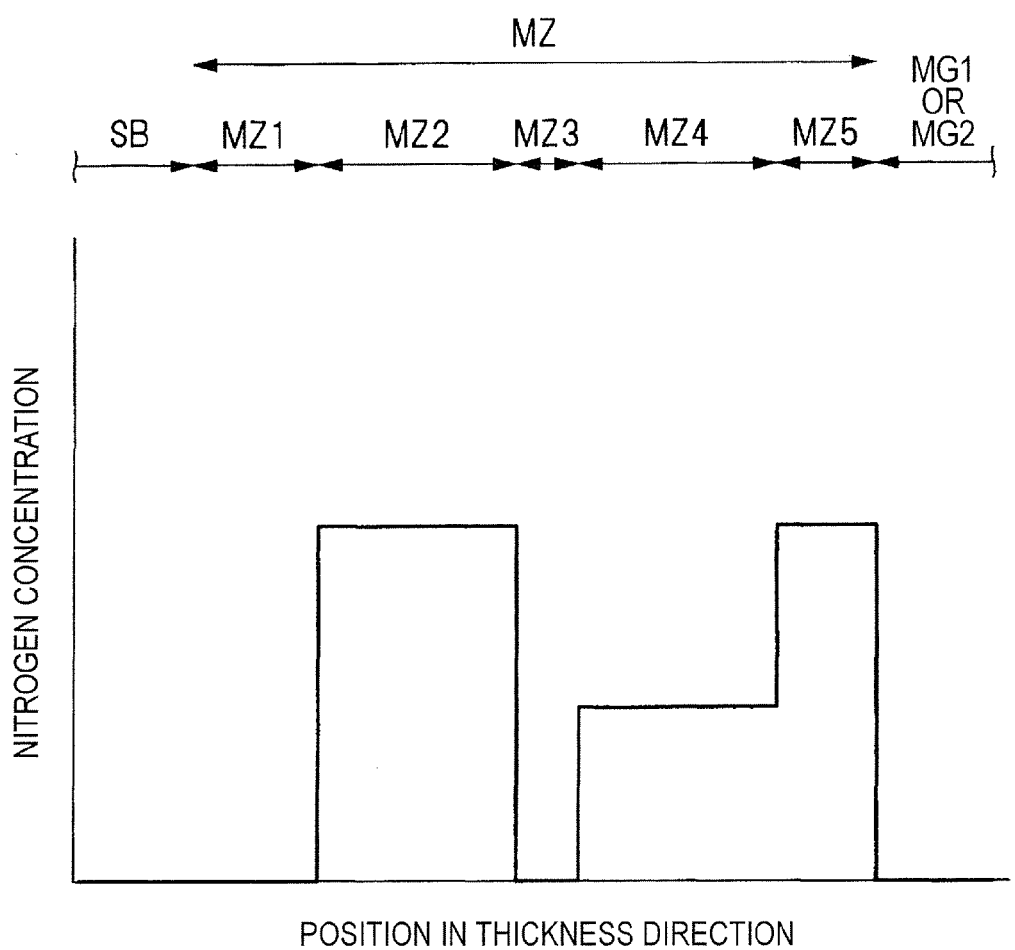
FIG. 39 is a graph showing a nitrogen concentration in an insulating film for the gate insulating film of the memory element.

FIG. 39 shows a graph showing an example of a nitrogen (N) concentration distribution in each of the insulating films MZ1, MZ2, MZ3, MZ4, and MZ5 included in the insulating film MZ. The abscissa axis of the graph of FIG. 39 corresponds to a position in the thickness direction of the insulating film MZ. The ordinate axis of FIG. 39 corresponds to a nitrogen (N) concentration. The graph of FIG. 39 corresponds to the case where the insulating film MZ1 is formed of a silicon dioxide film, the insulating film MZ2 is formed of a silicon nitride film, the insulating film MZ3 is formed of a silicon dioxide film, the insulating film MZ4 is formed of a silicon oxynitride film, and the insulating film MZ5 is formed of a silicon nitride film.

When the insulating film MZ1 is formed of a silicon oxynitride film, in the graph of FIG. 39, the nitrogen concentration of the insulating film MZ1 is higher than zero and lower than the nitrogen concentration of the insulating film MZ2. When the insulating film MZ3 is formed of a silicon oxynitride film, in the graph of FIG. 39, the nitrogen concentration of the insulating film MZ3 is higher than zero and lower than the nitrogen concentration of the insulating film MZ4. When the insulating film MZ5 is formed of a silicon oxynitride film, in the graph of FIG. 39, the nitrogen concentration of the insulating film MZ5 is higher than the nitrogen concentration of the insulating film MZ4 and lower than the nitrogen concentration of the insulating film MZ2. In either case, in the graph of FIG. 39, ordering relationships such that the nitrogen concentration of the insulating film MZ2 is higher than the nitrogen concentration of each of the insulating films MZ1 and MZ3, the nitrogen concentration of the insulating film MZ4 is higher than the nitrogen concentration of the insulating film MZ3, and the nitrogen concentration of the insulating film MZ5 is higher than the nitrogen concentration of the insulating film MZ4 are maintained. Examples of a preferred nitrogen concentration of the insulating film MZ5 include a value of not less than 40 at % (about 40 to 57 at %). On the other hand, examples of a preferred nitrogen concentration of the insulating film MZ4 include a value of about 10 to 30 at %.

In the case where each of the insulating films MZ2 and MZ5 is formed of a silicon nitride film as in the graph of FIG. 39, when the composition of the silicon nitride film is $Si_3N_4$, the nitrogen concentration of the silicon nitride film is about 57 at %. However, there may also be a case where the composition ratio of the silicon nitride film deviates from stoichiometric $Si_3N_4$. In that case, the nitrogen concentration of the silicon nitride film has a value deviated from about 57 at %. There may also be a case where the composition ratio of the silicon nitride film forming the insulating film MZ2 is different from the composition ratio of the silicon nitride film forming the insulating film MZ5.

To allow easy injection of charges from the gate electrode (MG1 or MG2) into the insulating film MZ during the erase operation, it is desirable to minimize the band gap of the insulating film MZ5 adjacent to the gate electrode. Accordingly, the band gap of the insulating film MZ5 is more preferably the same as or smaller than the insulating film MZ2 having the charge storing function. This allows easier injection of charges from the gate electrode (MG1 or MG2) into the insulating film MZ during the erase operation. In the case where the insulating film MZ5 is formed of the same type of material as that of the insulating film MZ2, e.g., a silicon nitride film, when the insulating film MZ5 is formed also of a silicon nitride film, the band gap of the insulating film MZ5 can be set equal to or smaller than the band gap of the insulating film MZ2 having the charge storing function.

Note that, in the case where each of the insulating films MZ2 and MZ5 is formed of a silicon nitride film, by setting the composition ratio of silicon (Si) in the silicon nitride film forming the insulating film MZ5 higher than the composition ratio of silicon (Si) in the silicon nitride film forming the insulating film MZ2, the band gap of the insulating film MZ5 can be set smaller than the band gap of the insulating film MZ2 having the charge storing function. This allows the band gap of the insulating film MZ5 to be further reduced. Therefore, it is possible to allow easier injection of charges from the gate electrode (MG1 or MG2) into the insulating film MZ during the erase operation.

Here, the statement that "the composition ratio of silicon in the silicon nitride film forming the insulating film MZ5 is set higher than the composition ratio of silicon in the silicon nitride film forming the insulating film MZ2" can be made differently as follows. That is, the concentration (represented as atomic percentage) of silicon (Si) in the silicon nitride film forming the insulating film MZ5 is set higher than the concentration (represented as atomic percentage) of silicon (Si) in the silicon nitride film forming the insulating film MZ2. In still other words, an "x/(x+y)" value when the composition of the silicon nitride film forming the insulating film MZ5 is represented as $Si_xN_y$ is set larger than an "x/(x+y)" value when the composition of the silicon nitride film forming the insulating film MZ2 is represented as $Si_xN_y$.

In the second studied example shown in FIGS. 37 and 38 described above, the case where a silicon nitride film is used as the insulating film MZ204 adjacent to the gate electrode MG201 is assumed. In this case, the use of the silicon nitride film as the insulating film MZ204 is effective in terms of reducing the band gap of the insulating film MZ204, but the silicon nitride film has a trap level. Accordingly, when the thickness of the insulating film MZ204 made of the silicon nitride film is increased, the charges (which are holes herein) injected from the gate electrode MG201 into the insulating film MZ200 during the erase operation are likely to be trapped by the insulating film MZ204 before reaching the insulating film MZ202 intended to function as a charge storage layer. This may reduce the ease with which the erase operation is performed. That is, in the case of using the silicon nitride film as the insulating film MZ204, an increase in the thickness of the insulating film MZ204 made of the silicon nitride film causes the problems of not only the degradation of the reliability of the gate insulating film (insulating film MZ200) resulting from the formation of an electron-hole pair as described above, but also the degradation of the erase property resulting from the trapping of the charges from the gate electrode MG201 by the insulating film MZ204 made of the silicon nitride film. However, since the laminated film LM200 needs to have a sufficient thickness as described above, when the thickness of the insulating film MZ203 is increased instead of reducing the thickness of the insulating film MZ204 made of a silicon nitride film, the increased thickness of the insulating film MZ203 acts to reduce the probability of tunneling through the insulating film MZ203 having a large band gap during the erase operation. This may degrade the erase property.

By contrast, in the present embodiment, as described above, between the insulating films MZ3 and MZ5, the insulating film MZ4 is interposed. Since the insulating film MZ4 is provided, the thickness of the insulating film MZ5 can accordingly be reduced. As a result, even when the silicon nitride film is used as the insulating film MZ5, the thickness of the insulating film MZ5 made of the silicon nitride film can be reduced. This can suppress or prevent a phenomenon in which the charges (which are holes herein) injected from the gate electrode (MG1 or MG2) into the insulating film MZ are trapped by the insulating film MZ5 before reaching the insulating film MZ2 having the charge storing function. Since the insulating film MZ4 has a nitrogen (N) concentration lower than that of the insulating film MZ5, a trap level is less likely to be formed therein than in the insulating film MZ5. As a result, even when a silicon nitride film in which a trap level is likely to be formed is used as the insulating film MZ5 adjacent to the gate electrode (MG1 or MG2), the insulating film MZ4 which is provided without increasing the thickness of the insulating film MZ5 suppresses or prevents the trapping of charges by the insulating films MZ5 and MZ4 to allow the erase operation to be properly performed.

Thus, when the same type of material as that of the insulating film MZ2 having the charge storing function is used as the material of the insulating film MZ5, the provision of the insulating film MZ4 between the insulating films MZ3 and MZ5 achieves not only the effect of suppressing or preventing the formation of an electron-hole pair as described above and improving the reliability of the gate insulating film (insulating film MZ), but also the effect of suppressing or preventing the phenomenon of trapping of the charges by the insulating film MZ5.

In addition, the present embodiment achieves a significant effect when applied to the case where charges are injected from the gate electrode (MG1 or MG2) into the insulating film MZ2 of the insulating film MZ to perform an erase operation to the memory element (MC1 or MC2), as described above. This is because, in the present embodiment, by inventively modifying the laminated structure of the insulating film MZ for the gate insulating film, problems which may arise in the case where charges are injected from the gate electrode (MG1 or MG2) into the trapping insulating film (which is the insulating film MZ2 herein) in the gate insulating film to perform an erase operation are solved to allow an improvement in the performance of the semiconductor device.

Also, in the present embodiment, the thickness of the laminated film LM is more preferably larger than the thickness of the insulating film MZ1. That is, the total sum of the respective thicknesses of the insulating films MZ3, MZ4, and MZ5 is more preferably larger than the thickness of the insulating film MZ1. Note that when the thickness of the insulating film MZ1, MZ2, MZ3, MZ4, or MZ5 or the thickness of the laminated film LM is mentioned, the thickness indicates the thickness of the film between the semiconductor substrate SB and the gate electrode (MG1 or MG2).

As described above, during the erase operation, it is desirable to reduce the potential difference applied to the insulating film MZ1 and thus suppress the injection of charges (which are electrons herein) from the semiconductor substrate SB into the insulating film MZ. It is also desirable to increase the potential difference applied to the laminated film LM and thus promote the injection of charges (which are holes herein) from the gate electrode (MG1 or MG2) into the insulating film MZ. From this viewpoint, the thickness of the laminated film LM is more preferably larger than the thickness of the insulating film MZ1. As a result, when an erase voltage is applied between the semiconductor substrate SB and the gate electrode (MG1 or MG2), it is possible to more reliably suppress the injection of charges (which are electrons herein) from the semiconductor substrate SB into the insulating film MZ. Therefore, the erase operation can more reliably be performed.

Among the respective thicknesses of the insulating films MZ3, MZ4, and MZ5, the thickness of the insulating film MZ3 most significantly affects the probability of tunneling of charges (which are holes herein) into the insulating film MZ2 having the charge storing function. Accordingly, an increase in the thickness of the insulating film MZ3 among the respective thicknesses of the insulating films MZ3, MZ4, and MZ5 leads to the degradation of the erase property. Therefore, in terms of allowing the nonvolatile memory to satisfactorily perform the intrinsic function thereof, it is desirable to avoid an increase in the thickness of the insulating film MZ3 as practically as possible.

As a result, in the present embodiment, it is more preferable to set the thickness of the insulating film MZ3 smallest among the respective thicknesses of the insulating films MZ3, MZ4, and MZ5. That is, it is more preferable that the thickness of the insulating film MZ3 is smaller than the thickness of the insulating film MZ4 and smaller than the thickness of the insulating film MZ5. This can reduce the thickness of the insulating film MZ3 and thus enhance the probability of tunneling of charges (which are holes herein)

into the insulating film MZ2 having the charge storing function during the erase operation, while allowing a proper improvement in erase property. Therefore, it is possible to allow the nonvolatile memory to more properly perform the intrinsic function thereof.

Also, as described above, increasing the thickness of the insulating film MZ5 having the smallest band gap among the respective band gaps of the insulating films MZ3, MZ4, and MZ5 may increase the possibility of the degradation of the insulating film MZ resulting from the formation of the foregoing electron-hole pair and cause the degradation of the reliability of the insulating film MZ serving as the gate insulating film. Accordingly, it is desirable to reduce not only the thickness of the insulating film MZ3, but also the thickness of the insulating film MZ5. On the other hand, the insulating film MZ4 is neither adjacent to the insulating film MZ2 having the charge storing function nor adjacent to the gate electrode (MG1 or MG2) and has the band gap smaller than the band gap of the insulating film MZ3 and larger than the band gap of the insulating film MZ5. Consequently, increasing the thickness of the insulating film MZ4 is less likely to cause a disadvantage than increasing the thickness of the insulating film MZ3 or increasing the thickness of the insulating film MZ5. Therefore, it is desirable to increase the thickness of the laminated film LM using the insulating film MZ4.

Accordingly, in the present embodiment, it is more preferable to set the thickness of the insulating film MZ4 largest among the respective thicknesses of the insulating films MZ3, MZ4, and MZ5. That is, it is more preferable that the thickness of the insulating film MZ4 is larger than the thickness of the insulating film MZ3 and larger than the thickness of the insulating film MZ5. This allows the laminated film LM to have a sufficient thickness, while reducing the respective thicknesses of the insulating films MZ3 and MZ5.

Also, as described above, to enhance the probability of tunneling of the charges into the insulating film MZ2 during the erase operation, it is desirable to reduce the thickness of the insulating film MZ3. From this viewpoint, the thickness of the insulating film MZ3 is more preferably not more than 2 nm. When the thickness of the insulating film MZ3 is 1 nm, the insulating film MZ3 is likely to be properly formed. Therefore, the thickness of the insulating film MZ3 is most preferably in a range of not less than 1 nm and not more than 2 nm, i.e., 1 to 2 nm.

Also, as described above, to improve the reliability of the insulating film MZ, it is desirable to reduce the thickness of the insulating film MZ5. From this viewpoint, the thickness of the insulating film MZ5 is more preferably not more than 3 nm. When the thickness of the insulating film MZ5 is not less than 2 nm, the band gap is likely to be formed successfully. Therefore, the thickness of the insulating film MZ5 is most preferably in a range of not less than 2 nm and not more than 3 nm, e.g., 2 to 3 nm.

The thickness of the insulating film MZ4 can be set to various values so as to allow the laminated film LM interposed between the insulating film MZ2 serving as a trapping insulating film and the gate electrode (MG1 or MG2) to have an appropriate thickness. For example, the thickness of the insulating film MZ4 can be set to about 4 to 6 nm.

Embodiment 2

Embodiment 2 is basically the same as Embodiment 1 described above except that the insulating film MZ4 in the insulating film MZ has a different configuration. Accordingly, the configuration of each of memory elements in Embodiment 2 is the same as that of the memory element MC1 or MC2 in Embodiment 1 described above, except for the insulating film MZ4. Therefore, a difference from Embodiment 1 described above will be mainly described herein.

Figure 40:
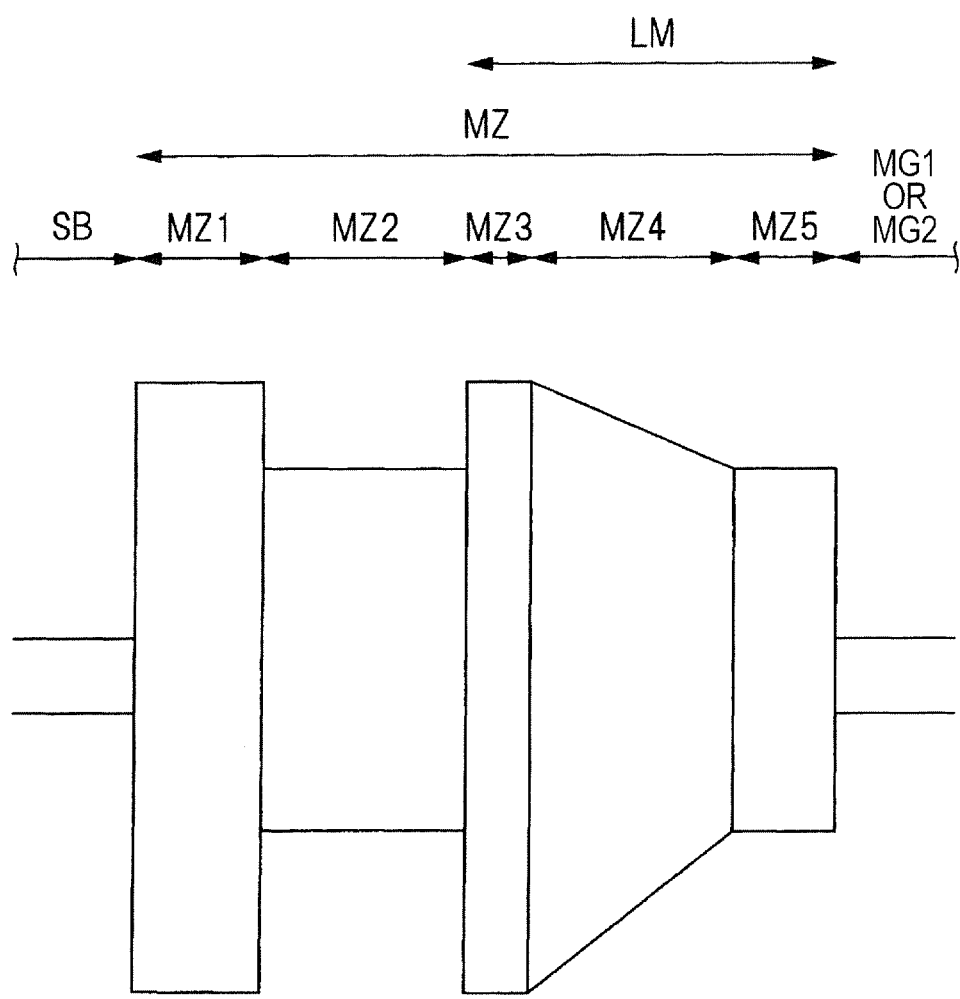
FIG. 40 is an illustrative view showing an energy band structure of a memory element in a semiconductor device in another embodiment.

FIG. 40 is an illustrative view showing the energy band structure of each of the memory elements in Embodiment 2 and corresponds to FIG. 32 described above in Embodiment 1 described above. Similarly to FIG. 32 described above, FIG. 40 shows the energy band structure at the position along the line A-A in FIG. 2 described above and the energy band structure at the position along the line B-B in FIG. 16 described above.

In Embodiment 1 described above, as shown in FIG. 32 described above, the band gap of the insulating film MZ4 is substantially constant. That is, the band gap of the insulating film MZ4 is substantially constant irrespective of a position in the thickness direction of the insulating film MZ4. The band gap of the insulating film MZ4 is smaller than the band gap of the insulating film MZ3 and larger than the band gap of the insulating film MZ5.

By contrast, in Embodiment 2, as can also be seen from FIG. 40, the band gap of the insulating film MZ4 continuously decreases in a direction away from the insulating film MZ3 toward the insulating film MZ5. That is, when the band gap of the insulating film MZ4 is viewed in the thickness direction, the band gap of the insulating film MZ4 continuously (gradually or gently) decreases in the direction away from the insulating film MZ3 toward the insulating film MZ5. In other words, in Embodiment 2, the band gap of the insulating film MZ4 continuously increases in the direction away from the insulating film MZ5 toward the insulating film MZ3.

That is, in Embodiment 2, when the band gap of the insulating film MZ4 is viewed in the thickness direction, the band gap of the insulating film MZ4 is the largest in the vicinity of the interface between the insulating films MZ3 and MZ4. With distance from the interface between the insulating films MZ3 and MZ4 toward the interface between the insulating films MZ4 and MZ5, the band gap of the insulating film MZ4 continuously decreases. In the vicinity of the interface between the insulating films MZ4 and MZ5, the band gap of the insulating film MZ4 is the smallest.

Note that the band gap of each of the insulating films MZ3 and MZ5 is substantially constant, which is common to each of Embodiment 2 and Embodiment 1 described above. Also, the band gap of each of the insulating films MZ1 and MZ2 is substantially constant, which is common to each of Embodiment 2 and Embodiment 1 described above.

The band gap of the insulating film MZ4 is smaller than the band gap of the insulating film MZ3 and larger than the band gap of the insulating film MZ5, which is also common to each of Embodiment 2 and Embodiment 1 described above. In Embodiment 2, the band gap of the insulating film MZ4 has substantially the same size as that of the band gap of the insulating film MZ3 in the vicinity of the interface between the insulating films MZ3 and MZ4, but continuously decreases with distance therefrom toward the insulating film MZ5. Therefore, it can be said that the band gap of the insulating film MZ4 is smaller than the band gap of the insulating film MZ3. Also, in Embodiment 2, the band gap of the insulating film MZ4 has a size approximately equal to that of the band gap of the insulating film MZ5 in the vicinity of the interface between the insulating films MZ4 and MZ5, but continuously increases with distance therefrom toward the insulating film MZ3. Therefore, it can be said that the band gap of the insulating film MZ4 is larger than the band gap of the insulating film MZ5. Hence, it can be said that, in Embodiment 2 also, the band gap of the insulating film MZ4 is smaller than the band gap of the insulating film MZ3 and larger than the band gap of the insulating film MZ5.

Such a band gap of the insulating film MZ4 can be achieved by controlling a nitrogen concentration distribution in the insulating film MZ4.

Figure 41:
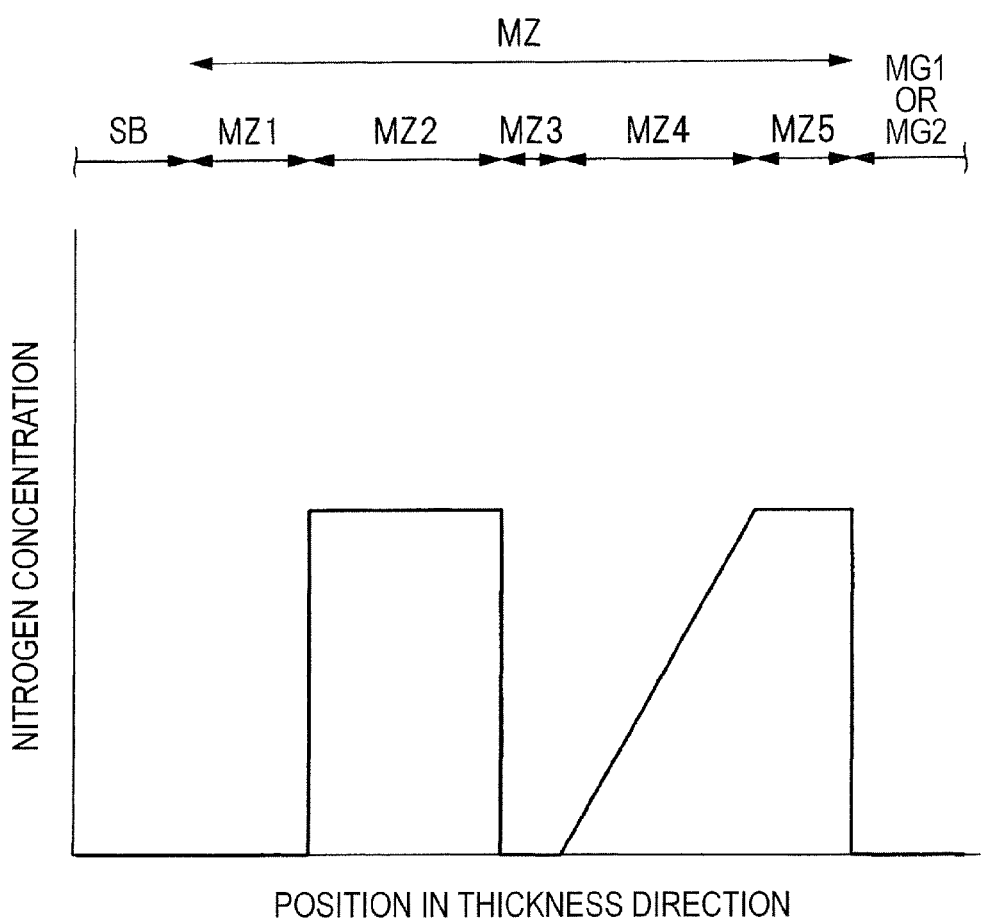
FIG. 41 is a graph showing a nitrogen concentration in an insulating film for the gate insulating film of the memory element.

FIG. 41 is a graph showing an example of a nitrogen (N) concentration distribution in each of the insulating films MZ1, MZ2, MZ3, MZ4, and MZ5 included in the insulating film MZ in Embodiment 2, which corresponds to FIG. 39 described above in Embodiment 1 described above. In the same manner as in the graph of FIG. 39 described above, the abscissa axis of the graph of FIG. 41 corresponds to a position in the thickness direction of the insulating film MZ and the ordinate axis of the graph of FIG. 41 corresponds to a nitrogen (N) concentration.

The graph of FIG. 41 corresponds to the case where the insulating film MZ1 is formed of a silicon dioxide film, the insulating film MZ2 is formed of a silicon nitride film, the insulating film MZ3 is formed of a silicon dioxide film, and the insulating film MZ5 is formed of a silicon nitride film, which is common to the graph of FIG. 39 described above in Embodiment 1 described above. Accordingly, the nitrogen concentration distribution in each of the insulating films MZ1, MZ2, MZ3, and MZ5 is the same in the graph of FIG. 39 described above in Embodiment 1 described above and in the graph of FIG. 41 in Embodiment 2. That is, in either of the graphs of FIGS. 39 and 41 described above, the nitrogen concentration distribution in the insulating film MZ1 in the thickness direction is substantially uniform, the nitrogen concentration distribution in the insulating film MZ2 in the thickness direction is substantially uniform, the nitrogen concentration distribution in the insulating film MZ3 in the thickness direction is substantially uniform, and the nitrogen concentration distribution in the insulating film MZ5 in the thickness direction is substantially uniform. The graph of FIG. 39 described above in Embodiment 1 described above and the graph of FIG. 41 are different in the nitrogen concentration distribution in the insulating film MZ4.

That is, in the graph of FIG. 39 described above in Embodiment 1 described above, the nitrogen concentration distribution in the insulating film MZ4 in the thickness direction is substantially uniform. By contrast, in the graph of FIG. 41 in Embodiment 2, the nitrogen concentration of the insulating film MZ4 continuously increases in the direction away from the insulating film MZ3 toward the insulating film MZ5. That is, in the graph of FIG. 41 in Embodiment 2, the nitrogen concentration distribution in the insulating film MZ4 in the thickness direction continuously (gradually or gently) increases in the direction away from the insulating film MZ3 toward the insulating film MZ5. In other words, in the graph of FIG. 41 in Embodiment 2, the nitrogen concentration distribution in the insulating film MZ4 in the thickness direction continuously decreases in a direction away from the insulating film MZ5 toward the insulating film MZ3.

That is, in the graph of FIG. 41 in Embodiment 2, when the nitrogen concentration of the insulating film MZ4 is viewed in the thickness direction, the nitrogen concentration of the insulating film MZ4 is the lowest in the vicinity of the interface between the insulating films MZ3 and MZ4 and continuously increases with distance from the interface between the insulating films MZ3 and MZ4 toward the interface between the insulating films MZ4 and MZ5. Then, in the vicinity of the interface between the insulating films MZ4 and MZ5, the nitrogen concentration of the insulating film MZ4 is the highest in the vicinity of the interface between the insulating films MZ4 and MZ5.

It is common to each of the graph of FIG. 39 described above in Embodiment 1 described above and the graph of FIG. 41 in Embodiment 2 that the nitrogen concentration of the insulating film MZ4 is higher than the nitrogen concentration of the insulating film MZ3 and lower than the nitrogen concentration of the insulating film MZ5. In the graph of FIG. 41 in Embodiment 2, the nitrogen concentration of the insulating film MZ4 has a value substantially equal to that of the nitrogen concentration of the insulating film MZ3 in the vicinity of the interface between the insulating films MZ3 and MZ4, but continuously increases with distance therefrom toward the insulating film MZ5. Therefore, it can be said that the nitrogen concentration of the insulating film MZ4 is higher than the nitrogen concentration of the insulating film MZ3. Also, in the graph of FIG. 41 in Embodiment 2, the nitrogen concentration of the insulating film MZ4 has a value substantially equal to that of the nitrogen concentration of the insulating film MZ5 in the vicinity of the interface between the insulating films MZ4 and MZ5, but continuously decreases with distance therefrom toward the insulating film MZ3. Therefore, it can be said that the nitrogen concentration of the insulating film MZ4 is lower than the nitrogen concentration of the insulating film MZ5. As a result, in the case where each of the insulating films MZ3, MZ4, and MZ5 is formed of a film containing at least one of oxygen (O) and nitrogen (N), and silicon (Si) as constituent elements in Embodiment 2 also, in the same manner as in Embodiment 1 described above, it can be said that the nitrogen concentration of the insulating film MZ4 is higher than the nitrogen concentration of the insulating film MZ3 and lower than the nitrogen concentration of the insulating film MZ5.

Next, a description will be given of an example of the steps of forming the insulating film MZ in Embodiment 2.

In Embodiment 2, of the steps of forming the insulating film MZ, the step of forming the insulating film MZ1, the step of forming the insulating film MZ2, the step of forming the insulating film MZ3, and the step of forming the insulating film MZ5 can be the same as those in Embodiment 1 described above, but the step of forming the insulating film MZ4 is different from that in Embodiment 1 described above. Accordingly, only the step of forming the insulating film MZ4 will be described herein.

In Embodiment 2 also, in the same manner as in Embodiment 1 described above, the insulating film MZ4 is formed over the insulating film MZ3. The insulating film MZ4 is made of a silicon oxynitride film and can be formed using an LPCVD method or the like. At that time, a film deposition temperature can be set to, e.g., about 600 to 800° C. As film deposition gases, e.g., dichlorosilane ($H_2SiCl_2$) can be used as a silicon source (silicon source gas), dinitrogen monoxide ($N_2O$) can be used as an oxygen source (oxygen source gas), and ammonia ($NH_3$) can be used as a nitrogen source (nitrogen source gas). However, at the beginning of the deposition of the insulating film MZ4, the flow rate of the ammonia ($NH_3$) gas introduced into a film deposition chamber in which the semiconductor substrate SB is placed is set to zero, while the flow rate of the dinitrogen monoxide ($N_2O$) gas introduced into the film deposition chamber is set to a predetermined value. Then, as the deposition of the insulating film MZ4 proceeds, the flow rate of the ammonia ($NH_3$) gas is gradually continuously increased, while the flow rate of the dinitrogen monoxide ($N_2O$) gas is gradually continuously reduced. At the time when the deposition of the insulating film MZ4 is ended, the flow rate of the dinitrogen monoxide (N$_2$O) gas is controlled to zero. Thus, the insulating film MZ4 is formed. Then, over the insulating film MZ4, the insulating film MZ5 is formed. A formation method for the insulating film MZ5 can be the same as in Embodiment 1 described above. In this manner, the insulating film MZ4 made of a silicon oxynitride film and having a nitrogen concentration which continuously increases in the direction away from the insulating film MZ3 toward the insulating film MZ5 can be formed.

Note that, in the case shown in Embodiment 3 described later, as the deposition of the insulating film MZ4 proceeds, the flow rate of the ammonia (NH$_3$) gas may be appropriately stepwise increased, while the flow rate of the dinitrogen monoxide (N$_2$O) gas may be appropriately stepwise reduced in conjunction therewith.

In Embodiment 2 also, substantially the same effects as obtained in Embodiment 1 described above can be obtained. In addition, the following effect can further be obtained.

That is, as can be seen from a comparison between the energy band structure shown in FIG. 32 described above in Embodiment 1 described above and the energy band structure shown in FIG. 40 in Embodiment 2, charges (which are holes herein) are more easily injected from the gate electrode (MG1 or MG2) into the insulating film MZ2 having the charge storing function in the energy band structure shown in FIG. 40 than in the energy band structure shown in FIG. 32 described above. That is, in the energy band structure shown in FIG. 32 described above, since the energy barrier (valence-band energy barrier) formed between the insulating films MZ5 and MZ4 is high, the phenomenon of tunneling of charges (which are holes herein) injected from the gate electrode (MG1 or MG2) is inhibited by the energy barrier so that the probability of tunneling is accordingly lower. By contrast, in the energy band structure shown in FIG. 40, the band gap of the insulating film MZ4 continuously increases in the direction away from the insulating film MZ5 toward the insulating film MZ3. As a result, no high energy barrier (valence-band energy barrier) is formed between the insulating films MZ5 and MZ4, and the probability of tunneling of charges (which are holes herein) injected from the gate electrode (MG1 or MG2) can accordingly be increased. Therefore, Embodiment 2 can further improve the erase property than Embodiment 1 described above and can further improve, e.g., the erase speed.

Embodiment 3

Embodiment 3 is basically the same as Embodiment 1 described above except that the insulating film MZ4 in the insulating film MZ has a different configuration. Accordingly, the configuration of each of memory elements in the present embodiment is the same as that of the memory element MC1 or MC2 in Embodiment 1 described above, except for the insulating film MZ4. Therefore, a difference from Embodiment 1 described above will be mainly described.

Figure 42:
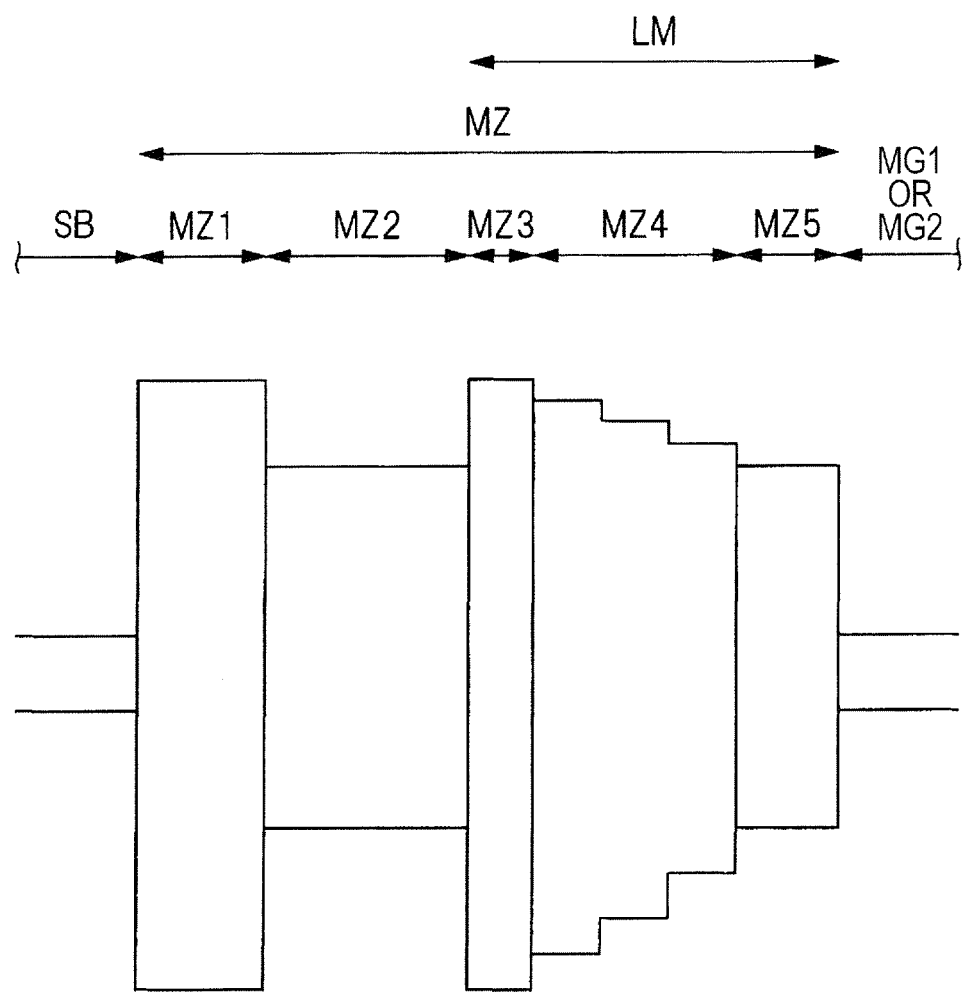
FIG. 42 is an illustrative view showing the energy band structure of the memory element in the semiconductor device in the other embodiment.

FIG. 42 is an illustrative view showing the energy band structure of each of the memory elements in Embodiment 3 and corresponds to FIG. 32 described above in Embodiment 1 described above and to FIG. 40 described above in Embodiment 2 described above. Similarly to FIGS. 32 and 40 described above, FIG. 42 shows the energy band structure at the position along the line A-A in FIG. 2 described above and the energy band structure at the position along the line B-B in FIG. 16 described above.

In Embodiment 1 described above, as shown in FIG. 32 described above, the band gap of the insulating film MZ4 is substantially constant. In Embodiment 2 described above, as shown in FIG. 40 described above, the band gap of the insulating film MZ4 continuously decreases in the direction away from the insulating film MZ3 toward the insulating film MZ5.

By contrast, in Embodiment 3, as can also be seen from FIG. 42, the band gap of the insulating film MZ4 stepwise decreases in the direction away from the insulating film MZ3 toward the insulating film MZ5. That is, when the band gap of the insulating film MZ4 is viewed in the thickness direction, the band gap of the insulating film MZ4 stepwise decreases in the direction away from the insulating film MZ3 toward the insulating film MZ5. In other words, in Embodiment 3, the band gap of the insulating film MZ4 stepwise increases in the direction away from the insulating film MZ5 toward the insulating film MZ3.

That is, in Embodiment 3, when the band gap of the insulating film MZ4 is viewed in the thickness direction, the band gap of the insulating film MZ4 is the largest in the vicinity of the interface between the insulating films MZ3 and MZ4. With distance from the interface between the insulating films MZ3 and MZ4 toward the interface between the insulating films MZ4 and MZ5, the band gap of the insulating film MZ4 stepwise decreases. In the vicinity of the interface between the insulating films MZ4 and MZ5, the band gap of the insulating film MZ4 is the smallest.

In Embodiment 3 also, the respective band gaps of the insulating films MZ1, MZ2, MZ3, and MZ5 are the same as in Embodiments 1 and 2 described above so that a description thereof is omitted herein.

The band gap of the insulating film MZ4 is smaller than the band gap of the insulating film MZ3 and larger than the band gap the insulating film MZ5, which is also common to each of Embodiment 3 and Embodiments 1 and 2 described above. In FIG. 42, the band gap of the insulating film MZ4 stepwise decreases in the direction away from the insulating film MZ3 toward the insulating film MZ5. However, the number of steps forming the stepwise configuration is not limited to that in the case shown in FIG. 42 and can variously be changed.

Such a band gap of the insulating film MZ4 can be achieved by controlling a nitrogen (N) concentration distribution in the insulating film MZ4.

Figure 43:
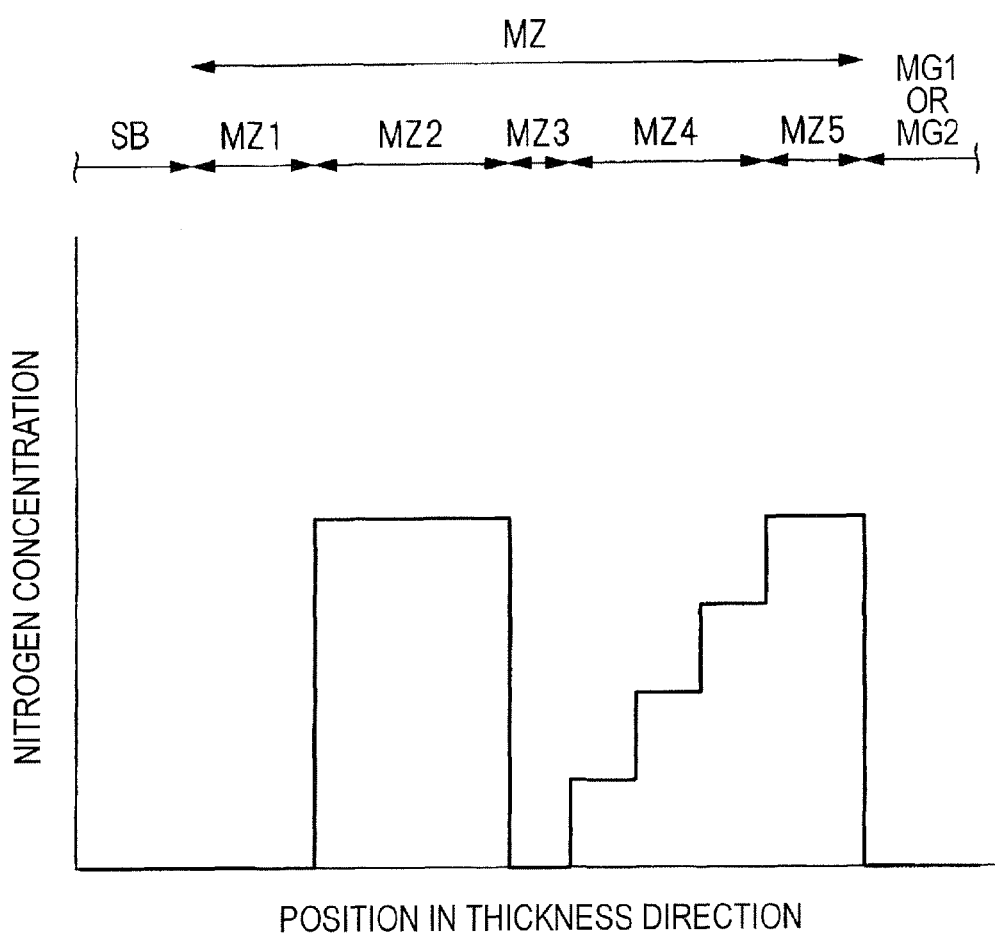
FIG. 43 is a graph showing a nitrogen concentration of the insulating film for the gate insulating film of the memory element.

FIG. 43 is a graph showing an example of a nitrogen (N) concentration distribution in each of the insulating films MZ1, MZ2, MZ3, MZ4, and MZ5 included in the insulating film MZ in Embodiment 3, which corresponds to FIG. 39 described above in Embodiment 1 described above and to FIG. 41 described above in Embodiment 2 described above. In the same manner as in each of the graphs shown in FIGS. 39 and 41 described above, the abscissa axis of the graph of FIG. 43 corresponds to a position in the thickness direction of the insulating film MZ and the ordinate axis of the graph of FIG. 43 corresponds to a nitrogen (N) concentration.

The graph of FIG. 43 corresponds to the case where the insulating film MZ1 is formed of a silicon dioxide film, the insulating film MZ2 is formed of a silicon nitride film, the insulating film MZ3 is formed of a silicon dioxide film, and the insulating film MZ5 is formed of a silicon nitride film, which is common to each of the graph of FIG. 39 described above in Embodiment 1 described above and the graph of FIG. 41 described above in Embodiment 2 described above. Accordingly, the nitrogen concentration distribution in each of the insulating films MZ1, MZ2, MZ3, and MZ5 is the same in the graph of FIG. 39 described above in Embodiment 1 described above, in the graph of FIG. 41 described above in Embodiment 2 described above, and in the graph of FIG. 43 in Embodiment 3. The graph of FIG. 43 in Embodiment 3 is different from the graph of FIG. 39 described above in Embodiment 1 described above and the graph of FIG. 41 described above in Embodiment 2 described above in the nitrogen concentration distribution in the insulating film MZ4.

In the graph of FIG. 43 in Embodiment 3, the nitrogen concentration of the insulating film MZ4 stepwise increases in the direction away from the insulating film MZ3 toward the insulating film MZ5. That is, in the graph of FIG. 43 in Embodiment 3, the nitrogen concentration distribution in the insulating film MZ4 in the thickness direction stepwise increases in a direction away from the insulating film MZ3 toward the insulating film MZ5. In other words, in the graph of FIG. 43 in Embodiment 3, the nitrogen concentration distribution in the insulating film MZ4 in the thickness direction stepwise decreases in the direction away from the insulating film MZ5 toward the insulating film MZ3.

It is common to each of the graph of FIG. 39 described above in Embodiment 1 described above, the graph of FIG. 41 described above in Embodiment 2 described above, and the graph of FIG. 43 in Embodiment 3 that the nitrogen concentration of the insulating film MZ4 is higher than the nitrogen concentration of the insulating film MZ3 and lower than the nitrogen concentration of the insulating film MZ5. Therefore, in the case where each of the insulating films MZ3, MZ4, and MZ5 is formed of a film containing at least one of oxygen (O) and nitrogen (N), and silicon (Si) as constituent elements in Embodiment 3 also, in the same manner as in Embodiments 1 and 2 described above, it can be said that the nitrogen concentration of the insulating film MZ4 is higher than the nitrogen concentration of the insulating film MZ3 and lower than the nitrogen concentration of the insulating film MZ5.

In Embodiment 3 also, substantially the same effects as obtained in Embodiment 1 described above can be obtained. In addition, the following effect can further be obtained.

That is, in the energy band structure shown in FIG. 42 in Embodiment 3, the band gap in the insulating film MZ4 stepwise increases in the direction away from the insulating film MZ5 toward the insulating film MZ3. As a result, no high energy barrier (valence-band energy barrier) is formed between the insulating films MZ5 and MZ4. Accordingly, charges (which are holes herein) are more easily injected from the gate electrode (MG1 or MG2) into the insulating film MZ2 having the charge storing function during the erase operation, and the probability of tunneling of charges (which are holes herein) injected from the gate electrode (MG1 or MG2) can accordingly be increased. Therefore, Embodiment 3 can further improve the erase property than Embodiment 1 described above and can further improve, e.g., the erase speed.

It is also possible to combine Embodiment 3 and Embodiment described above. In this case, there are simultaneously a region where the band gap of the insulating film MZ4 continuously decreases in the direction from the insulating film MZ3 toward the insulating film MZ5 and a region where the band gap of the insulating film MZ4 stepwise decreases in the direction away from the insulating film MZ3 toward the insulating film MZ5.

Embodiment 4

Embodiment 4 is basically the same as Embodiment 1 described above except that the insulating film MZ has a different configuration. Accordingly, the configuration of each of memory elements in Embodiment 4 is the same as that of the memory element MC1 or MC2 in Embodiment 1 described above, except for the insulating film MZ. Therefore, a difference from Embodiment 1 described above will be mainly described. Note that, as the drawings, FIGS. 2, 6, 16, 32, and the like may also be referred to appropriately in Embodiment 4.

In Embodiment 4, each of the insulating films MZ1, MZ2, MZ3, MZ4, and MZ5 in the insulating film MZ is formed of a high-dielectric-constant insulating film. Note that, in the present application, when a high-dielectric-constant insulating film, a high-dielectric-constant film, a High-k film, or a high-dielectric-constant gate insulating film is mentioned, it means a film having a dielectric constant (specific permittivity) higher than that of a silicon nitride film.

Embodiment 4 is also common to Embodiment 1 described above in that the insulating film MZ is made the laminated film including the insulating film MZ1, the insulating film MZ2 formed over the insulating film MZ1, the insulating film MZ3 formed over the insulating film MZ2, the insulating film MZ4 formed over the insulating film MZ3, and the insulating film MZ5 formed over the insulating film MZ4. In addition, Embodiment 4 is also common to Embodiment 1 described above in that the insulating film MZ2 has the charge storing function and in terms of the band gap relationships between the insulating films MZ1, MZ2, MZ3, MZ4, and MZ5. That is, in Embodiment 4 also, the band gap of each of the insulating films MZ1 and MZ3 is larger than the band gap of the insulating film MZ2, the band gap of the insulating film MZ4 is smaller than the band gap of the insulating film MZ3, and the band gap of the insulating film MZ5 is smaller than the band gap of the insulating film MZ4. In Embodiment 4 also, the band gap of the insulating film MZ4 may continuously decrease in the direction away from the insulating film MZ3 toward the insulating film MZ5 in the same manner as in Embodiment 2 described above or may stepwise decrease in the direction away from the insulating film MZ3 toward the insulating film MZ5 in the same manner as in Embodiment 3 described above.

However, in Embodiment 4, each of the insulating films MZ1, MZ2, MZ3, MZ4, and MZ5 included in the insulating film MZ is formed of a high-dielectric-constant film. Thus, the material forming each of the insulating films MZ1, MZ2, MZ3, MZ4, and MZ5 is different from that in Embodiment 1 described above.

Specifically, in Embodiment 4, the insulating film MZ1 is made of an aluminum oxide film (typically $Al_2O_3$ film), the insulating film MZ2 is made of a hafnium oxide film (typically $HfO_2$ film), the insulating film MZ3 is made of an aluminum oxide film (typically $Al_2O_3$ film), and the insulating film MZ4 is made of a hafnium aluminate film (typically HfAlO film). On the other hand, the insulating film MZ5 is made of a hafnium oxide film (typically $HfO_2$ film). An aluminum oxide film, a hafnium oxide film, an aluminum oxide film, and a hafnium aluminum oxide film each having a dielectric constant higher than that of a silicon nitride can be regarded as high-dielectric-constant insulating films. Note that a hafnium aluminate film (HfAlO film) contains hafnium (Hf), aluminum (Al), and oxygen (O) as constituent elements. A hafnium aluminate film is referred to also as a hafnium aluminum oxide film.

The band gap of an aluminum oxide film is larger than the band gap of a hafnium oxide film. The band gap of a hafnium aluminate film is smaller than the band gap of the aluminum oxide film and larger than the band gap of the hafnium oxide film. Accordingly, by using the materials mentioned above for the insulating films MZ1, MZ2, MZ3, MZ4, and MZ5, it is possible to set the band gap of each of the insulating films MZ1 and MZ3 larger than the band gap of the insulating film MZ2, set the band gap of the insulating film MZ4 smaller than the band gap of the insulating film MZ3, and set the band gap of the insulating film MZ5 smaller than the band gap of the insulating film MZ4.

In Embodiment 4 also, substantially the same effects as obtained in Embodiment 1 described above can be obtained. In addition, the following effect can also be obtained.

That is, in Embodiment 4, by using a high-dielectric-constant insulating film as each of the insulating films MZ1, MZ2, MZ3, MZ4, and MZ5 included in the gate insulating film, the EOT (Equivalent Oxide Thickness) of the gate insulating film can be reduced to be smaller than in the case where no high-dielectric-constant insulating film is used. This accordingly allows a reduction in operating voltage (write voltage or erase voltage) and the like. This also allows an improvement in the operating speed of each of the memory elements and a reduction in power consumption. In addition, since the time required to write data or erase data can be reduced even with a low drive voltage, a data processing speed can be increased. Therefore, it is possible to further improve the performance of the semiconductor device having the memory elements.

Also in Embodiment 4, by using the high-dielectric-constant insulating films as the insulating films MZ1, MZ2, MZ3, MZ4, and MZ5 included in the gate insulating film, the respective physical thicknesses of the insulating films MZ1, MZ2, MZ3, MZ4, and MZ5 can also be increased (enlarged) to be larger than in the case where no high-dielectric-constant insulating film is used, while the EOT of the gate insulating film is reduced. As a result, the degradation of the charge retaining property (retention property) due to, e.g., leakage is more easily prevented. Therefore, it is possible to further improve the performance of the semiconductor device having the memory elements.

In Embodiment 4, the description has been given of the case where the high-dielectric-constant insulating film is used as each of the insulating films M1, MZ2, MZ3, MZ4, and MZ5 included in the insulating film MZ. However, in another embodiment, as the insulating films MZ1, MZ2, MZ3, MZ4, and MZ5 included in the insulating film MZ, high-dielectric-constant insulating films and insulating films other than a high-dielectric-constant insulating film can also be used simultaneously. For example, in Embodiment 4, it is also possible to use high-dielectric-constant insulating films as described above as the insulating films MZ2, MZ4, and MZ5 and use silicon dioxide films as the insulating films MZ1 and MZ3. Alternatively, in Embodiment 4, it is also possible to, e.g., use high-dielectric-constant insulating films as described above as the insulating films MZ1, MZ3, and MZ4 and use silicon nitride films as the insulating films MZ2 and MZ5. Otherwise, in Embodiment 4, it is also possible to, e.g., use high-dielectric-constant insulating film as described above as the insulating films MZ1, MZ2, MZ3, and MZ5 and use a silicon oxynitride film as the insulating film MZ4.

Therefore, when Embodiment 4 is viewed in a comprehensive perspective, at least one of the insulating films MZ1, MZ2, MZ3, MZ4, and MZ5 included in the insulating film MZ is made of a high-dielectric-constant insulating film. The use of the high-dielectric-constant insulating film can accordingly reduce the EOT of the gate insulating film to allow a reduction in the operating voltage of each of the memory elements or the like. This also allows an improvement in the operating speed of each of the memory elements and a reduction in power consumption. In addition, since the time required to write data or erase data can be reduced even with a low drive voltage, a data processing speed can be increased. Therefore, it is possible to further improve the performance of the semiconductor device having the memory elements.

Next, a description will be given of an example of the steps of forming the insulating film MZ in Embodiment 4.

An aluminum oxide film (in the step of forming the insulating film MZ1 and the step of forming the insulating film MZ3 herein) can be formed using an ALD (Atomic Layer Deposition) method using, e.g., TMA (Trimethyl Aluminum) and $O_3$ (ozone) or $H_2O$ (water vapor) as material gases or the like. At that time, a film deposition temperature can be set to, e.g., about 200 to 400° C. In this case, TMA is an aluminum source (aluminum source gas) and $O_3$ or $H_2O$ is an oxygen source (oxygen source gas). A hafnium oxide film (which is each of the insulating films MZ2 and MZ5 herein) can be formed using an ALD method using, e.g., $HfCl_4$ and $O_3$ or $H_2O$ as material gases or the like. At that time, a film deposition temperature can be set to, e.g., about 200 to 400° C. In this case, $HfCl_4$ is a hafnium source (hafnium source gas) and $O_3$ or $H_2O$ is an oxygen source (oxygen source gas). Alternatively, a hafnium oxide film (which is each of the insulating films MZ2 and MZ5 herein) can also be formed using a MOCVD (Metal Organic Chemical Vapor Deposition) method using TDMAH (Tetrakis Dimethyl Amino Hafnium) and $O_3$ or $O_2$ as material gases or the like. At that time, a film deposition temperature can be set to, e.g., about 300 to 500° C. In this case, TDMAH is a hafnium source (hafnium source gas) and $O_3$ or $O_2$ is an oxygen source (oxygen source gas). A hafnium aluminate film (which is the insulating film MZ4 herein) can be formed using an ALD method, a MOCVD method, or the like using a hafnium source gas, an aluminum source gas, and an oxygen source gas each as described above at a gas flow rate ratio which allows a hafnium aluminate film at an intended composition ratio to be obtained.

Embodiment 5 can also be applied to Embodiment 2 described above. In this case, in the insulating film MZ using the high-dielectric-constant insulating films in Embodiment 4, the band gap of the insulating film MZ4 continuously decreases in the direction away from the insulating film MZ3 toward the insulating film MZ5. To achieve this, the insulating film MZ4 is formed of, e.g., a hafnium aluminate film (HfAlOfilm) and an x/(x+y) value when the composition of the hafnium aluminate film (HfAlO film) forming the insulating film MZ4 is represented as $Hf_xAl_yO_z$ is continuously increased in the direction away from the insulating film MZ3 toward the insulating film MZ5. This is because, as the composition ratio of Al is reduced in the hafnium aluminate film (HfAlO film) to increase the composition ratio of Hf therein, i.e., as the x/(x+y) value when the composition is represented as $Hf_xAl_yO_z$ increases, the band gap decreases.

Alternatively, Embodiment 4 can also be applied to Embodiment 3 described above. In this case, in the insulating film MZ in Embodiment 4 using the high-dielectric-constant insulating films, the band gap of the insulating film MZ4 stepwise decreases in the direction away from the insulating film MZ3 toward the insulating film MZ5. To achieve this, the insulating film MZ4 is formed of, e.g., a hafnium aluminate film (HfAlO film) and an x/(x+y) value when the composition of the hafnium aluminate film (HfAlO film) forming the insulating film MZ4 is represented as $Hf_xAl_yO_z$ is stepwise increased in the direction away from the insulating film MZ3 toward the insulating film MZ5. This is because, as the composition ratio of Al is reduced in the hafnium aluminate film (HfAlO film) to increase the composition ratio of Hf therein, i.e., as the x/(x+y) value when the composition is represented as $Hf_xAl_yO_z$ is increased, the band gap decreases.

When Embodiment 4 is applied to Embodiment 2 or 3 described above, the insulating film MZ4 made of, e.g., a hafnium aluminate film (HfAlO film) can be formed as follows.

A hafnium aluminate film (HfAlO film) serving as the insulating film MZ4 is deposited using an ALD method using TMA as an aluminum source (aluminum source gas), using TDMAH as a hafnium source (hafnium source gas), and using $O_3$ as an oxygen source (oxygen source gas). In this case, since the ALD method is used, at the beginning of the deposition of the hafnium aluminate film, the step of introducing the TMA gas into a film deposition chamber and the step of introducing the $O_3$ gas into the film deposition chamber are alternately performed. However, between the individual steps, the step of purging the interior of the film deposition chamber with a rare gas (inert gas) is performed. Then, in addition to the step of introducing the TMA gas into the film deposition chamber and the step of introducing the $O_3$ gas into the film deposition chamber, the step of introducing the TDMAH gas into the film deposition chamber is also performed. As the deposition of the insulating film MZ4 proceeds, the percentage (ratio) of the step of introducing the TDMAH gas into the film deposition chamber is increased. Thus, the insulating film MZ4 made of the hafnium aluminate film (HfAlO film) is deposited. In the deposited hafnium aluminate film (HfAlO film), the x/(x+y) value when the composition is represented as $Hf_xAl_yO_z$ gradually increases in an upward direction from the insulating film MZ3 (i.e., toward the insulating film MZ5). Depending on a manner of varying the ratio between the step of introducing the TMA gas into the film deposition chamber and the step of introducing the TDMAG gas into the film deposition chamber, the x/(x+y) value when the composition is represented as $Hf_xAl_yO_z$ continuously or stepwise increases in the direction away from the insulating film MZ3 toward the insulating film MZ5.

In Embodiments 1 to 4 described above, the laminated film LM interposed between the insulating film MZ2 having the charge storing function and the gate electrode (MG1 or MG2) is formed of the insulating films MZ3, MZ4, and MZ5 in three layers. However, in another form, the laminated film LM interposed between the insulating film MZ2 having the charge storing function and the gate electrode (MG1 or MG2) can also be formed of insulating films in four or more layers. When the laminated film LM is formed of insulating films in four or more layers, the band gap of each of the insulating films included in the laminated film LM is larger as the insulating film is closer to the insulating film MZ2 and smaller as the insulating film is closer to the gate electrode (MG1 or MG2). When the laminated film LM is formed of, e.g., a first-layer insulating film, a second-layer insulating film, a third-layer insulating film, and a fourth-layer insulating film in the total of four layers which are successively laminated in order of increasing distance from the insulating film MZ2, the band gaps of the first-, second-, third-, and fourth-layer insulating films are progressively smaller in this order. However, the band gap of the first-layer insulating film included in the laminated film LM is larger than the band gap of the insulating film MZ2 having the charge storing function. Alternatively, when the laminated film LM is formed of, e.g., a first-layer insulating film, a second-layer insulating film, a third-layer insulating film, a fourth-layer insulating film, and a fifth-layer insulating film in the total of five layers which are successively laminated in order of increasing distance from the insulating film MZ2, the band gaps of the first-, second-, third-, fourth-, and fifth layer insulating films are progressively smaller in this order. However, the band gap of the first-layer insulating film included in the laminated film LM is larger than the band gap of the insulating film MZ2 having the charge storing function.

The case where the laminated film LM interposed between the insulating film MZ2 having the charge storing function and the gate electrode (MG1 or MG2) is formed of insulating films in four or more layers corresponds to the case where the insulating film MZ4 is formed of insulating films in two or more layers. Consequently, in another form, it is also possible to form the insulating film MZ4 of a laminated film including insulating films in two or more layers. When the insulating film MZ4 is formed of a laminated film including insulating films in two or more layers, the band gap of each of the insulating films included in the insulating film MZ4 is larger as the insulating film is closer to the insulating film MZ3 and smaller as the insulating film is closer to the insulating film MZ5. For example, the case is assumed where the insulating film MZ4 is formed of a first-layer insulating film and a second-layer insulating film in the total of two layers which are successively laminated in order of increasing distance from the insulating film MZ3. In this case, the band gap of the first-layer insulating film included in the insulating film MZ4 is smaller than the band gap of the insulating film MZ3 and larger than the band gap of the second-layer insulating film included in the insulating film MZ4. The band gap of the second-layer insulating film included in the insulating film MZ4 is smaller than the band gap of the first-layer insulating film included in the insulating film MZ4 and larger than the band gap of the insulating film MZ5. Alternatively, the case is also assumed where the insulating film MZ4 is formed of, e.g., a first-layer insulating film, a second-layer insulating film, and a third-layer insulating film in the total of three layers which are successively laminated in order of increasing distance from the insulating film MZ3. In this case, the band gap of the first-layer insulating film included in the insulating film MZ4 is smaller than the band gap of the insulating film MZ3 and larger than the band gap of the second-layer insulating film included in the insulating film MZ4. The band gap of the second-layer insulating film included in the insulating film MZ4 is smaller than the band gap of the first-layer insulating film included in the insulating film MZ4 and larger than the band gap of the third-layer insulating film included in the insulating film MZ4. The band gap of the third-layer insulating film included in the insulating film MZ4 is smaller than the band gap of the second-layer insulating film included in the insulating film MZ4 and larger than the band gap of the insulating film MZ5.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A semiconductor device, comprising:
   a semiconductor substrate;
   a gate insulating film for a memory element which is formed over the semiconductor substrate; and a gate electrode for the memory element which is formed over the gate insulating film, wherein the gate insulating film includes a first insulating film, a second insulating film over the first insulating film, and a laminate including a third insulating film on the second insulating film, a fourth insulating film on the third insulating film, and a fifth insulating film on the fourth insulating film, wherein the gate insulating film has only one charge storage portion, the one charge storage portion comprising the second storage film, wherein the laminate is in contact with the second insulating film and the gate electrode, and wherein a band gap of each of the first and third insulating films is larger than a band gap of the second insulating film, a band gap of the fourth insulating film is smaller than the band gap of the third insulating film, and a band gap of the fifth insulating film is smaller than the band gap of the fourth insulating film.

2. The semiconductor device according to claim 1, wherein the first insulating film is made of a silicon dioxide film or a silicon oxynitride film, wherein the second insulating film is made of a silicon nitride film, wherein each of the third, fourth, and fifth insulating films is made of a film containing at least one of oxygen and nitrogen, and silicon as constituent elements, wherein a nitrogen concentration of the fourth insulating film is higher than a nitrogen concentration of the third insulating film, and wherein a nitrogen concentration of the fifth insulating film is higher than the nitrogen concentration of the fourth insulating film.

3. The semiconductor device according to claim 2, wherein the third insulating film is made of a silicon dioxide film, wherein the fourth insulating film is made of a silicon oxynitride film, and wherein the fifth insulating film is made of a silicon nitride film.

4. The semiconductor device according to claim 1, wherein the band gap of the fifth insulating film is the same as or smaller than the band gap of the second insulating film.

5. The semiconductor device according to claim 1, wherein the band gap of the fourth insulating film continuously decreases in a direction away from the third insulating film toward the fifth insulating film.

6. The semiconductor device according to claim 2, wherein the nitrogen concentration of the fourth insulating film continuously increases in a direction away from the third insulating film toward the fifth insulating film.

7. The semiconductor device according to claim 1, wherein the band gap of the fourth insulating film stepwise decreases in a direction away from the third insulating film toward the fifth insulating film.

8. The semiconductor device according to claim 2, wherein the nitrogen concentration of the fourth insulating film stepwise increases in a direction away from the third insulating film toward the fifth insulating film.

9. The semiconductor device according to claim 1, wherein at least one of the first, second, third, fourth, and fifth insulating films has a higher dielectric constant than that of silicon nitride.

10. The semiconductor device according to claim 1, further comprising:

semiconductor regions each for a source or drain of the memory element which are formed in the semiconductor substrate.

11. The semiconductor device according to claim 1, wherein charges are injected from the gate electrode into the second insulating film of the gate insulating film to perform an erase operation to the memory element.

12. The semiconductor device according to claim 1, wherein a total sum of a thickness of the third insulating film, a thickness of the fourth insulating film, and a thickness of the fifth insulating film is larger than a thickness of the first insulating film.

13. The semiconductor device according to claim 1, wherein a thickness of the third insulating film is smaller than a thickness of the fourth insulating film and smaller than a thickness of the fifth insulating film.

14. The semiconductor device according to claim 13, wherein the thickness of the fourth insulating film is larger than the thickness of the third insulating film and larger than the thickness of the fifth insulating film.

15. A semiconductor device, comprising:

a semiconductor substrate;

a gate insulating film for a memory element which is formed over the semiconductor substrate; and a gate electrode for the memory element which is formed over the gate insulating film, wherein the gate insulating film includes a first insulating film, a second insulating film over the first insulating film, a third insulating film over the second insulating film, a fourth insulating film over the third insulating film, and a fifth insulating film over the fourth insulating film, wherein the second insulating film has a charge storing function, wherein the first insulating film is made of a silicon dioxide film or a silicon oxynitride film, wherein the second insulating film is made of a silicon nitride film, wherein each of the third, fourth, and fifth insulating films is made of a film containing at least one of oxygen and nitrogen, and silicon as constituent elements, wherein a nitrogen concentration of the fourth insulating film is higher than a nitrogen concentration of the third insulating film, and wherein a nitrogen concentration of the fifth insulating film is higher than the nitrogen concentration of the fourth insulating film.

16. The semiconductor device according to claim 15, wherein the third insulating film is made of a silicon dioxide film, wherein the fourth insulating film is made of a silicon oxynitride film, and wherein the fifth insulating film is made of a silicon nitride film.

17. The semiconductor device according to claim 15, wherein the nitrogen concentration of the fourth insulating film continuously increases in a direction away from the third insulating film toward the fifth insulating film.

18. The semiconductor device according to claim 15, wherein the nitrogen concentration of the fourth insulating film stepwise increases in a direction away from the third insulating film toward the fifth insulating film.

19. A semiconductor device, comprising:

a semiconductor substrate;

a gate insulating film for a memory element which is formed over the semiconductor substrate; and a gate electrode for the memory element which is formed over the gate insulating film, wherein the gate insulating film includes a first insulating film, a second insulating film over the first insulating film, a third insulating film over the second insulating film, a fourth insulating film over the third insulating film, and a fifth insulating film over the fourth insulating film, wherein the second insulating film has a charge storing function, wherein a band gap of each of the first and third insulating films is larger than a band gap of the second insulating film, a band gap of the fourth insulating film is smaller than the band gap of the third insulating film, and a band gap of the fifth insulating film is smaller than the band gap of the fourth insulating film, wherein the first insulating film is made of a silicon dioxide film or a silicon oxynitride film, wherein the second insulating film is made of a silicon nitride film, wherein each of the third, fourth, and fifth insulating films is made of a film containing at least one of oxygen and nitrogen, and silicon as constituent elements, wherein a nitrogen concentration of the fourth insulating film is higher than a nitrogen concentration of the third insulating film, and wherein a nitrogen concentration of the fifth insulating film is higher than the nitrogen concentration of the fourth insulating film.

20. The semiconductor device according to claim 19, wherein the third insulating film is made of a silicon dioxide film, wherein the fourth insulating film is made of a silicon oxynitride film, and wherein the fifth insulating film is made of a silicon nitride film.

21. The semiconductor device according to claim 19, wherein the nitrogen concentration of the fourth insulating film continuously increases in a direction away from the third insulating film toward the fifth insulating film.

22. The semiconductor device according to claim 19, wherein the nitrogen concentration of the fourth insulating film stepwise increases in a direction away from the third insulating film toward the fifth insulating film.

* * * * *